(12) United States Patent
Sano et al.

(10) Patent No.: US 12,408,335 B2
(45) Date of Patent: Sep. 2, 2025

(54) THREE-DIMENSIONAL MEMORY DEVICE CONTAINING WORD LINE CONTACTS WHICH EXTEND THROUGH DRAIN-SELECT-LEVEL ISOLATION STRUCTURES AND METHODS OF MAKING THE SAME

(71) Applicant: SANDISK TECHNOLOGIES LLC, Addison, TX (US)

(72) Inventors: Michiaki Sano, Yokkaichi (JP); Koichi Ito, Yokkaichi (JP); Takuya Mori, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 545 days.

(21) Appl. No.: 17/663,951

(22) Filed: May 18, 2022

(65) Prior Publication Data

US 2023/0380151 A1   Nov. 23, 2023

(51) Int. Cl.
*H10B 41/27* (2023.01)
*H01L 23/522* (2006.01)
(Continued)

(52) U.S. Cl.
CPC ......... *H10B 41/27* (2023.02); *H01L 23/5226* (2013.01); *H01L 23/5283* (2013.01);
(Continued)

(58) Field of Classification Search
CPC ........ H10B 41/27; H10B 41/10; H10B 41/35; H10B 43/10; H10B 43/27; H10B 43/35;
(Continued)

(56) References Cited

U.S. PATENT DOCUMENTS 9,601,502 B2   3/2017  Sano et al.
9,960,181 B1   5/2018  Cui et al.
(Continued)

OTHER PUBLICATIONS

U.S. Appl. No. 17/081,458, filed Oct. 27, 2020, SanDisk Technologies LLC.
(Continued)

*Primary Examiner* — Fernando L Toledo
*Assistant Examiner* — Ashley Nicole Blackwell
(74) *Attorney, Agent, or Firm* — THE MARBURY LAW GROUP PLLC

(57) ABSTRACT

A three-dimensional memory device includes an alternating stack of insulating layers and electrically conductive layers, where the electrically conductive layers include word lines and drain select gate electrodes that contain plurality of drain-select-level electrically conductive strips which are located above the word lines, memory stack structures vertically extending through the alternating stack, drain-select-level isolation structures located between a respective neighboring pair of drain-select-level electrically conductive strips, and a first laterally-insulated contact via assembly including a first layer contact via structure and a first tubular insulating spacer. The first laterally-insulated contact via assembly contacts a top surface of a first word line of the word lines, and the first laterally-insulated contact via assembly laterally contacts a first drain-select-level isolation structure of the drain-select-level isolation structures.

10 Claims, 58 Drawing Sheets

(51) Int. Cl.
  *H01L 23/528*   (2006.01)
  *H10B 41/10*    (2023.01)
  *H10B 41/35*    (2023.01)
  *H10B 43/10*    (2023.01)
  *H10B 43/27*    (2023.01)
  *H10B 43/35*    (2023.01)

(52) U.S. Cl.
  CPC ............ *H10B 41/10* (2023.02); *H10B 41/35* (2023.02); *H10B 43/10* (2023.02); *H10B 43/27* (2023.02); *H10B 43/35* (2023.02)

(58) Field of Classification Search
  CPC .. H10B 43/50; H01L 23/5226; H01L 23/5283
  See application file for complete search history.

(56) References Cited

U.S. PATENT DOCUMENTS

| | | | |
|---|---|---|---|
| 11,282,783 | B2 | 3/2022 | Otsu et al. |
| 2017/0179154 | A1* | 6/2017 | Furihata ................ H10B 43/10 |
| 2019/0341251 | A1 | 11/2019 | Lee |
| 2021/0091092 | A1 | 3/2021 | Noda |
| 2021/0111181 | A1 | 4/2021 | Lee |
| 2021/0210424 | A1 | 7/2021 | Otsu et al. |
| 2021/0210428 | A1 | 7/2021 | Ohsawa et al. |
| 2021/0210503 | A1 | 7/2021 | Matsuno et al. |
| 2021/0210504 | A1 | 7/2021 | Otsu et al. |
| 2021/0233925 | A1 | 7/2021 | Kashima et al. |
| 2022/0005818 | A1 | 1/2022 | Tanaka et al. |
| 2022/0005824 | A1 | 1/2022 | Tanaka et al. |
| 2022/0130954 | A1 | 4/2022 | Luo et al. |

OTHER PUBLICATIONS

U.S. Appl. No. 17/516,588, filed Nov. 1, 2021, SanDisk Technologies LLC.

U.S. Appl. No. 17/684,922, filed Mar. 2, 2022, SanDisk Technologies LLC.

ISR—Notification of Transmittal of the International Search Report and Written Opinion of the International Searching Authority for International Patent Application No. PCT/US2023/020556, mailed Aug. 28, 2023, 7 pages.

* cited by examiner

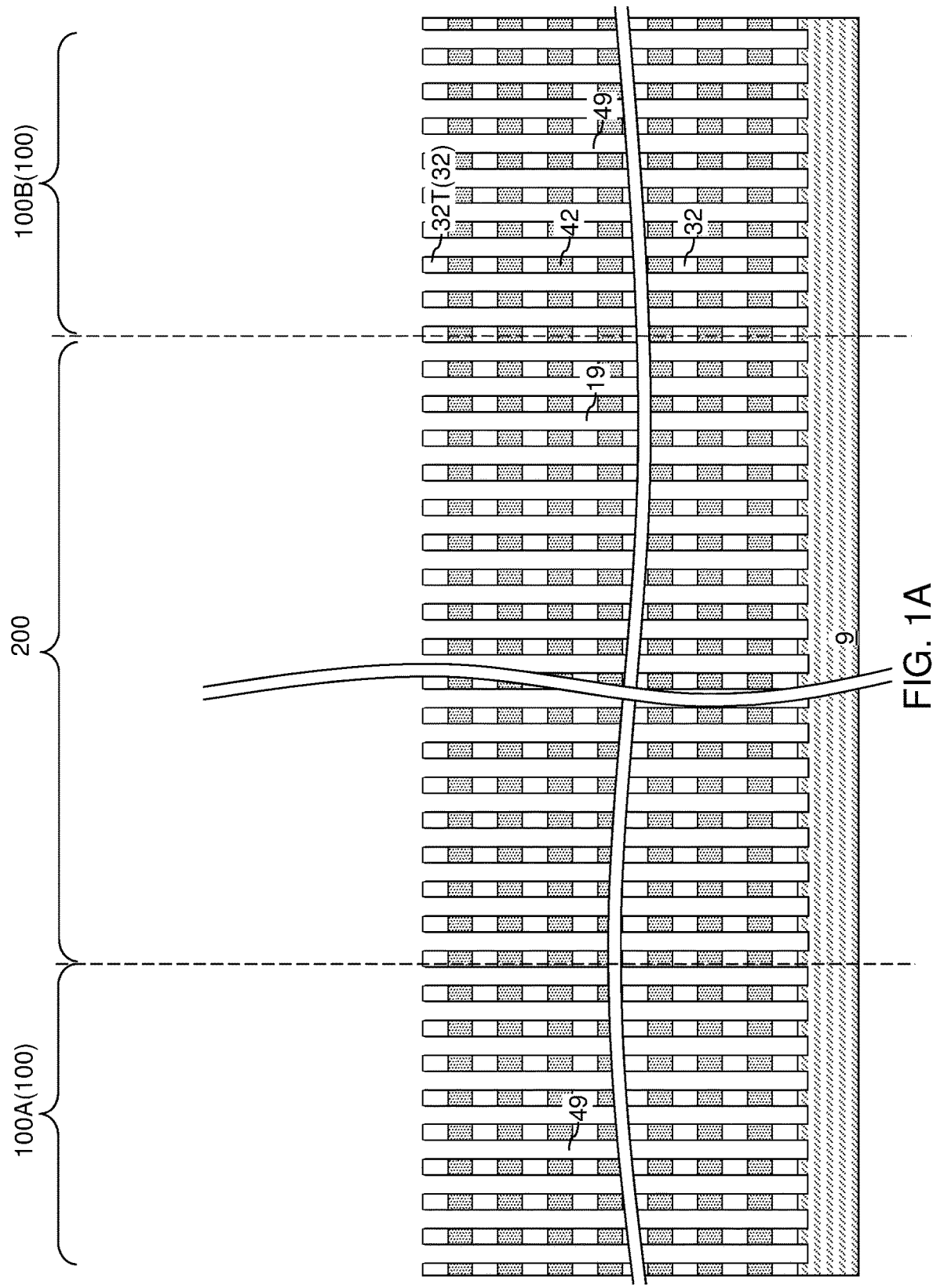

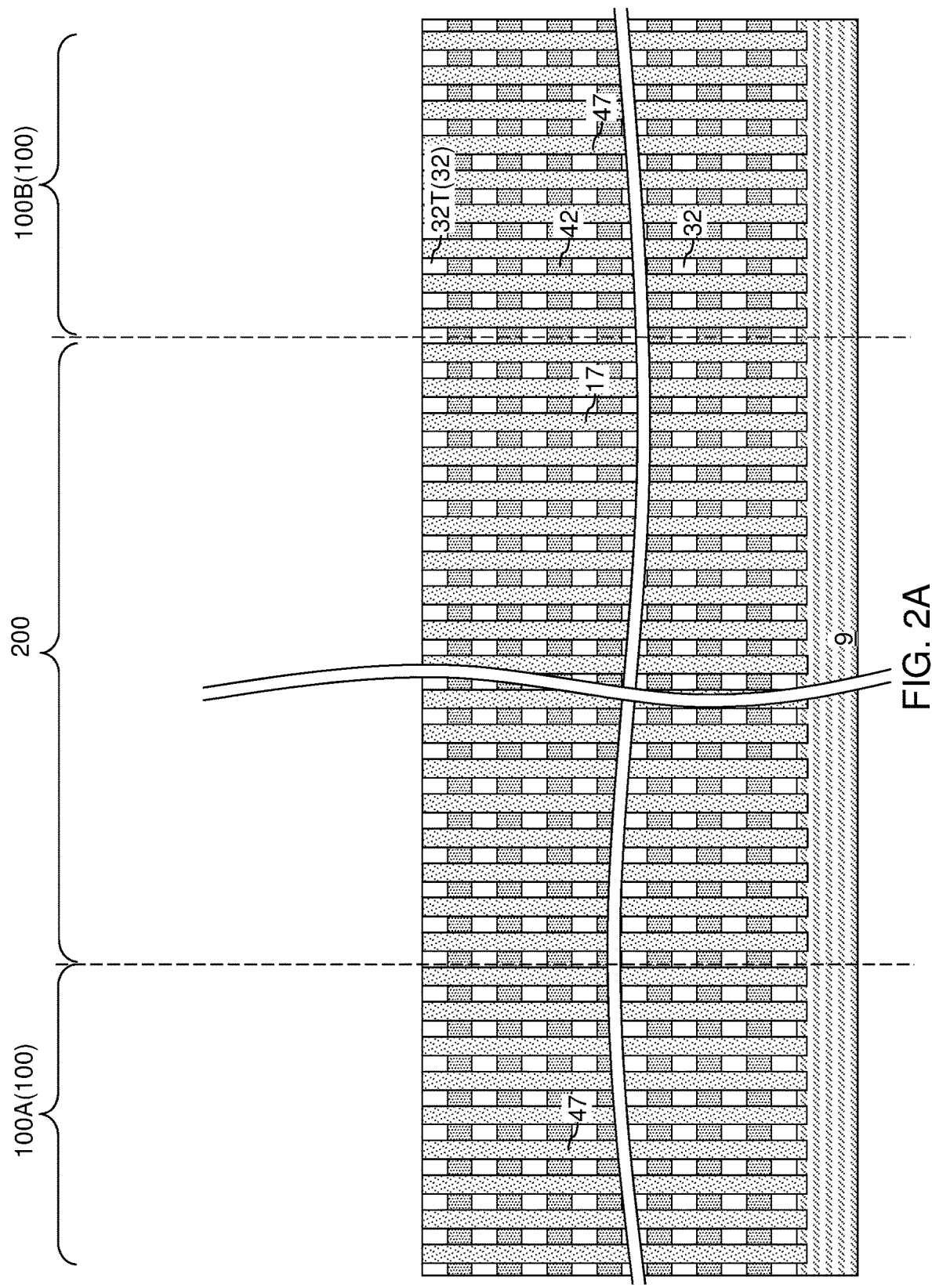

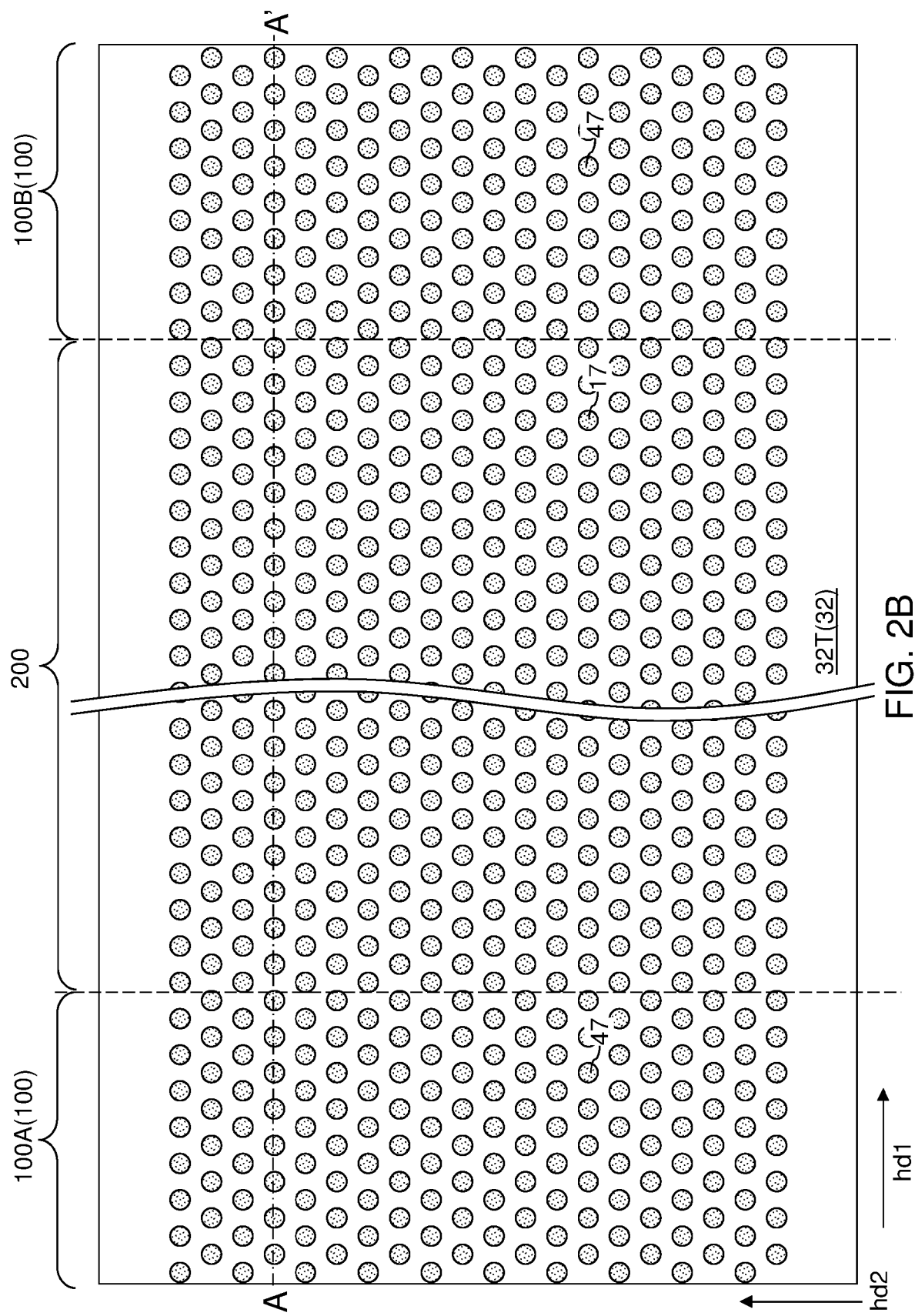

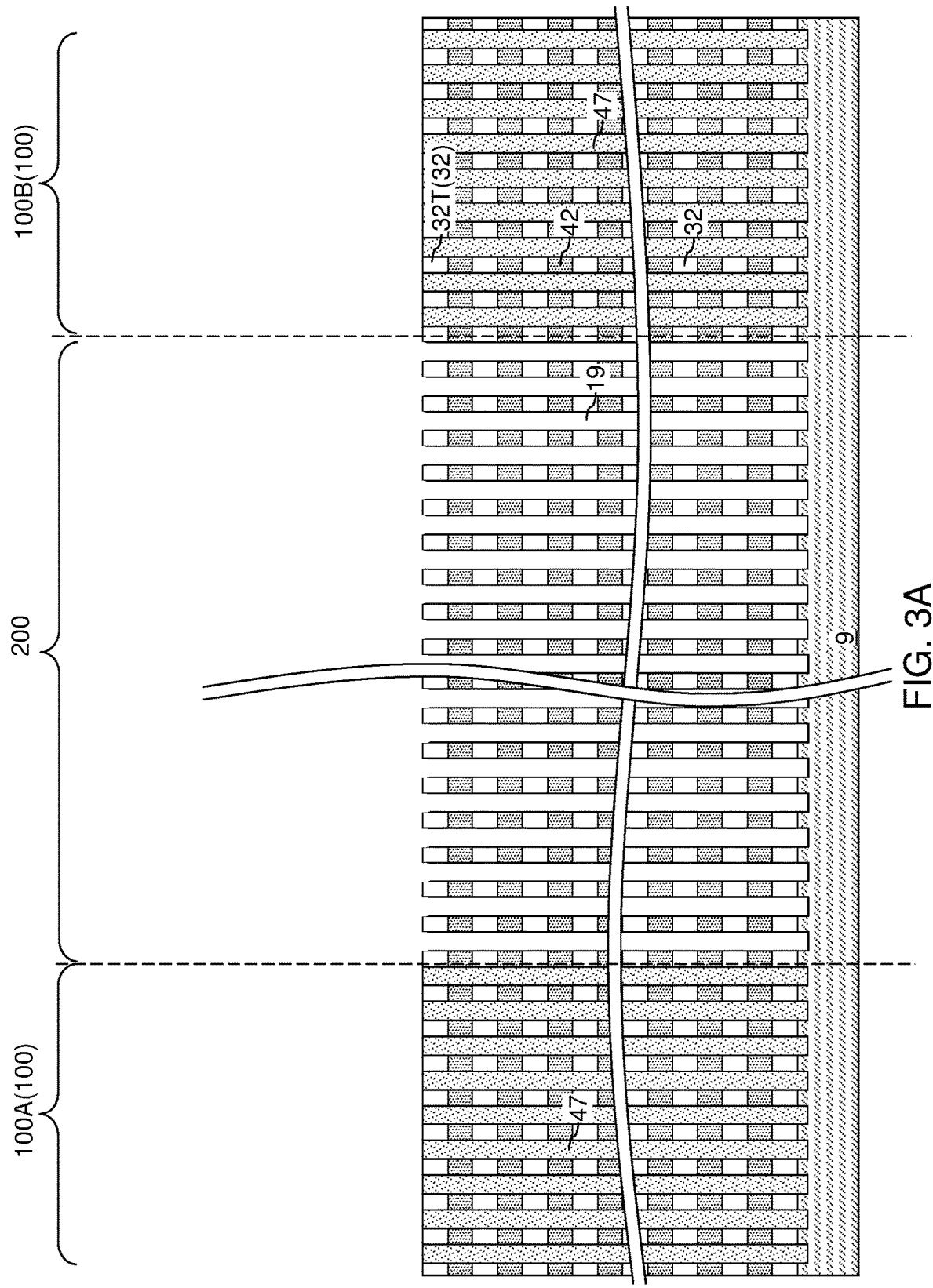

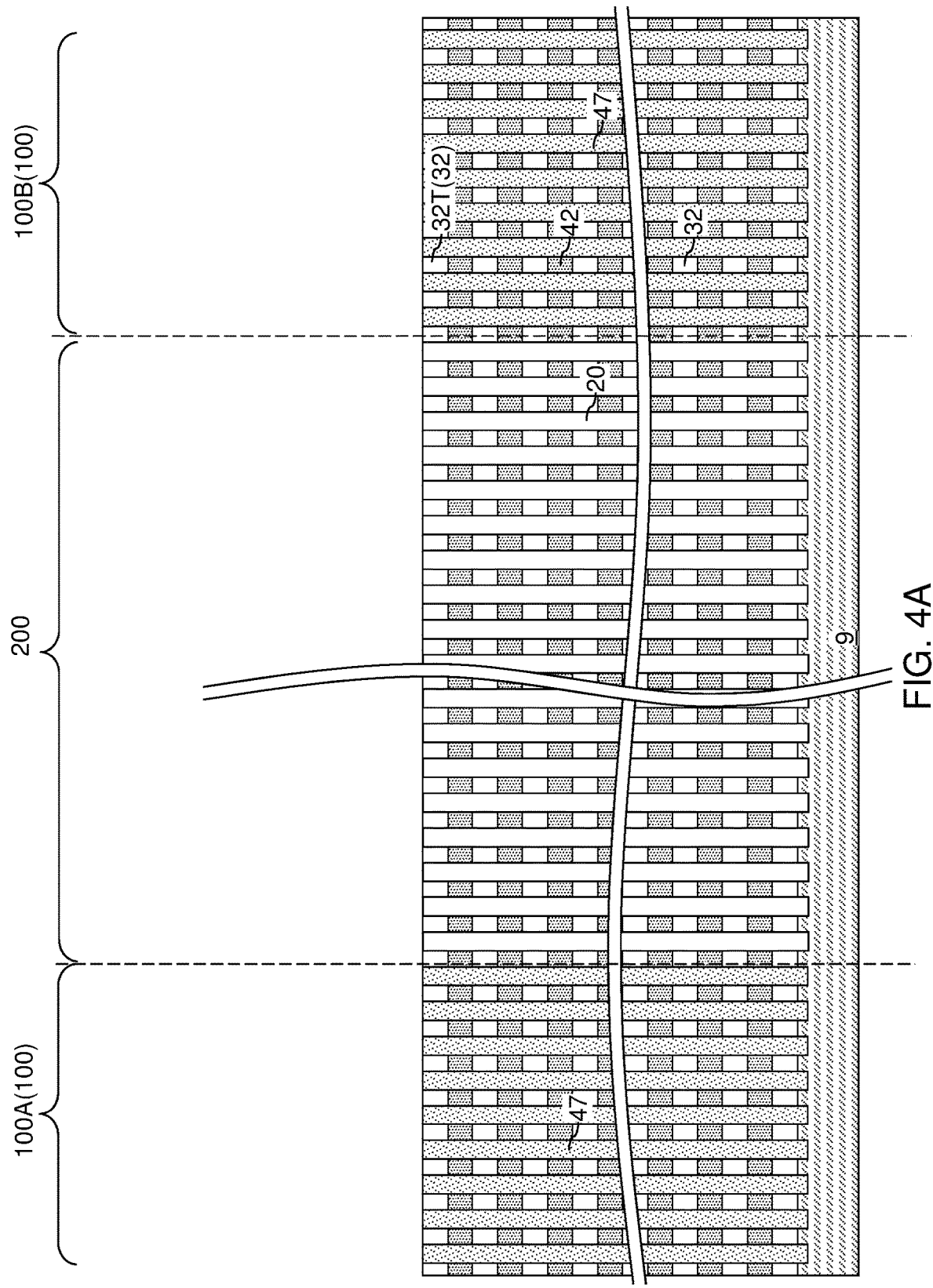

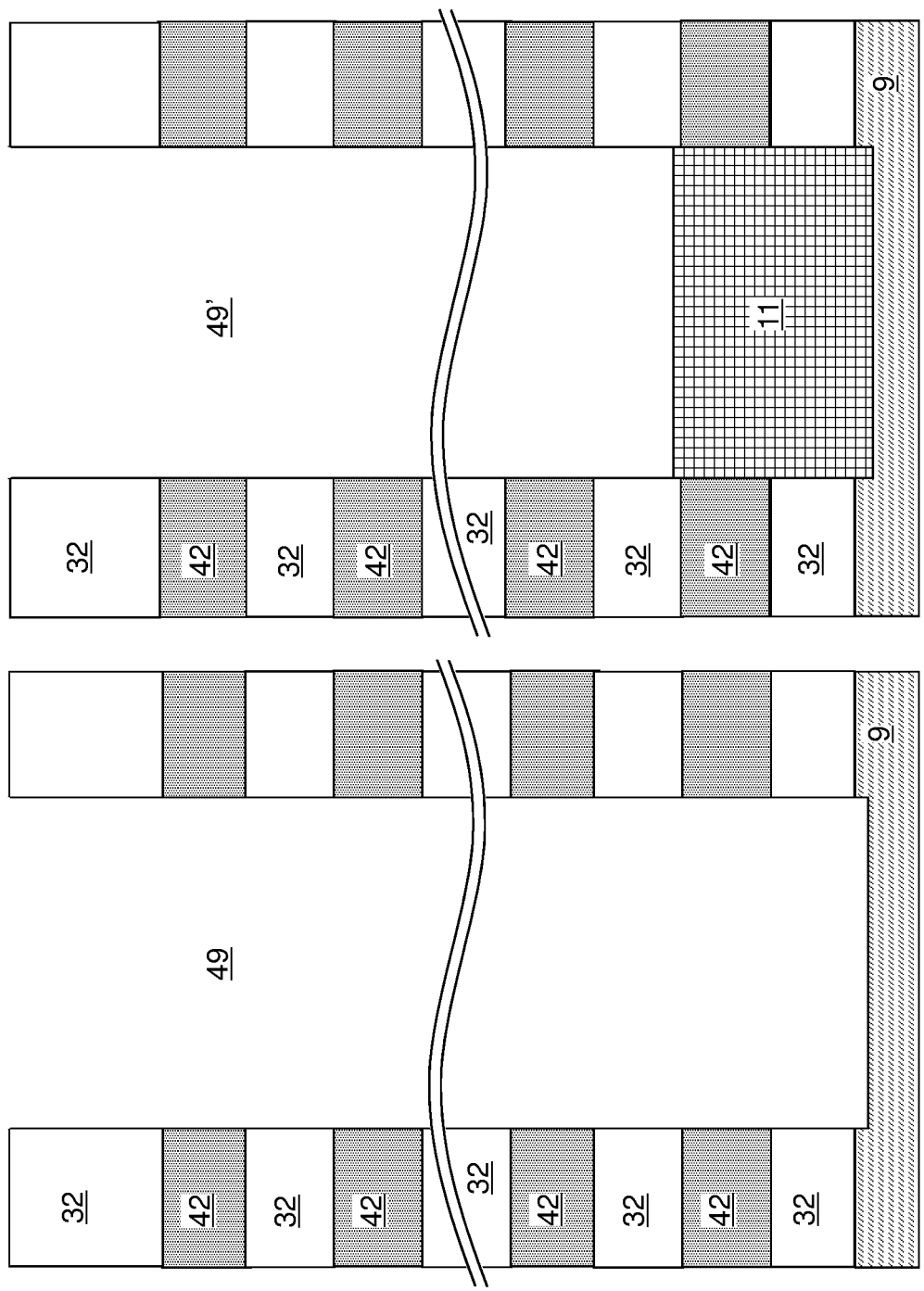

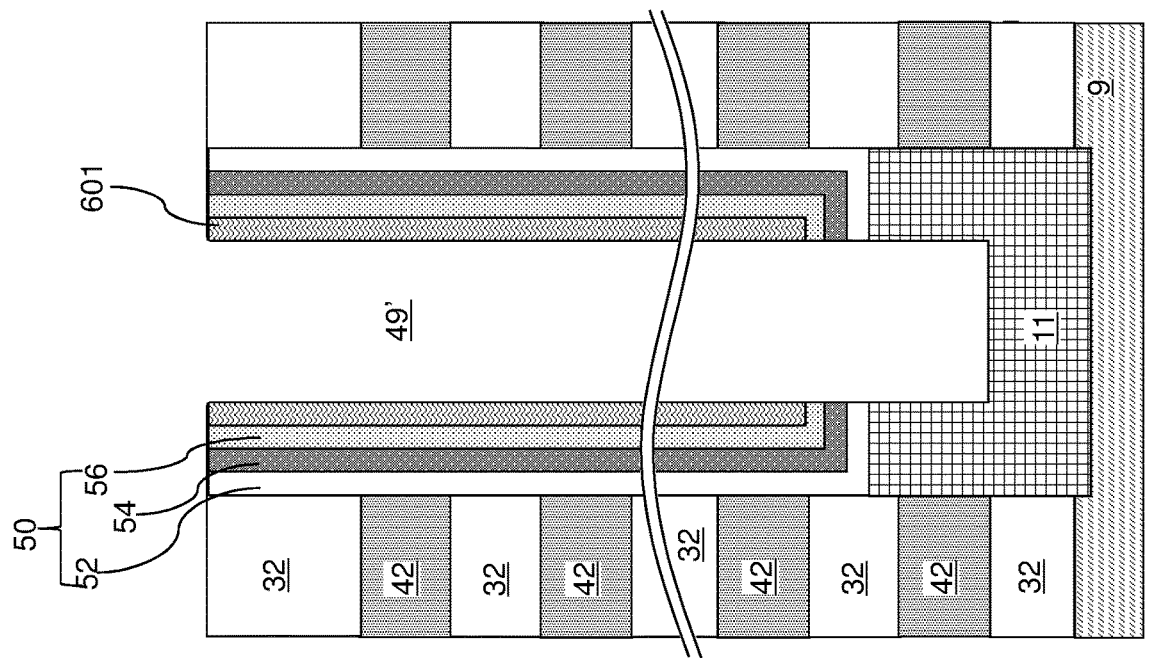
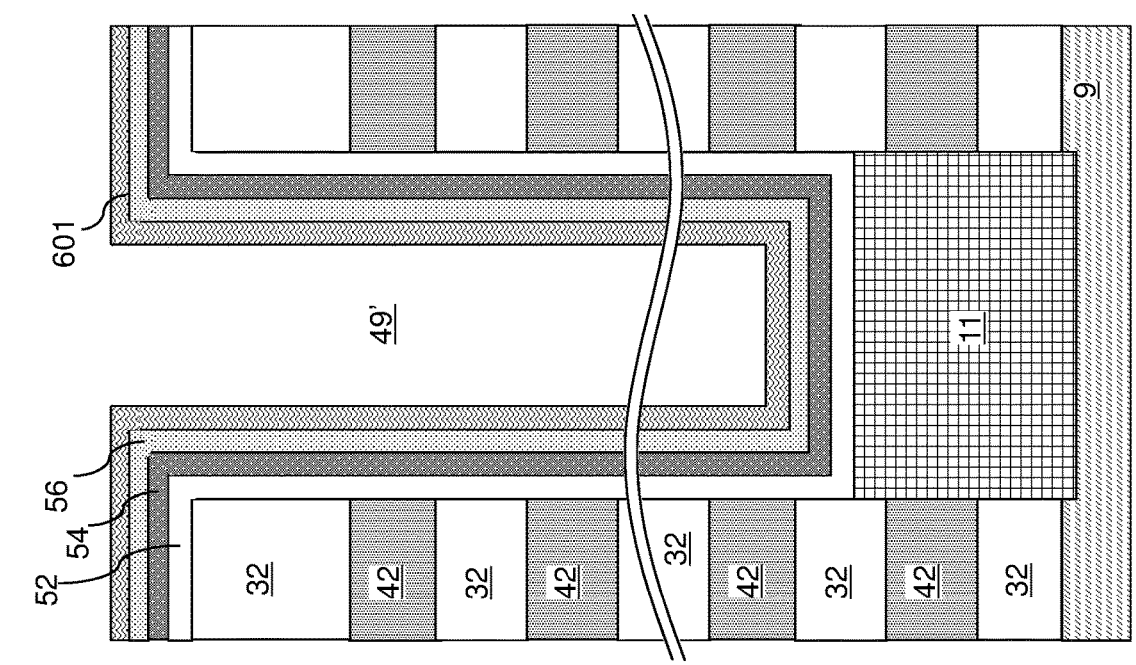

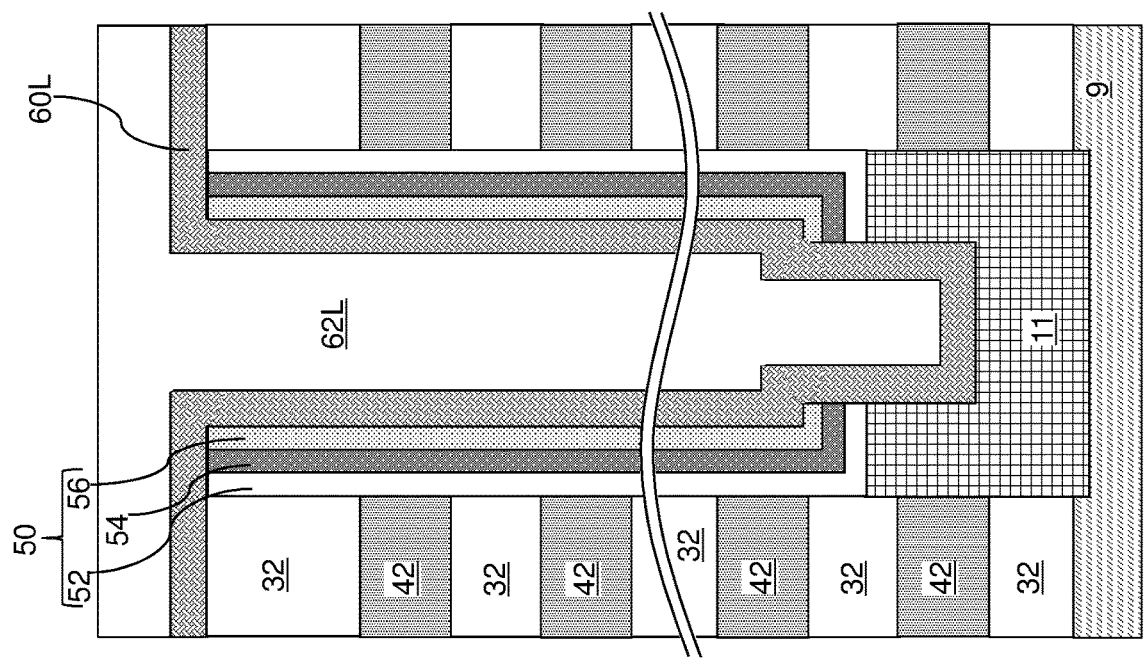
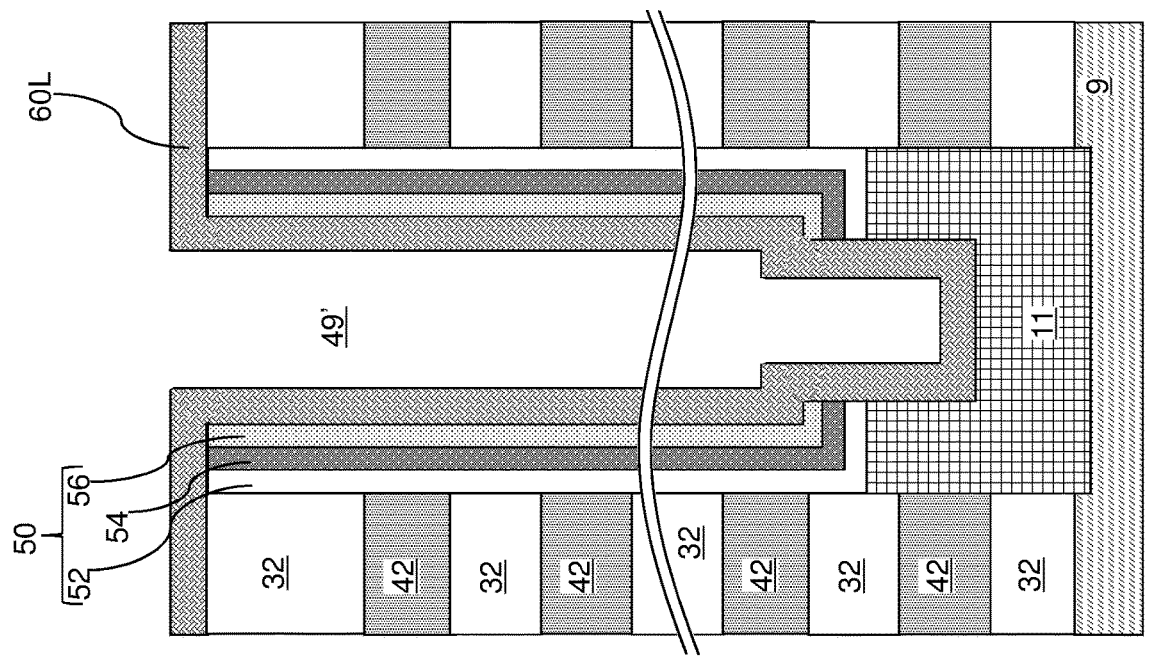
FIG. 6E
FIG. 6F

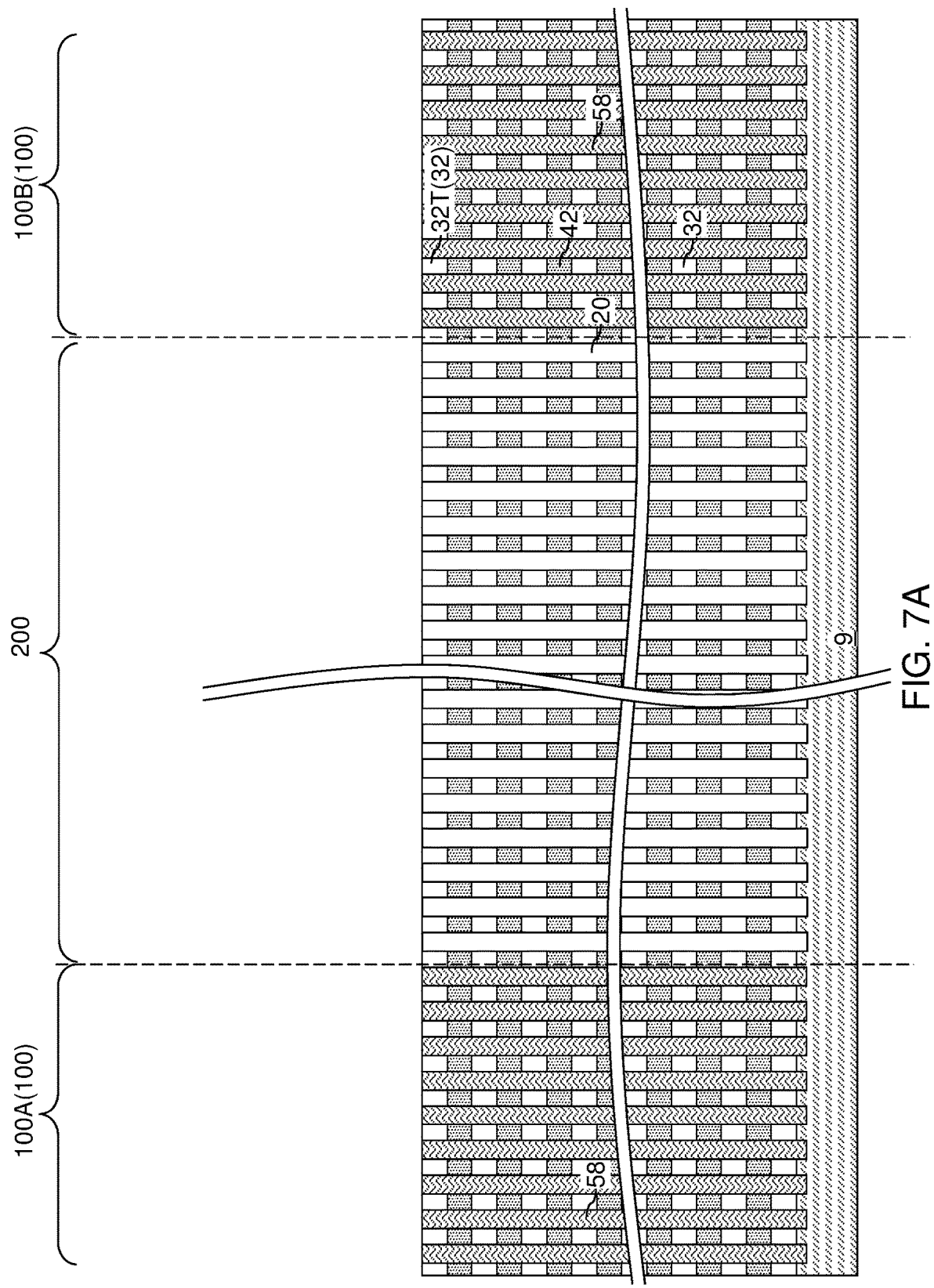

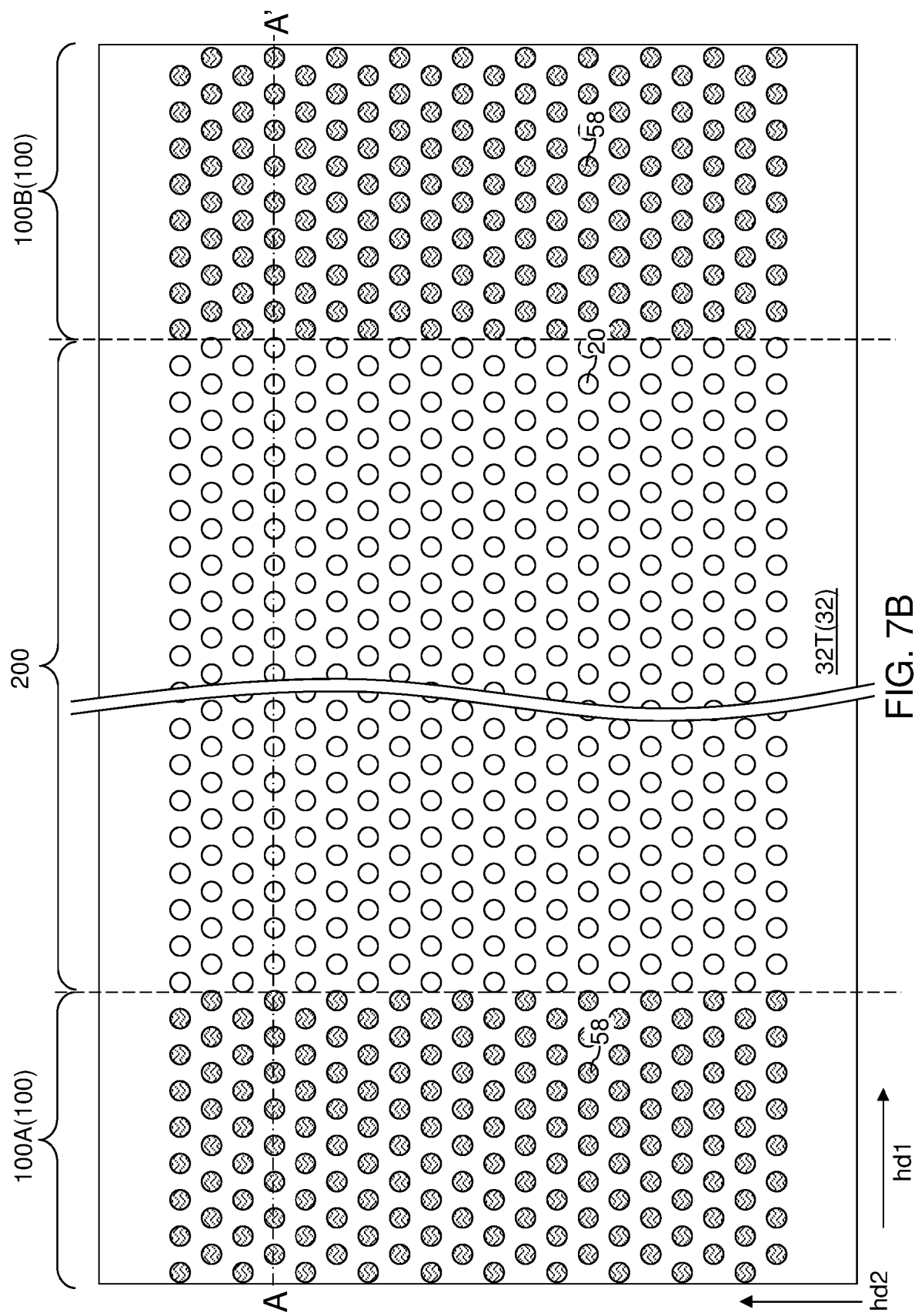

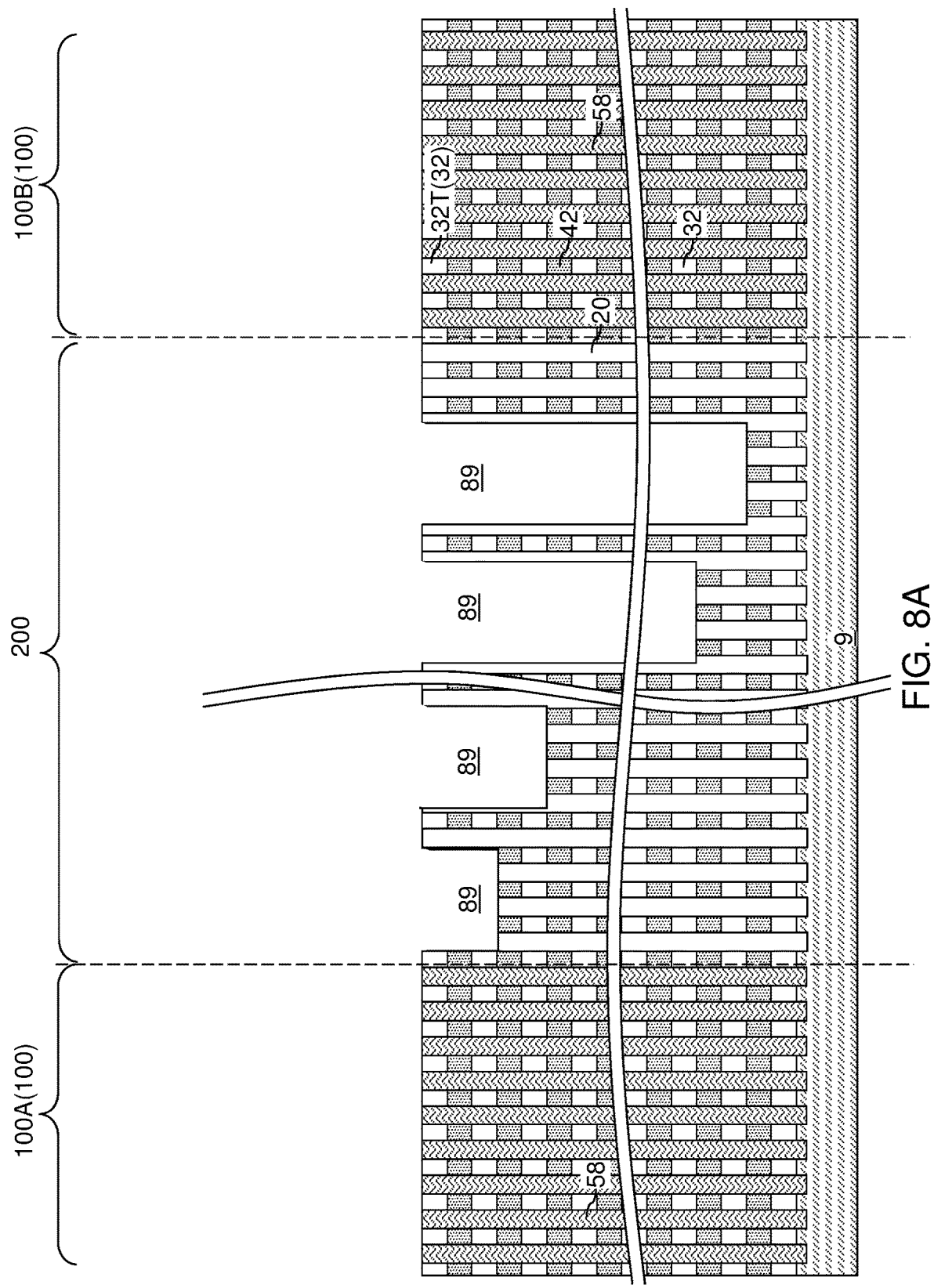

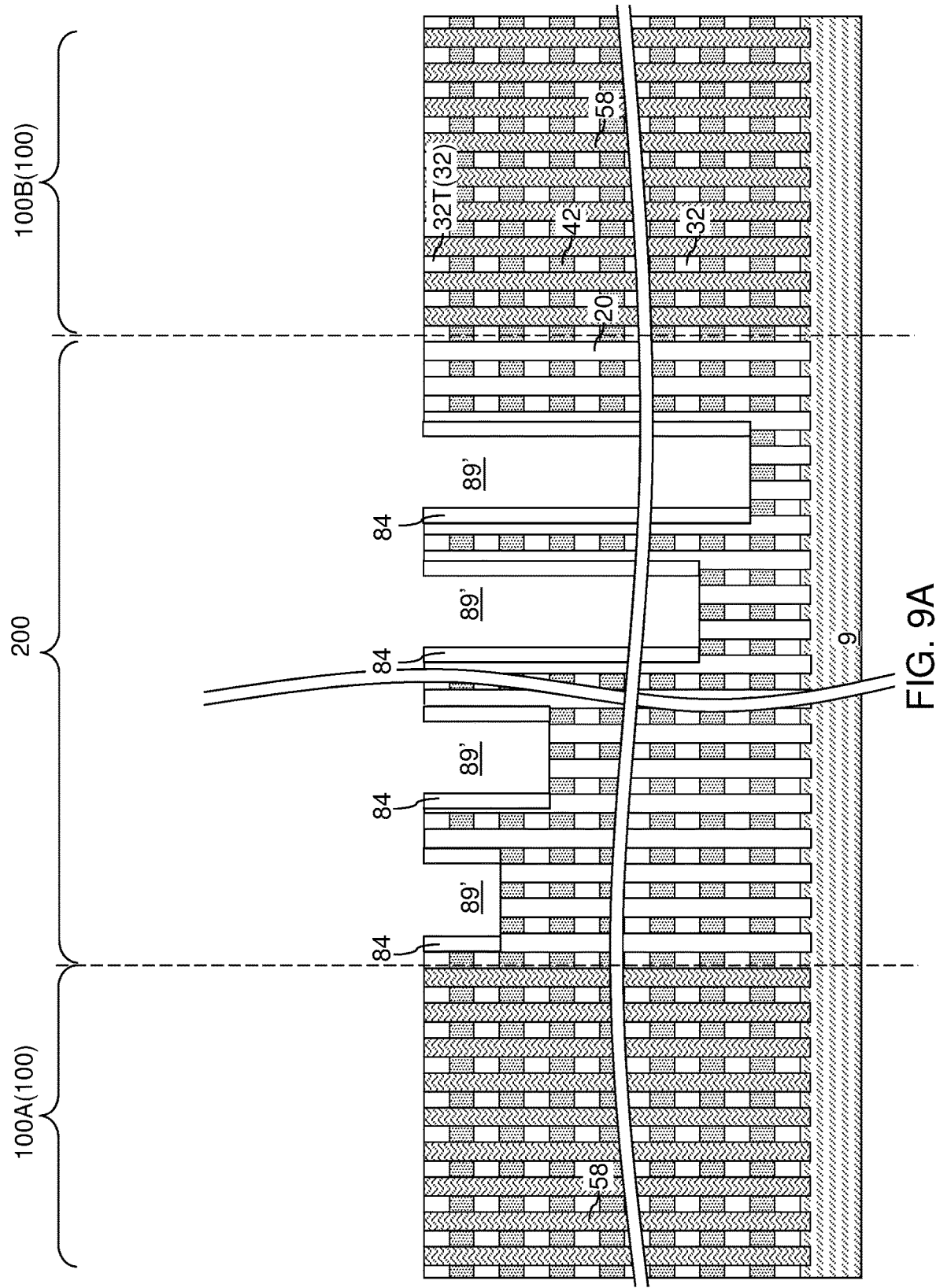

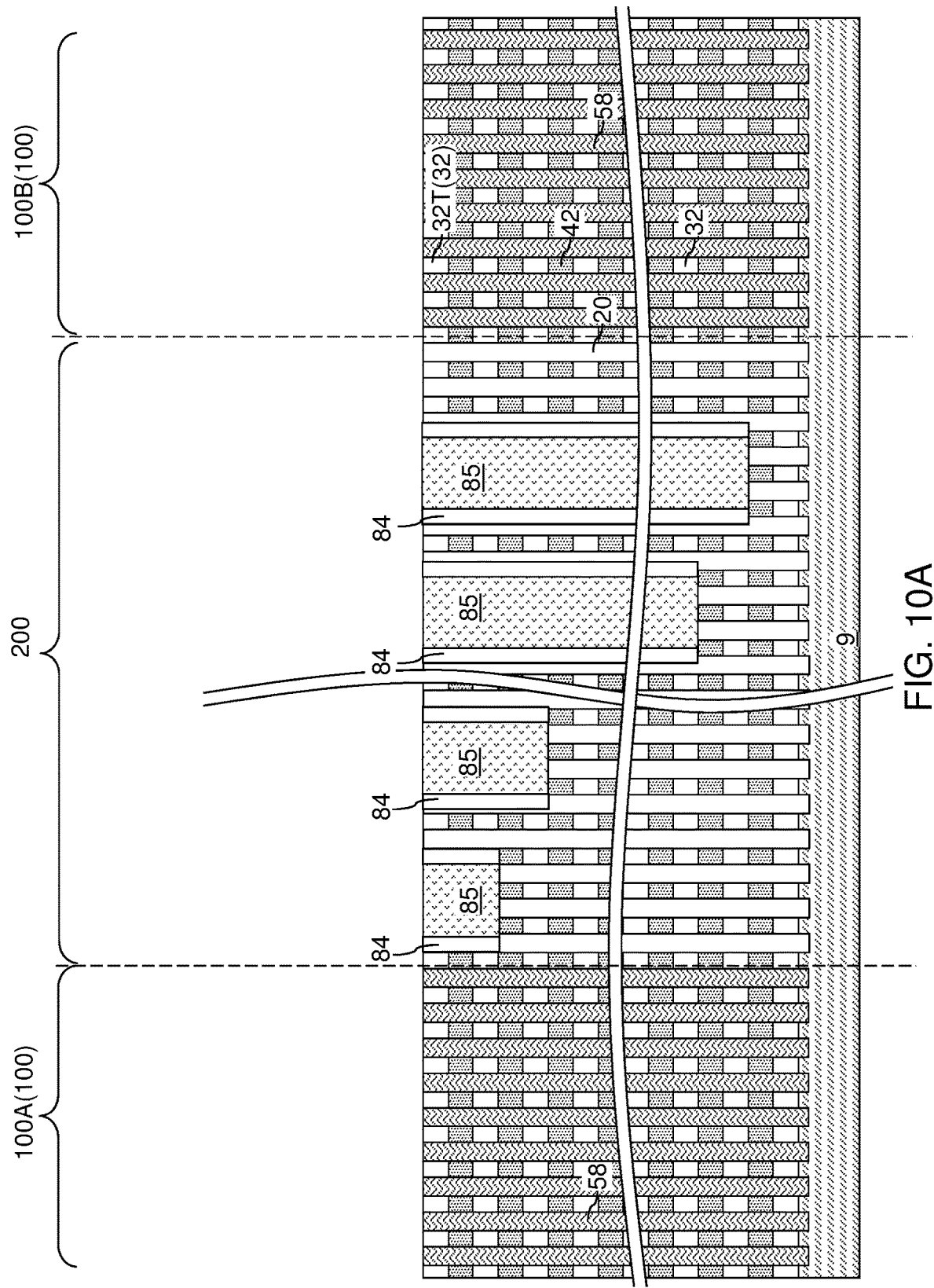

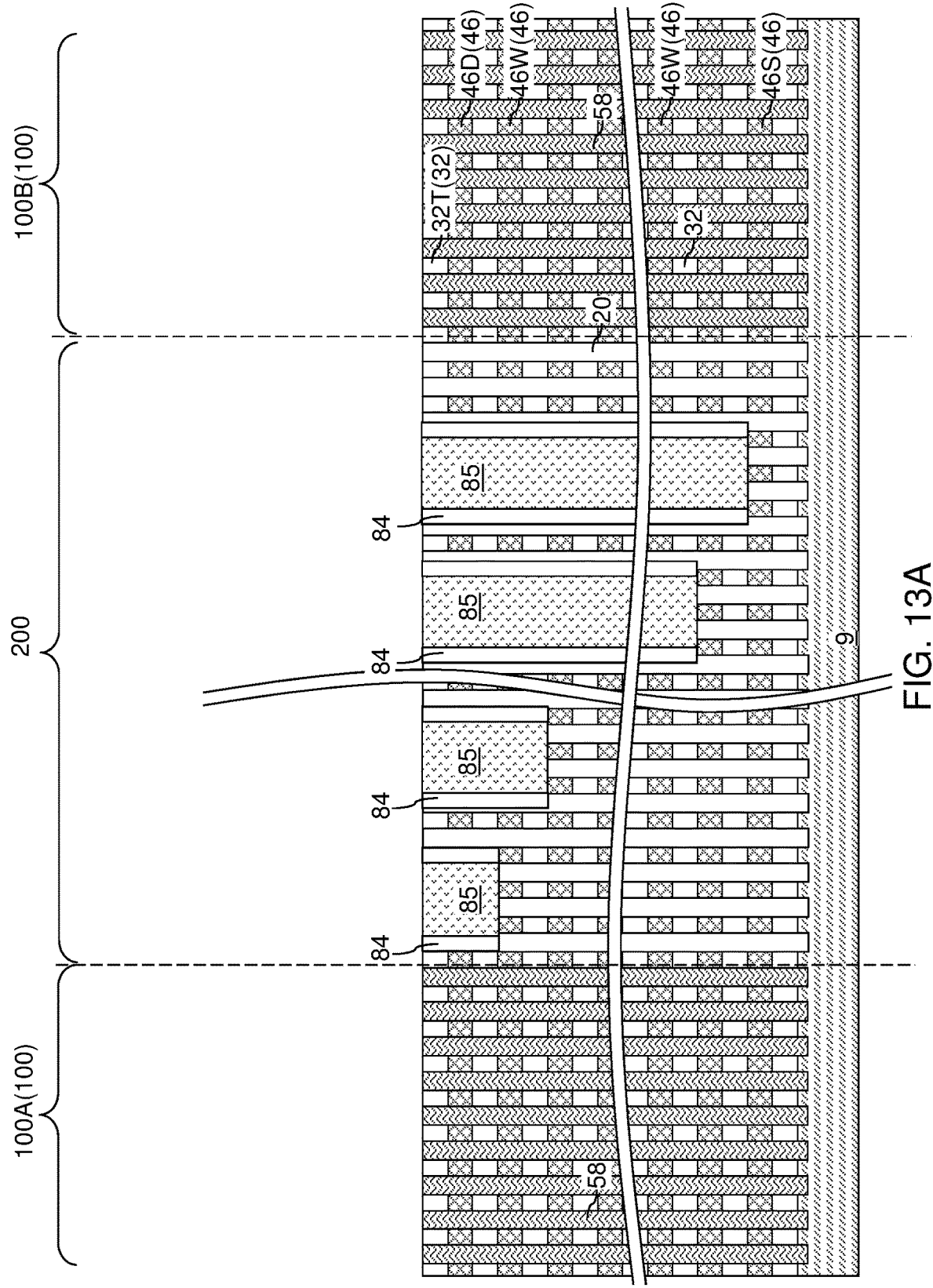

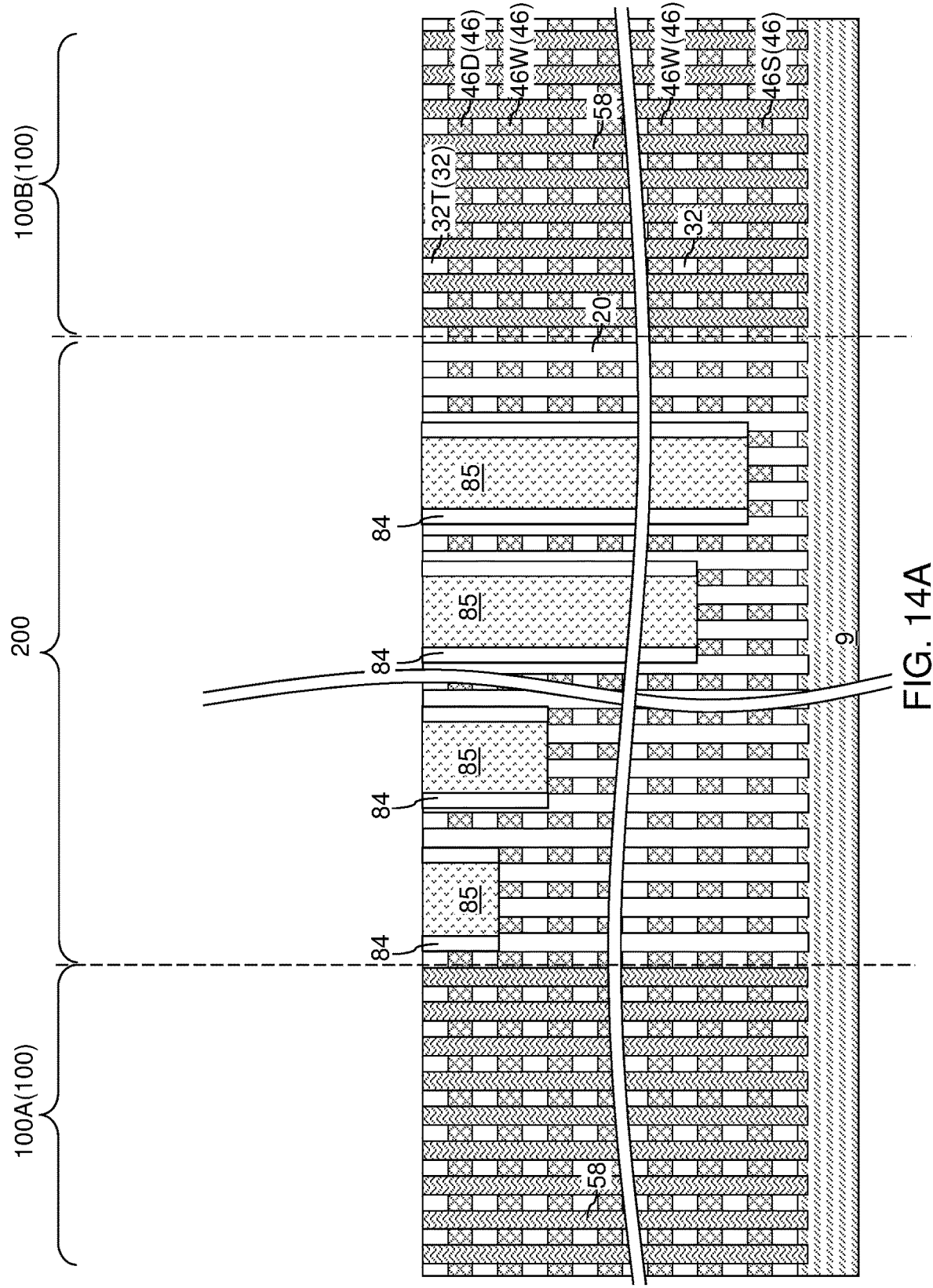

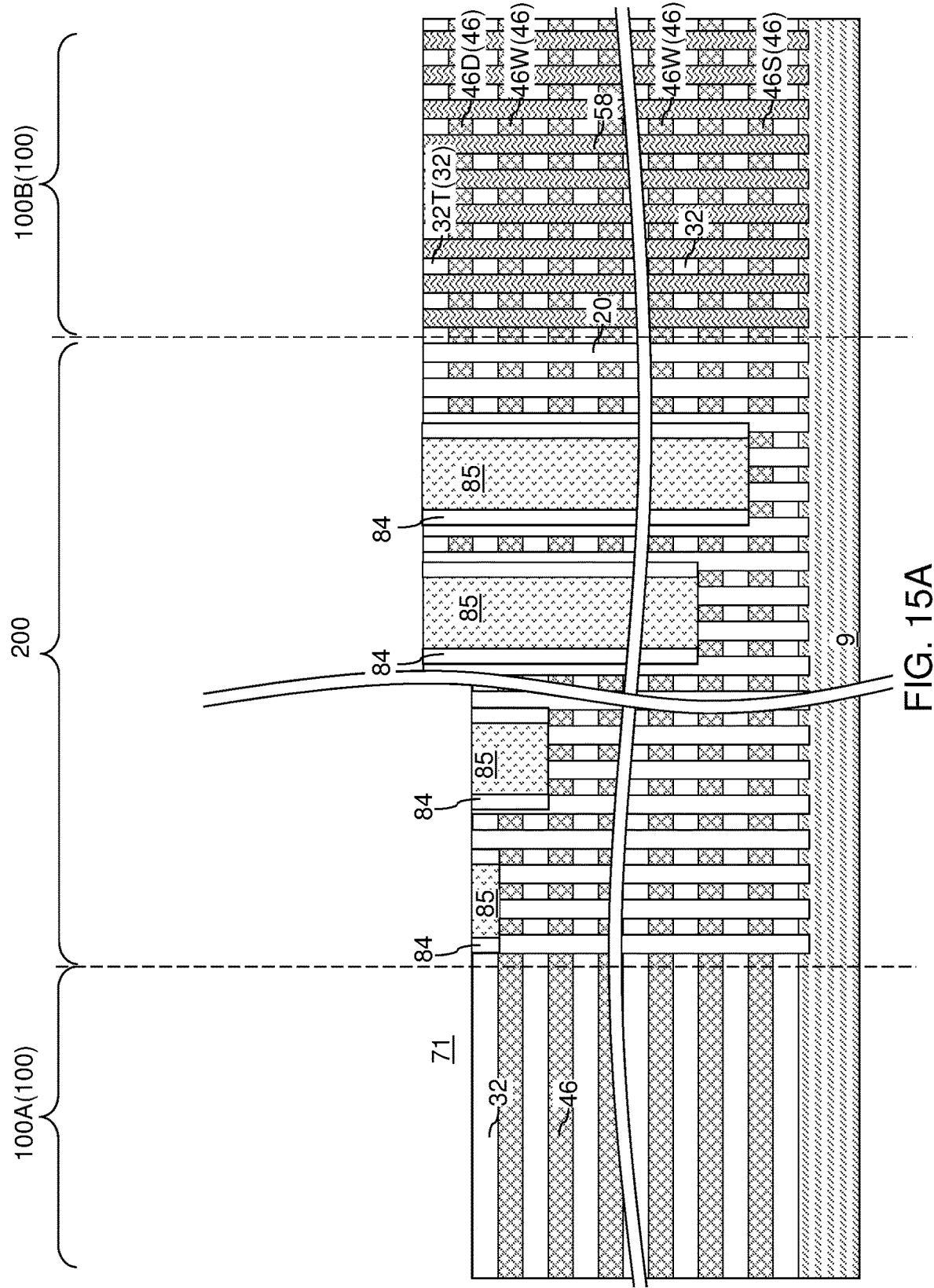

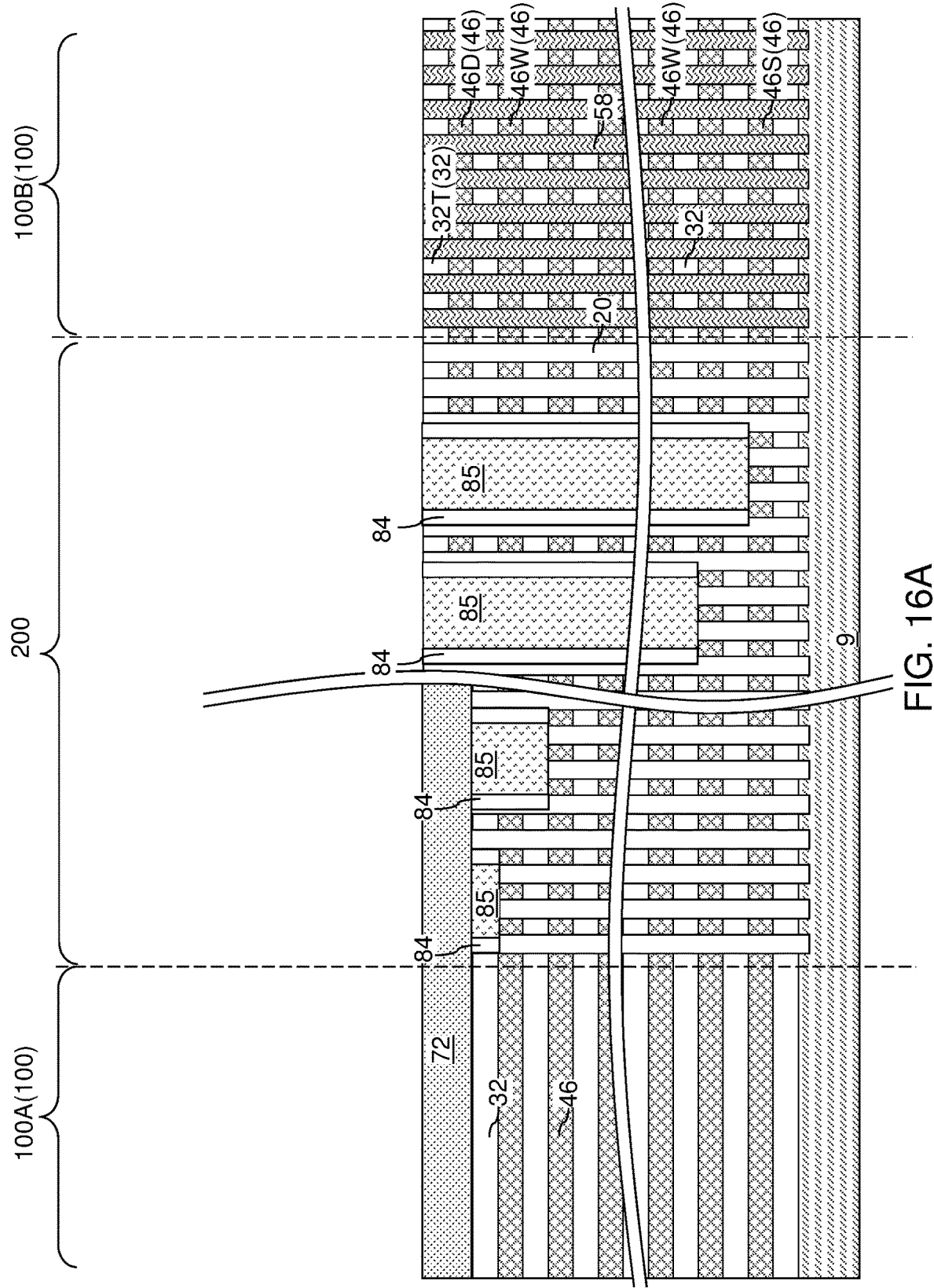

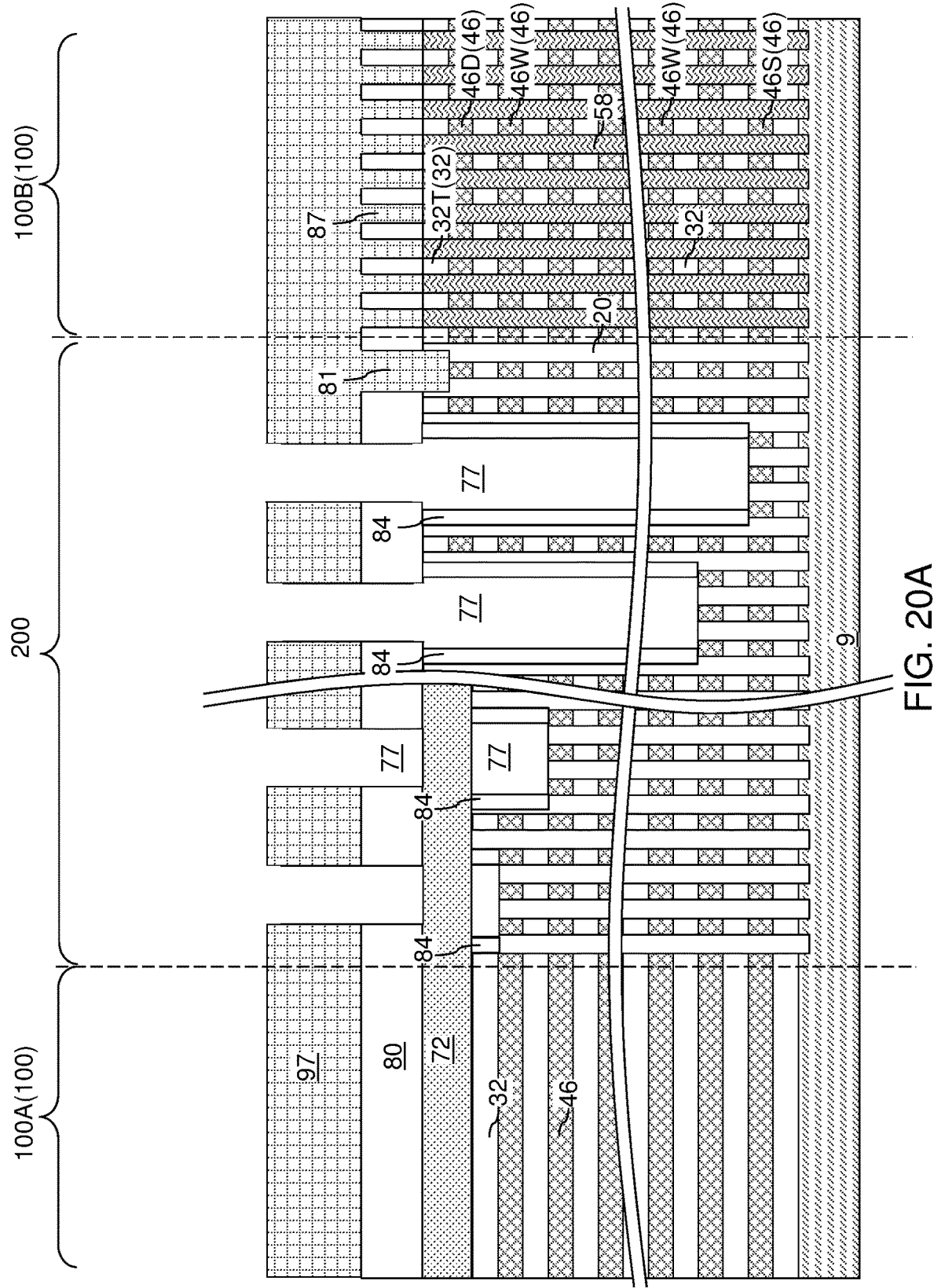

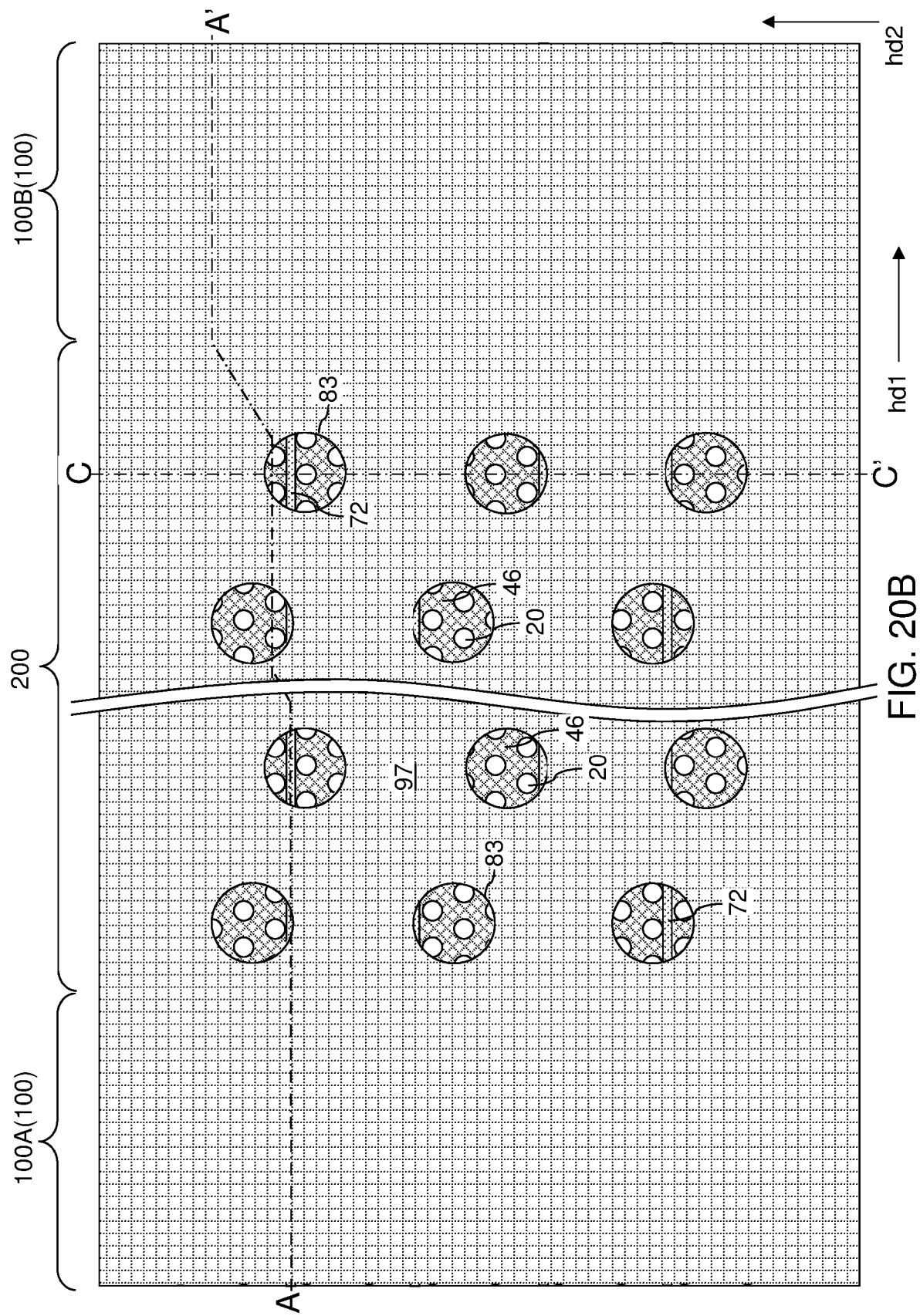

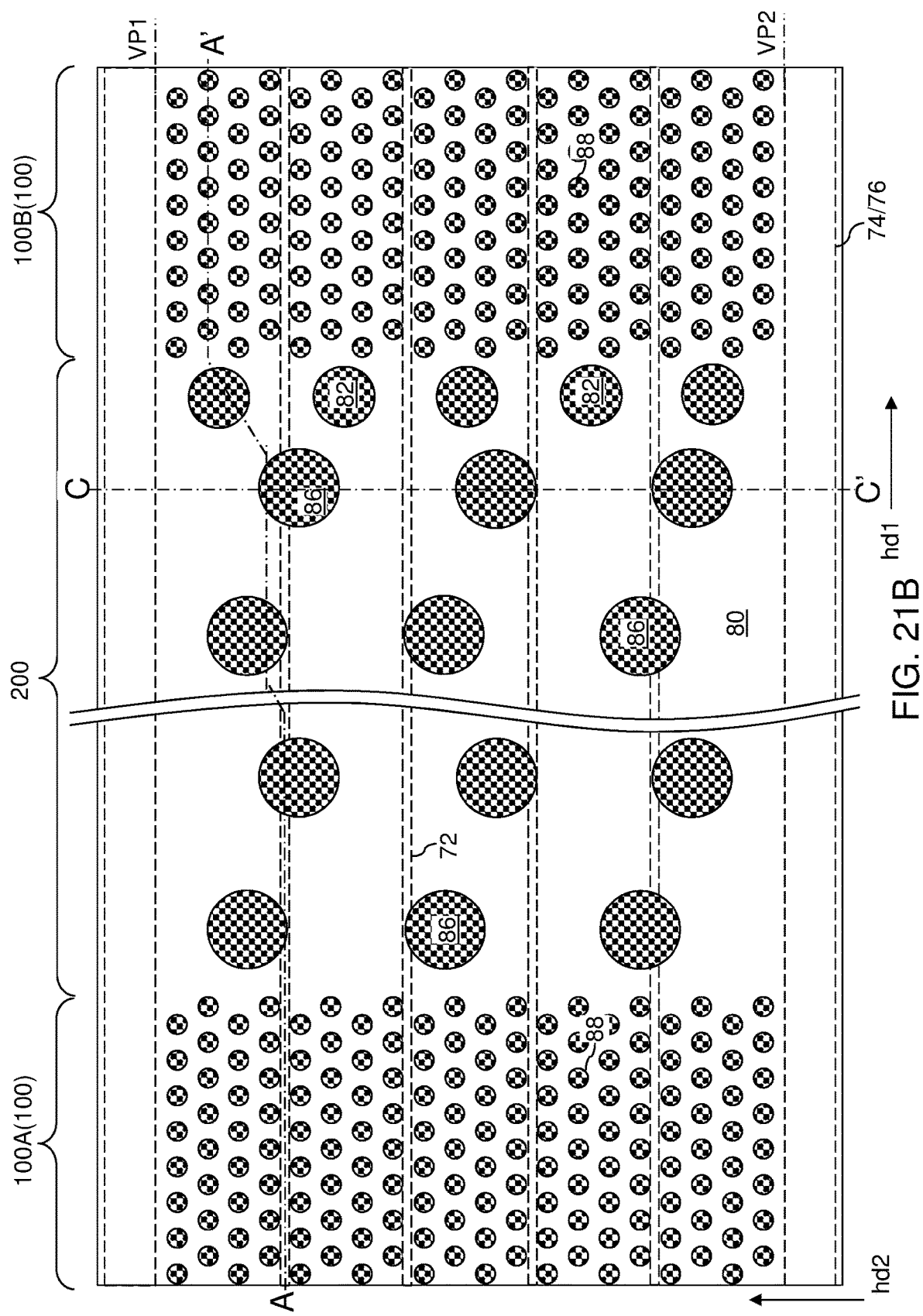

THREE-DIMENSIONAL MEMORY DEVICE CONTAINING WORD LINE CONTACTS WHICH EXTEND THROUGH DRAIN-SELECT-LEVEL ISOLATION STRUCTURES AND METHODS OF MAKING THE SAME

FIELD

The present disclosure relates generally to the field of semiconductor devices and specifically to a three-dimensional memory device containing word line contacts which extend through drain-select-level isolation structures and methods of making the same.

BACKGROUND

Three-dimensional memory devices may include memory stack structures. The memory stack structures overlie a substrate and extend through an alternating stack of insulating layers and electrically conductive layers. The memory stack structures include vertical stacks of memory elements provided at levels of the electrically conductive layers. Peripheral devices may be provided on the substrate underneath the alternating stack and the memory stack structures.

SUMMARY

According to an aspect of the present disclosure, a three-dimensional memory device includes an alternating stack of insulating layers and electrically conductive layers, where the electrically conductive layers include word lines and drain select gate electrodes that contain plurality of drain-select-level electrically conductive strips which are located above the word lines, memory stack structures vertically extending through the alternating stack, drain-select-level isolation structures located between a respective neighboring pair of drain-select-level electrically conductive strips, and a first laterally-insulated contact via assembly including a first layer contact via structure and a first tubular insulating spacer. The first laterally-insulated contact via assembly contacts a top surface of a first word line of the word lines, and the first laterally-insulated contact via assembly laterally contacts a first drain-select-level isolation structure of the drain-select-level isolation structures.

According to another aspect of the present disclosure, a method of forming a three-dimensional memory device comprises forming an alternating stack of insulating layers and sacrificial material layers over a substrate, forming memory stack structures through the alternating stack in a memory array region, replacing the sacrificial material layers with electrically conductive layers, wherein the electrically conductive layers comprise word lines and at least one drain select gate electrode that overlies the word lines, forming drain-select-level isolation structures through at least a topmost insulating layer the insulating layers and through the at least one drain select gate electrode, wherein the at least drain select gate electrode is divided into a plurality of drain-select-level electrically conductive strips, and forming a first laterally-insulated contact via assembly comprising a first layer contact via structure and a first tubular insulating spacer. The first laterally-insulated contact via assembly contacts a top surface of a first word line of the word lines, and the first laterally-insulated contact via assembly laterally contacts a first drain-select-level isolation structure of the drain-select-level isolation structures.

BRIEF DESCRIPTION OF THE DRAWINGS

FIG. 1A is a vertical cross-sectional view of an exemplary structure after formation of an alternating stack of insulating layers and sacrificial material layers, memory openings, and support openings according to an embodiment of the present disclosure.

FIG. 2A is a vertical cross-sectional view of the exemplary structure after formation of sacrificial memory opening fill structures and sacrificial support opening fill structures according to an embodiment of the present disclosure.

FIG. 2B is a top-down view of the exemplary structure of FIG. 2A. The vertical plane A-A' is the vertical cross-sectional plane of FIG. 2A.

FIG. 3A is a vertical cross-sectional view of the exemplary structure after removal of sacrificial support opening fill structures according to an embodiment of the present disclosure.

FIG. 4A is a vertical cross-sectional view of the exemplary structure after formation of support pillar structures according to an embodiment of the present disclosure.

FIGS. 6A-6H is a vertical cross-sectional view of a memory opening during formation of a memory opening fill structure.

FIG. 7A is a vertical cross-sectional view of the exemplary structure after formation of memory opening fill structures according to an embodiment of the present disclosure.

FIG. 7B is a top-down view of the exemplary structure of FIG. 7A. The vertical plane A-A' is the vertical cross-sectional plane of FIG. 7A.

FIG. 8A is a vertical cross-sectional view of the exemplary structure after formation of contact via cavities according to an embodiment of the present disclosure.

FIG. 9A is a vertical cross-sectional view of the exemplary structure after formation of tubular insulating spacers according to an embodiment of the present disclosure.

FIG. 10A is a vertical cross-sectional view of the exemplary structure after formation of sacrificial via structures according to an embodiment of the present disclosure.

FIG. 13A is a vertical cross-sectional view of the exemplary structure after formation of electrically conductive layers according to an embodiment of the present disclosure.

FIG. 14A is a vertical cross-sectional view of the exemplary structure after formation of backside trench fill structures according to an embodiment of the present disclosure.

FIG. 15A is a vertical cross-sectional view of the exemplary structure after formation of drain-select-level isolation trenches according to an embodiment of the present disclosure.

FIG. 16A is a vertical cross-sectional view of the exemplary structure after formation of drain-select-level isolation structures according to an embodiment of the present disclosure.

FIG. 20A is a vertical cross-sectional view of the exemplary structure after formation of layer contact via cavities according to an embodiment of the present disclosure.

FIG. 20B is a top-down view of the exemplary structure of FIG. 20A. The vertical plane A-A' is the vertical cross-sectional plane of FIG. 20A.

FIG. 21B is a top-down view of the exemplary structure of FIG. 21A. The vertical plane A-A' is the vertical cross-sectional plane of FIG. 21A.

DETAILED DESCRIPTION

Figure 1B:
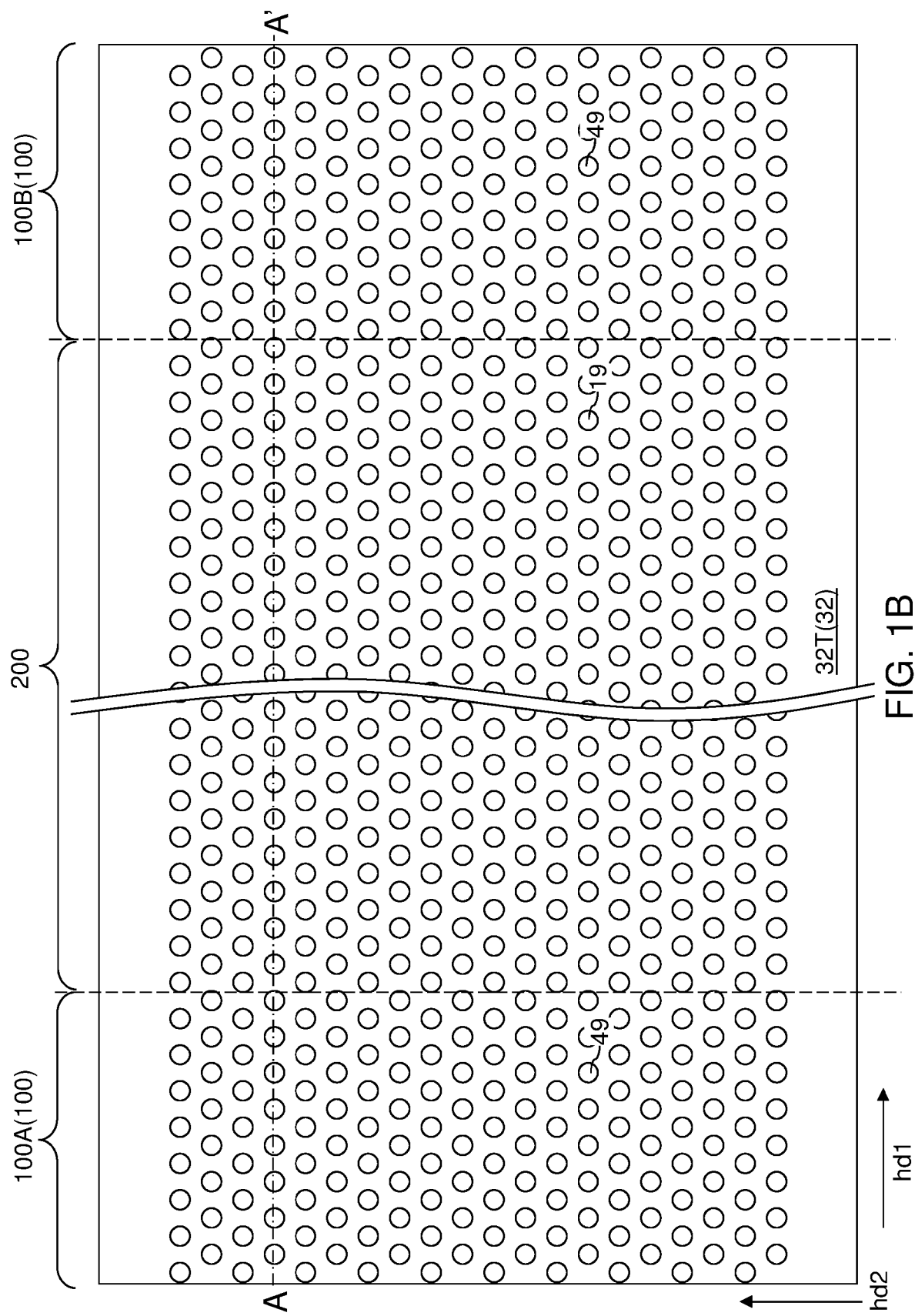
FIG. 1B is a top-down view of the exemplary structure of FIG. 1A. The vertical plane A-A' is the vertical cross-sectional plane of FIG. 1A.

Embodiments of the present disclosure are directed to three-dimensional memory devices, such as vertical NAND devices containing word line contacts which extend through drain-select-level isolation structures and methods of making the same, the various embodiments of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIGS. 1A and 1B, an exemplary structure according to an embodiment of the present disclosure is illustrated. The exemplary structure comprises a semiconductor material layer 9. The semiconductor material layer 9 may comprise a portion of a semiconductor substrate, or may be formed over a semiconductor substrate by depositing or bonding a layer of a semiconductor material, or may comprise a doped well in a semiconductor substrate, such as a silicon wafer. The semiconductor material layer 9 may be single crystalline or polycrystalline. The semiconductor material layer 9 includes a semiconductor material, such as silicon. The semiconductor material layer 9 may be doped with dopants of a first conductivity type, which may be p-type or n-type.

A stack of an alternating plurality of insulating layers 32 and sacrificial material layers 42 can be formed over the semiconductor material layer 9. The insulating layers 32 include an insulating material such as silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the insulating layers 32 can comprise, and/or consist essentially of, silicon oxide.

The sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can comprise, and/or consist essentially of, silicon nitride.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. In one embodiment, each sacrificial material layer 42 in the alternating stack (32, 42) can have a uniform thickness that is substantially invariant within each respective sacrificial material layer 42. The topmost layer of the alternating stack (32, 42) may be a topmost insulating layer 32T, which is a topmost layer among the insulating layers 32.

While the spacer material layers are sacrificial material layers 42 that are subsequently replaced with electrically conductive layers in the embodiment described above, other embodiments are expressly contemplated herein in which the sacrificial material layers are formed as electrically conductive layers. In this case, steps for replacing the spacer material layers with electrically conductive layers can be omitted.

A lithographic material stack (not shown) including at least a photoresist layer can be formed over the topmost insulating layer 32T, and can be lithographically patterned to form openings therein. The openings include a first set of openings formed over memory array regions 100 and a second set of openings formed over a contact region 200. In one embodiment, the memory array regions 100 may comprise a first memory array region 100A and a second memory array region 100B that are laterally spaced apart along a first horizontal direction (e.g., word line direction) hd1. The contact region 200 may be located between the first memory array region 100A and the second array region 100B. The pattern of the openings may include rows of openings that laterally extend along the first horizontal direction hd1. The rows of the openings in the lithographic material stack may be laterally spaced apart along the second horizontal direction (e.g., word line direction) hd2.

The pattern in the lithographic material stack can be transferred through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed in the memory array regions 100. The support openings 19 are formed in the contact region 200.

The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 9. In one embodiment, an overetch into the semiconductor material layer 9 may be optionally performed after the top surface of the semiconductor material layer 9 is physically exposed at a bottom of each memory opening 49 and each support opening 19. The overetch may be performed prior to, or after, removal of the lithographic material stack. In other words, the recessed surfaces of the semiconductor material layer 9 may be vertically offset from the un-recessed top surfaces of the semiconductor material layer 9 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 9.

Each of the memory openings 49 and the support openings 19 may include a sidewall (or a plurality of sidewalls) that extends substantially perpendicular to the topmost surface of the substrate. A two-dimensional array of memory openings 49 can be formed in each memory array region 100. A two-dimensional array of support openings 19 can be formed in the contact region 200.

Referring to FIGS. 2A and 2B, a sacrificial fill material can be deposited in the memory openings 49 and the support openings 19. The sacrificial fill material may be any material that may be removed selective to the materials of the insulating layers 32, the sacrificial material layers 42, and the semiconductor material layer 9. For example, the sacrificial fill material may comprise a carbon-based material such as amorphous carbon or diamond-like carbon, a semiconductor material such as a silicon-germanium alloy or amorphous silicon, or a dielectric material such as borosilicate glass or organosilicate glass. Optionally, a thin etch stop liner (not shown) may be employed to facilitate subsequent selective removal of the sacrificial fill material. Excess portions of the sacrificial fill material may be removed from above the horizontal plane including the top surface of the topmost insulating layer 32T. Each remaining portion of the sacrificial fill material filling a memory opening 49 constitutes a sacrificial memory opening fill structure 47. Each remaining portion of the sacrificial fill material filling a support opening 19 constitutes a sacrificial support opening fill structure 17.

Figure 3B:
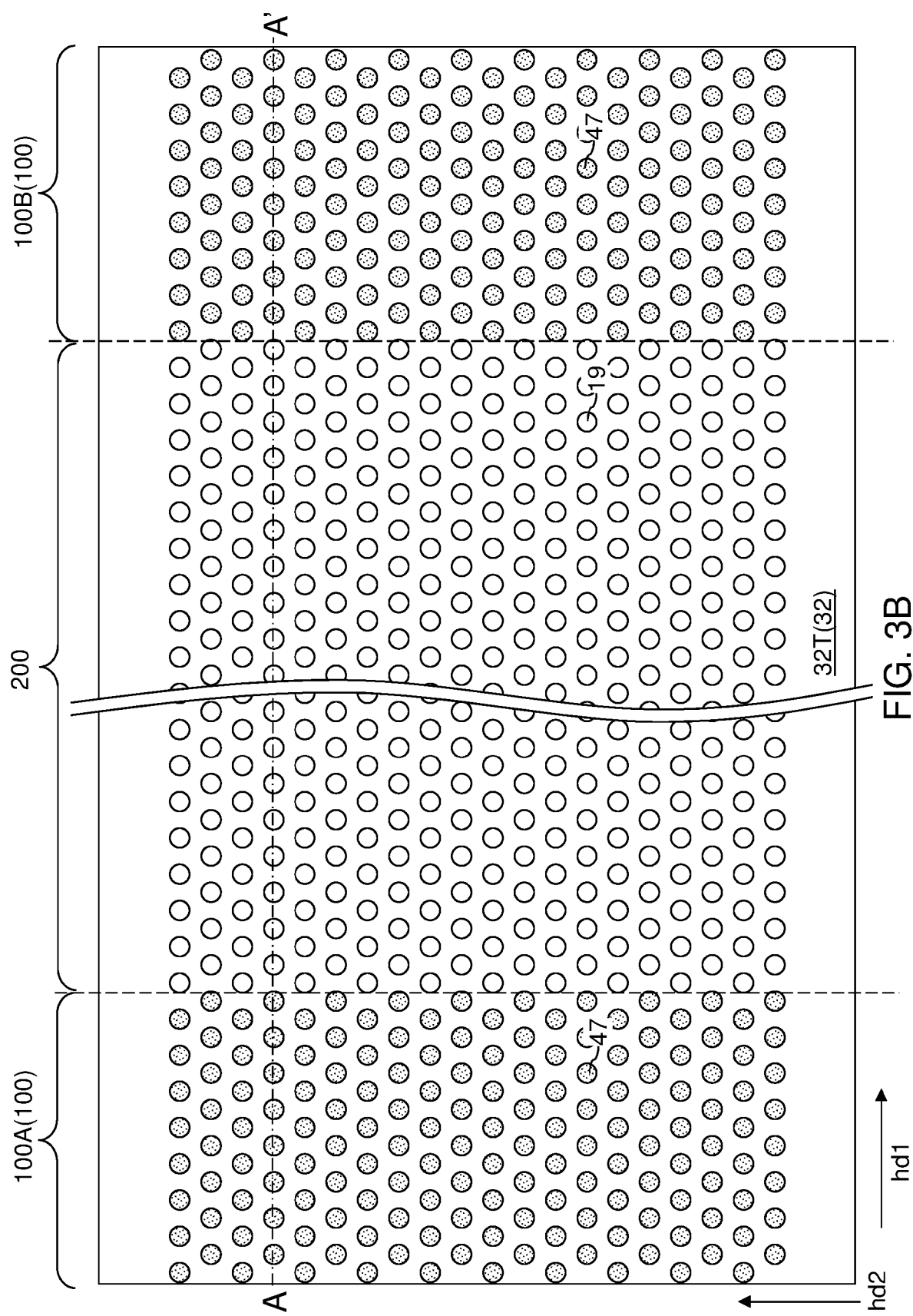
FIG. 3B is a top-down view of the exemplary structure of FIG. 3A. The vertical plane A-A' is the vertical cross-sectional plane of FIG. 3A.

Referring to FIGS. 3A and 3B, a photoresist layer (not shown) can be applied over the exemplary structure, and can be lithographically patterned to cover the memory array regions 100 while not covering the contact regions 200. The sacrificial support opening fill structures 17 can be removed by removing the sacrificial fill material within the areas that are not covered by the photoresist layer. The sacrificial fill material may be removed, for example, by ashing or by performing an etch process such as a wet etch process. Cavities are formed in the support openings 19. The photoresist layer can be removed, for example, by ashing.

Figure 4B:
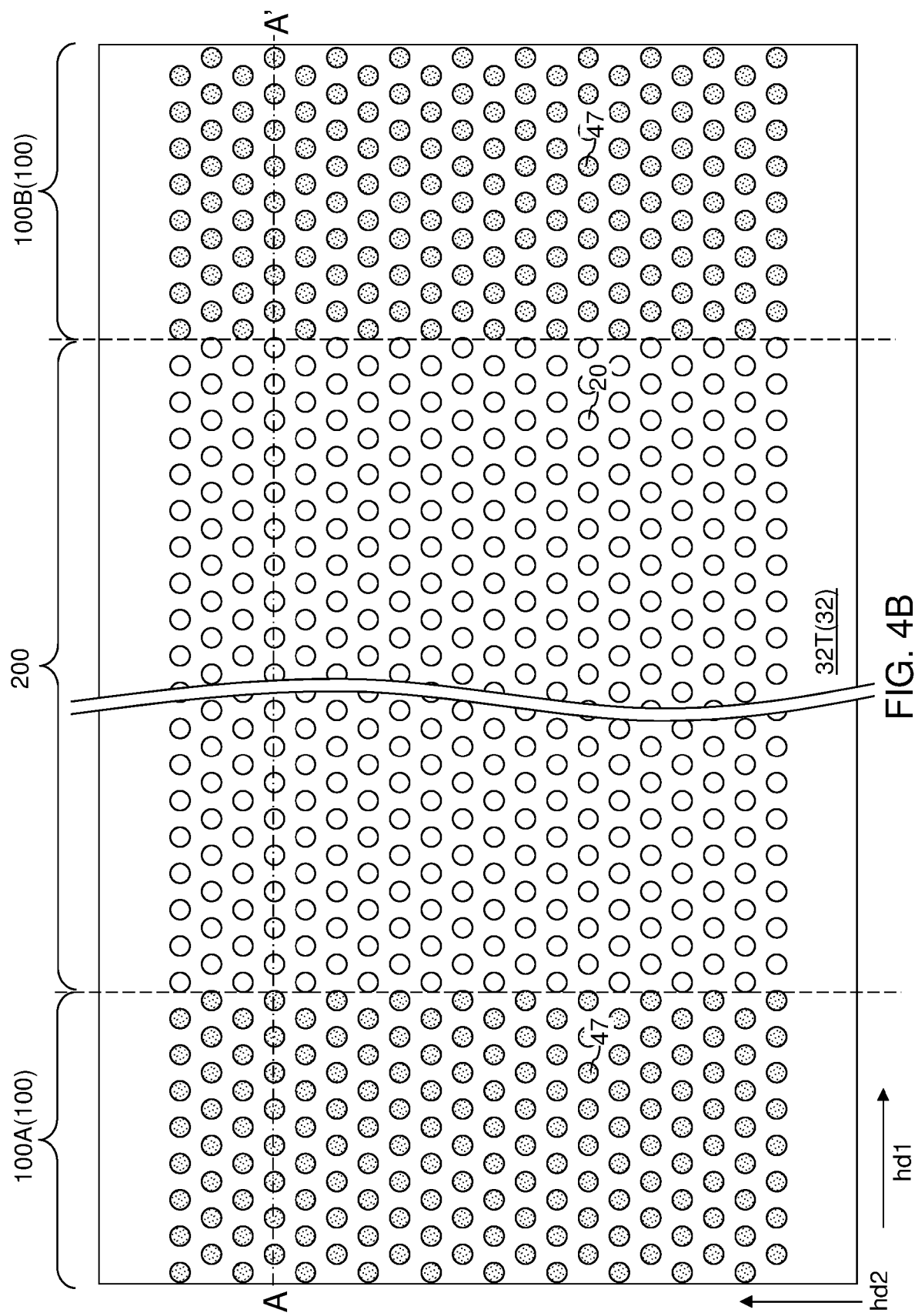
FIG. 4B is a top-down view of the exemplary structure of FIG. 4A. The vertical plane A-A' is the vertical cross-sectional plane of FIG. 4A.

Referring to FIGS. 4A and 4B, a dielectric fill material such as undoped silicate glass (i.e., silicon oxide) or a doped silicate glass can be deposited in the support openings 19 employing a conformal deposition process such as a chemical vapor deposition process. Portions of the dielectric fill material that overlie the topmost insulating layer 32T may be removed, for example, by chemical mechanical polishing or by an etch back process, such as a wet etch process employing dilute hydrofluoric acid. Remaining portions of the dielectric fill material that fill the support openings 19 comprise support pillar structures 20, which are dielectric pillar structures that provide structural support to the exemplary structure during a subsequent processing step in which the sacrificial material layers 42 are removed.

Figure 5A:
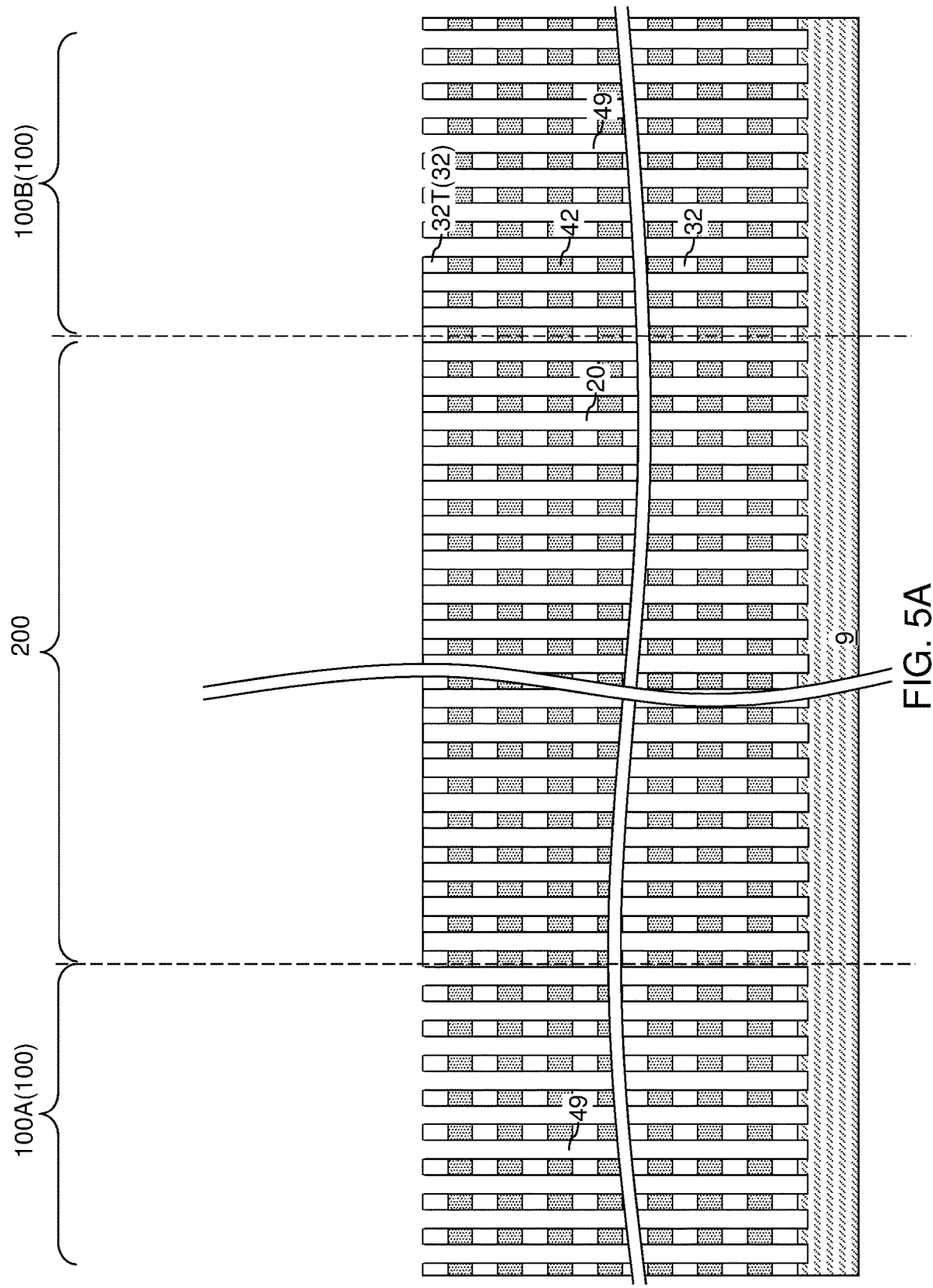
FIG. 5A is a vertical cross-sectional view of the exemplary structure after removal of sacrificial support opening fill structures according to an embodiment of the present disclosure.
Figure 5B:
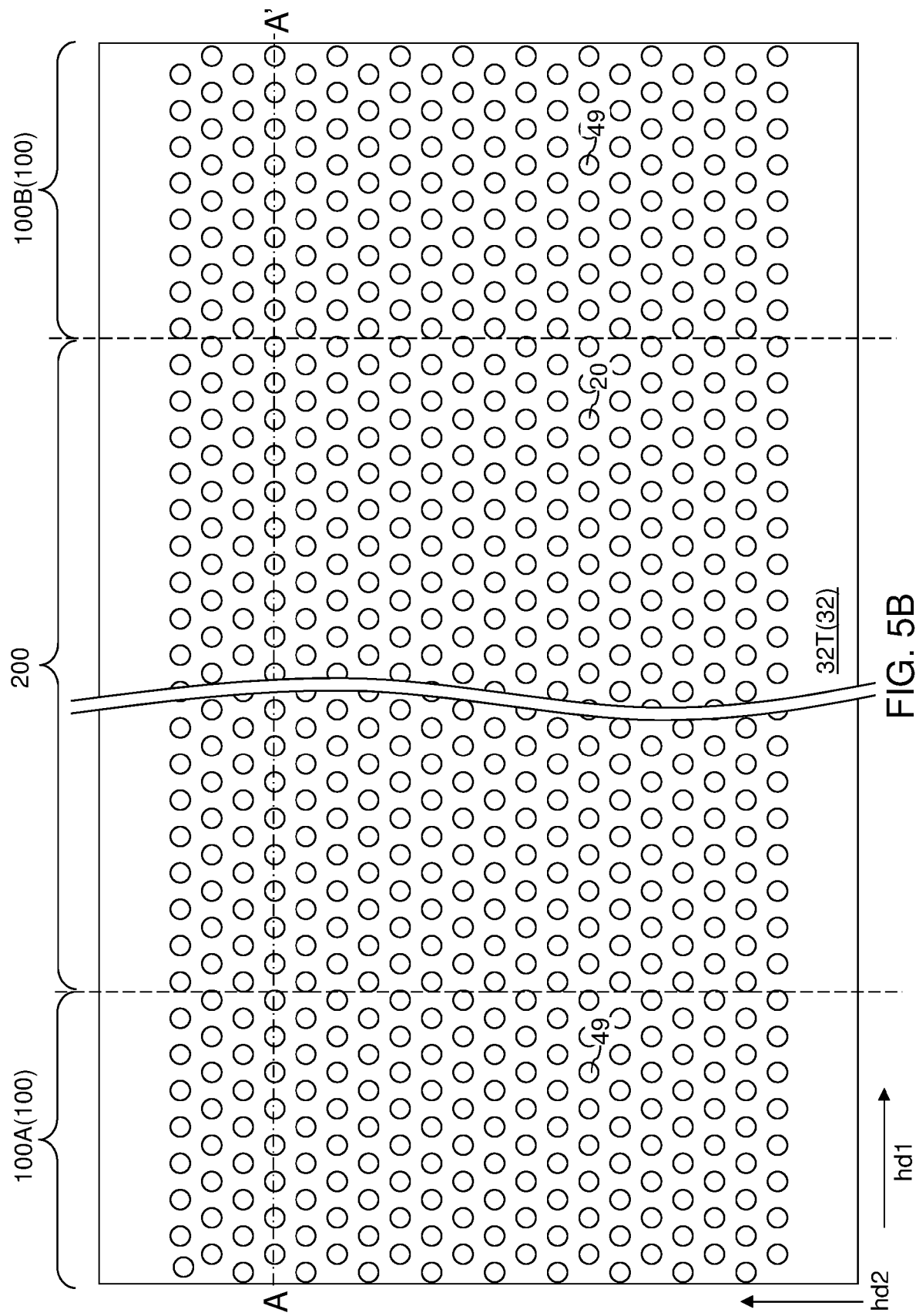
FIG. 5B is a top-down view of the exemplary structure of FIG. 5A. The vertical plane A-A' is the vertical cross-sectional plane of FIG. 5A.

Referring to FIGS. 5A and 5B, the sacrificial fill material of the sacrificial memory opening fill structures 47 can be removed selective to the materials of the insulating layers 32, the sacrificial material layers 42, the semiconductor material layer 10, and the support pillar structures 20. The sacrificial memory opening fill structures 47 may be removed by ashing or by performing an etch process such as a wet etch process. Cavities are formed in volumes from the which the sacrificial memory opening fill structures 47 are removed.

FIGS. 6A-6H is a vertical cross-sectional view of a memory opening during formation of a memory opening fill structure 58. The same structural change occurs simultaneously in each of the other memory openings 49

Referring to FIG. 6A, a memory opening 49 in the exemplary device structure of FIGS. 5A and 5B is illustrated. The memory opening 49 extends through the topmost insulating layer 32 (32T), the alternating stack (32, 42), and optionally into an upper portion of the semiconductor material layer 9. At this processing step, each support opening 19 can extend through the alternating stack (32, 42), and optionally into the upper portion of the semiconductor material layer 9. The recess depth of the bottom surface of each memory opening with respect to the top surface of the semiconductor material layer 9 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 6B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material (e.g., single crystal silicon) in epitaxial alignment with the single crystalline semiconductor material layer 9. In one embodiment, the pedestal channel portion 11 can be doped with electrical dopants of the same conductivity type as the semiconductor material layer 9. In one embodiment, the top surface of each pedestal channel portion 11 can be formed above a horizontal plane including the top surface of at least one bottommost sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in or above the semiconductor material layer 9 and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 9 that the pedestal channel portion contacts.

Referring to FIG. 6C, a stack of layers including an optional blocking dielectric layer 52, a memory material layer 54, a dielectric material liner 56, and an optional sacrificial cover material layer 601 can be sequentially deposited in the memory openings 49 by a respective conformal deposition process.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. In one embodiment, the blocking dielectric layer 52 includes aluminum oxide. In one embodiment, the blocking dielectric layer 52 can include multiple dielectric metal oxide layers having different material compositions. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. The thickness of the blocking dielectric layer 52 can be in a range from 3 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be formed. Generally, the memory material layer 54 may comprise any memory material that can store a data bit. The data bit may be stored in the form of electrical charges trapped therein, in the form of a resistive state of a material due to changes in the material phase, resistivity or ferroelectric property. In one embodiment, the memory material layer 54 may comprise a charge storage layer. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the memory material layer 54 as a plurality of memory material portions that are vertically spaced apart. While the memory material layer 54 is illustrated as a single continuous layer, embodiments are expressly contemplated herein in which the memory material layer 54 is replaced with a plurality of discrete memory material portions (which can be charge trapping material portions or electrically isolated conductive material portions) that are vertically spaced apart. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The dielectric material liner 56 includes a dielectric material. In one embodiment, the dielectric material liner 56 may comprise a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer can include a stack of a first silicon oxide layer, a silicon oxynitride layer, and a second silicon oxide layer, which is commonly known as an ONO stack. In one embodiment, the tunneling dielectric layer can include a silicon oxide layer that is substantially free of carbon or a silicon oxynitride layer that is substantially free of carbon. The thickness of the tunneling dielectric layer can be in a range from 2 nm to 20 nm, although lesser and greater thicknesses can also be employed. Alternatively, a different type of dielectric material layer may be employed as the dielectric material liner 56.

The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 6D, the optional sacrificial cover material layer 601, the dielectric material liner 56, the memory material layer 54, and the blocking dielectric layer 52 overlying the topmost insulating layer 32 (32T) are sequentially anisotropically etched employing at least one anisotropic etch process. The portions of the sacrificial cover material layer 601, the dielectric material liner 56, the memory material layer 54, and the blocking dielectric layer 52 located above the top surface of the topmost insulating layer 32 (32T) can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49' can be removed to form openings in remaining portions thereof. Each of the sacrificial cover material layer 601, the dielectric material liner 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material, a ferroelectric material, a resistive memory material that can provide at least two different levels of resistivity (such as a phase change material), or any other memory material that can store information by a change in state. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 9 in case the pedestal channel portions 11 are not employed) can be physically exposed underneath the opening through the sacrificial cover material layer 601, the dielectric material liner 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 9 in case pedestal channel portions 11 are not employed) by a recess distance. A dielectric material liner 56 is located over the memory material layer 54. A set of a blocking dielectric layer 52, a memory material layer 54, and a dielectric material liner 56 in a memory opening 49 constitutes a memory film 50, which includes a plurality of charge storage regions (comprising portions of the memory material layer 54) that are insulated from surrounding materials by the blocking dielectric layer 52 and the dielectric material liner 56. In one embodiment, the sacrificial cover material layer 601, the dielectric material liner 56, the memory material layer 54, and the blocking dielectric layer 52 can have vertically coincident sidewalls. Optionally, the sacrificial cover material layer 601 can be subsequently removed selective to the material of the dielectric material liner 56. If the sacrificial cover material layer 601 includes amorphous silicon, then a wet etch process employing hot trimethyl-2 hydroxyethyl ammonium hydroxide ("hot TMY") or tetramethyl ammonium hydroxide (TMAH) can be performed to remove the sacrificial cover material layer 601.

Referring to FIG. 6E, a semiconductor channel layer 60L can be deposited directly on the semiconductor surface of the pedestal channel portion 11 or the semiconductor material layer 9 if the pedestal channel portion 11 is omitted, and directly on the dielectric material liner 56 (or on the silicon sacrificial cover material layer 601 if still present). The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art.

In one embodiment, the semiconductor channel layer 60L includes amorphous silicon or polysilicon. The semiconductor channel layer 60L can have a doping of a first conductivity type, which is the same as the conductivity type of the semiconductor material layer 9 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 6F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 6H:
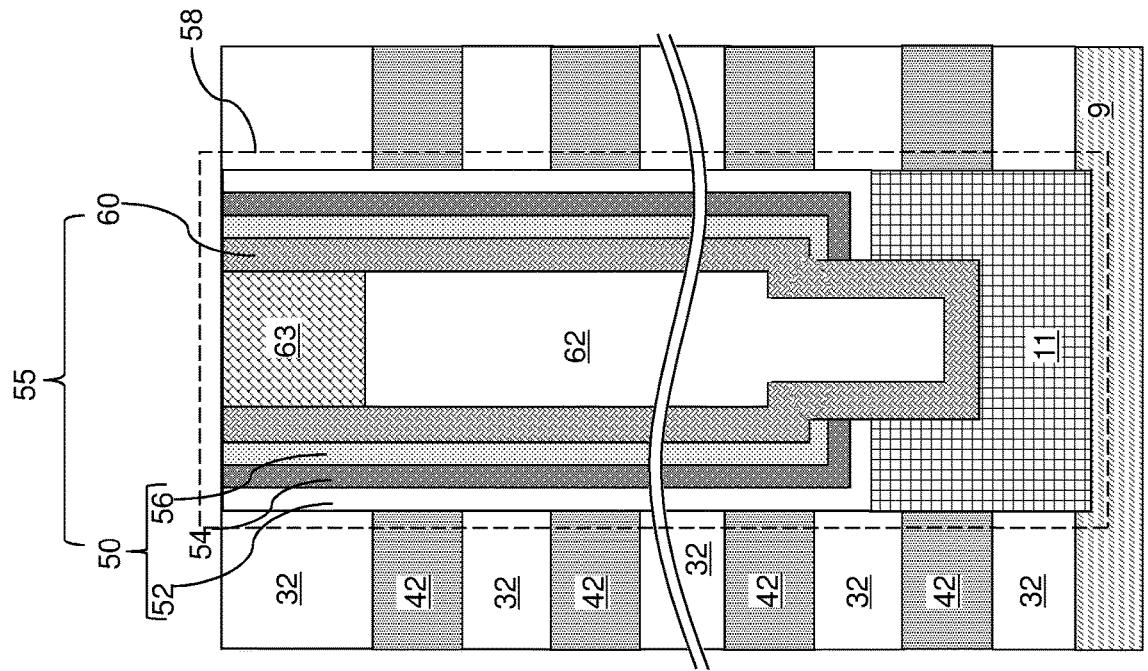
Figure 6G:
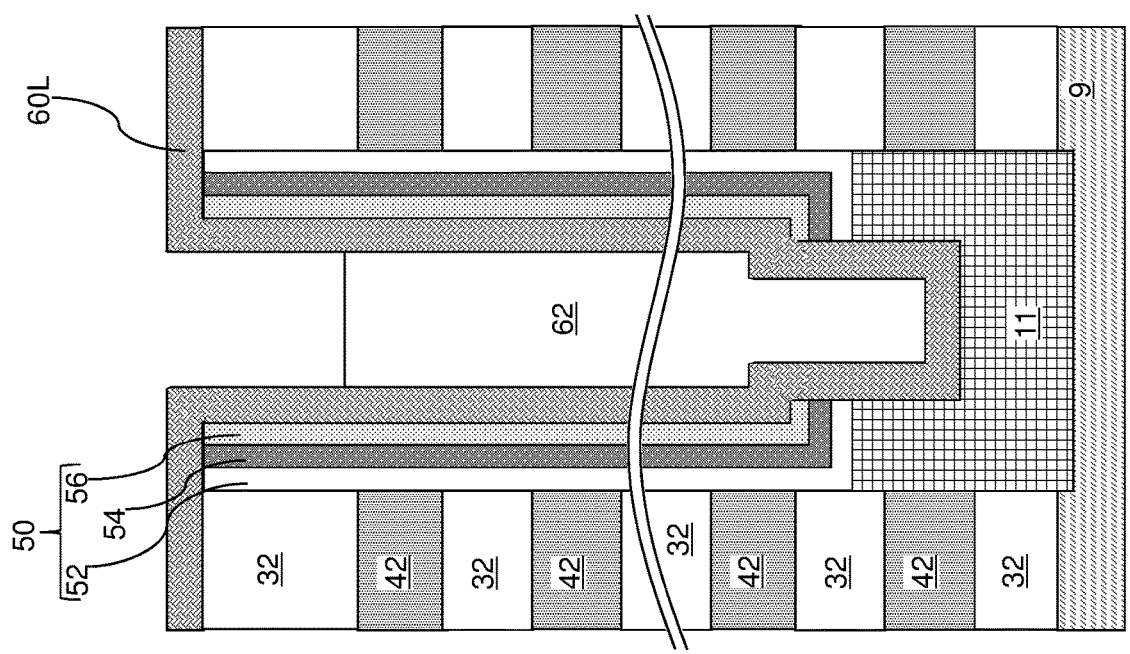

Referring to FIG. 6G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the topmost insulating layer 32 (32T). Each remaining portion of the dielectric core layer 62L constitutes a dielectric core 62.

Referring to FIG. 6H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the topmost insulating layer 32 (32T), for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60. The vertical semiconductor channel 60 is formed directly on the dielectric material liner 56.

A dielectric material liner 56 is surrounded by a memory material layer 54, and laterally surrounds a portion of the vertical semiconductor channel 60. Each adjoining set of a blocking dielectric layer 52, a memory material layer 54, and a dielectric material liner 56 collectively constitute a memory film 50, which can store electrical charges or electrical polarization with a macroscopic retention time. As used herein, a macroscopic retention time refers to a retention time suitable for operation of a memory device as a permanent memory device such as a retention time in excess of 24 hours. In some embodiments, a blocking dielectric layer 52 may not be present in the memory film 50 at this step, and a backside blocking dielectric layer may be subsequently formed after formation of backside recesses.

Each combination of a memory film 50 and a vertical semiconductor channel 60 within a memory opening 49 constitutes a memory stack structure 55. The memory stack structure 55 is a combination of a semiconductor channel, a dielectric material liner, a plurality of memory elements as embodied as portions of the memory material layer 54, and an optional blocking dielectric layer 52. An entire set of material portions that fills a memory opening 49 is herein referred to as a memory opening fill structure 58. An entire set of material portions that fills a support opening 19 constitutes a support pillar structure.

Generally, a memory opening fill structure 58 can be formed in each memory opening 49. The memory opening fill structure 58 comprises an optional blocking dielectric layer 52, a memory material layer 54, an optional dielectric material liner 56, and a vertical semiconductor channel 60. A dielectric material liner 56 may laterally surround the vertical semiconductor channel 60. The memory material layer 54 can laterally surround the dielectric material liner 56.

In case a blocking dielectric layer 52 is present in each memory opening fill structure 58, the blocking dielectric layer 52 may be formed on a sidewall of a memory opening 49, and the vertical stack of memory elements (which may comprise portions of the memory material layer 54) may be formed on the blocking dielectric layer 52. In one embodiment, the vertical stack of memory elements comprises portions of a charge storage layer (comprising the memory material layer 54) located at the levels of the sacrificial material layers 42.

In case a dielectric material liner 56 is present in each memory opening fill structure 58, the dielectric material liner 56 may be formed on the vertical stack of memory elements. In on embodiment, the dielectric material liner 56 may comprise a tunneling dielectric layer. In this case, the vertical semiconductor channel 60 can be formed on the tunneling dielectric layer. The blocking dielectric layer 52 laterally surrounds the charge storage layer and the tunneling dielectric layer can be located between the charge storage layer and the vertical semiconductor channel 60. A vertical NAND string can be formed through each memory opening upon subsequent replacement of the sacrificial material layers 42 with electrically conductive layers.

Referring to FIGS. 7A and 7B, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 5A and 5B. An instance of the support pillar structure 20 can be formed within each support opening 19 of the structure of FIGS. 5A and 5B. Alternative memory stack structures including different layer stacks or structures for the memory film 50 and/or for the vertical semiconductor channel 60 may be used instead.

Figure 8B:
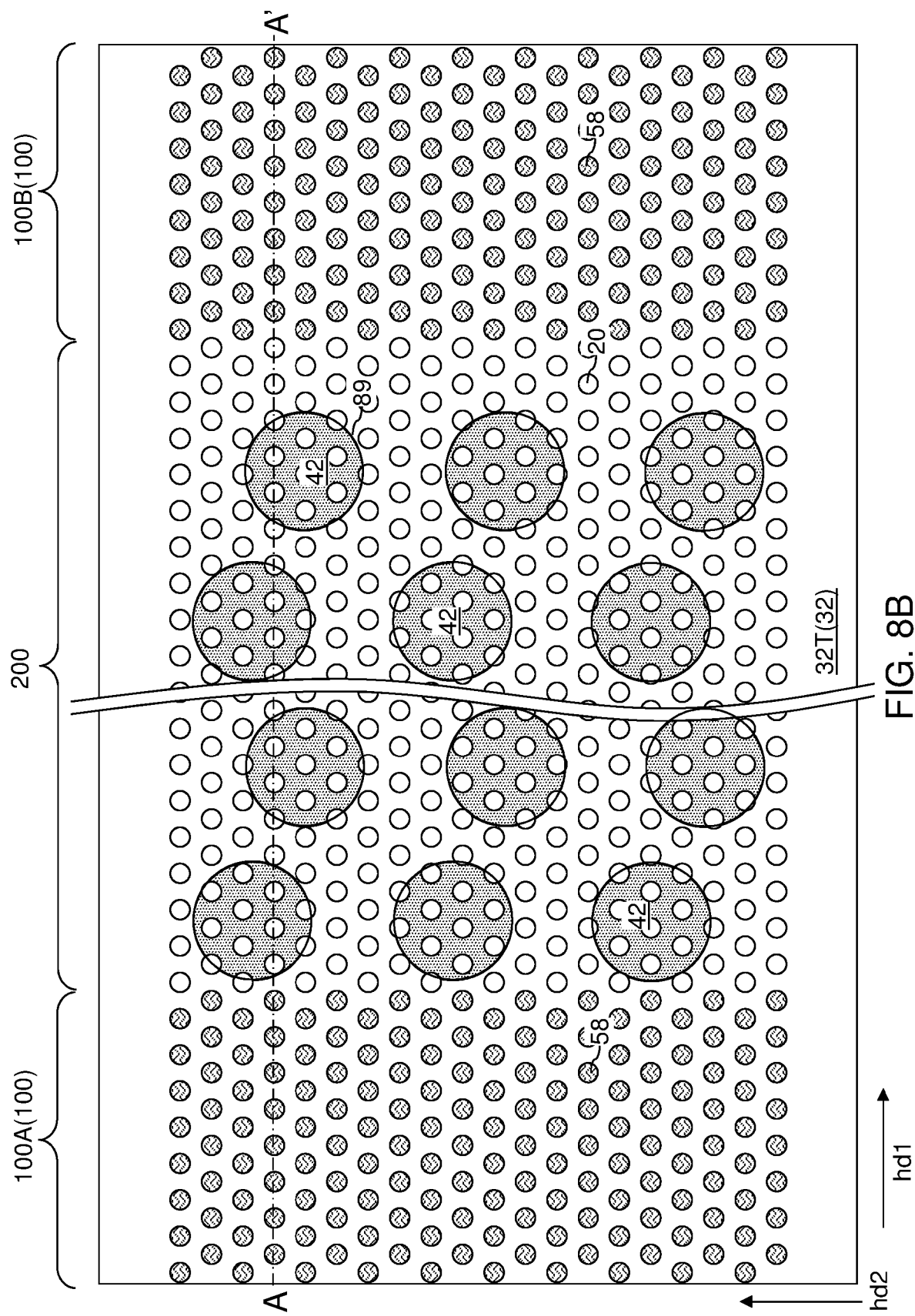
FIG. 8B is a top-down view of the exemplary structure of FIG. 8A. The vertical plane A-A' is the vertical cross-sectional plane of FIG. 8A.

Referring to FIGS. 8A and 8B, contact via cavities 89 having different depths can be formed in the contact region 200. Each of the contact via cavities 89 vertically extends through a respective subset of the layers within the alternating stack (32, 42), and has a respective bottom surface that includes a segment of a respective sacrificial material layer 42. Generally, support pillar structures 20 located within the areas of the contact via cavities 89 can be collaterally recessed during formation of the contact via cavities 89. In one embodiment, a predominant fraction of each support pillar structure 20 located within the areas of the contact via cavities 89 has a recessed surface that are coplanar with, or are substantially coplanar with, a physically exposed segment of a sacrificial material layer 42 that underlies the respective contact via cavity 89.

In one embodiment, each sacrificial material layer 42 that is subsequently replaced with a word-line-level electrically conductive layer (i.e., word line) can be physically exposed to at least one contact via cavity 89. In other words, the contact via cavities 89 can be formed such that each of the sacrificial material layers 42 that are subsequently replaced with a respective word-line-level electrically conductive layer is physically exposed to a set of at least one contact via cavity 89 within the contact region. In one embodiment, one or more topmost sacrificial material layers 42 are subsequently replaced with a drain-select-level electrically conductive layers (i.e., drain select gate electrode), and each of the sacrificial material layers 42 other than the topmost sacrificial material layers 42 may comprise a respective surface segment that is physically exposed underneath a respective one of the contact via cavities 89. Contact via cavities may also be formed to levels of the source select gate electrodes located below the word-line-levels.

Generally, the contact via cavities 89 can be formed using any suitable methods. For illustrative purposes, one embodiment method of forming the contact via cavities 89 is described below.

In one embodiment, a sacrificial etch mask layer (not shown) may be formed over the alternating stack (32, 42). The sacrificial etch mask layer may comprise any etch mask material that can withstand ashing processes that are subsequently employed to remove patterned photoresist material layers. For example, the sacrificial etch mask layer may comprise a dielectric metal oxide material, a metallic material, or a carbon-based material. A high-fidelity photoresist material, such as a deep ultraviolet (DUV) photoresist material, can be applied over the sacrificial etch mask layer, and can be patterned to form openings that define the areas of all contact via cavities 89 to be subsequently formed. An anisotropic etch process can be performed to form openings through the sacrificial etch mask layer. An array of openings are formed through the sacrificial etch mask layer. The high-fidelity photoresist material can be subsequently removed.

A series of block-level photoresist materials, such as mid-ultraviolet (MUV) photoresist materials in combination with a series of anisotropic etch processes can be subsequently employed to sequentially cover a respective subset of the openings in the sacrificial etch mask layer and to extend the pattern of the openings in the sacrificial etch mask layer through a respective number of stacks of an insulating layer 32 and a sacrificial material layer 42. For example, about one half of all of the openings through the sacrificial etch mask layer can be covered by a first block-level photoresist layer, and one insulating layer 32 and one sacrificial material layer 42 can be etched by performing an anisotropic etch process underneath the openings through the unmasked portions of the sacrificial material layer. Any unmasked portion of the support pillar structures 20 may be collaterally etched by selecting the etch chemistry of the various etch steps of an anisotropic etch process such that the overall etch rate for the material of the support pillar structures 20 matches the overall etch rate for a combination of an insulating layers 32 and a sacrificial material layer 42. The first block-level photoresist layer can be subsequently removed. About one half of all of the openings through the sacrificial etch mask layer can be covered by a second block-level photoresist layer. About one half of the unmasked openings are among the openings previously covered by the first block-level photoresist layer, and the remainder of the unmasked openings are among the openings previously masked by the first block-level photoresist layer. Two pairs of an insulating layer 32 and a sacrificial material layer 42 (i.e., two insulating layers 32 and two sacrificial material layers 42) can be etched by performing an anisotropic etch process underneath the openings through the unmasked portions of the sacrificial material layer. Any unmasked portion of the support pillar structures 20 may be collaterally etched by selecting the etch chemistry of the various etch steps of an anisotropic etch process such that the overall etch rate for the material of the support pillar structures 20 matches the overall etch rate for a combination of an insulating layers 32 and a sacrificial material layer 42. The second block-level photoresist layer can be subsequently removed. The above scheme can be repeated up to the N-th block-level photoresist layer and an N-th anisotropic etch process etching $2^{(N-1)}$ pairs of an insulating layer 32 and a sacrificial material layer 42 are employed. A terminal anisotropic etch process may be performed in the absence of any block-level photoresist layer, for example, to etch through unmasked portions of a respective set of two insulating layers 32 and a sacrificial material layer 42 that underlies any opening through the sacrificial etch mask layer.

Contact via cavities 89 having $2^N$ different depths can be formed in the contact region 200. In an illustrative example, if N is 8, the total number of sacrificial material layers 42 may be $2^8+M$, which corresponds to 256 word-line-level sacrificial material layers and M source- and drain-select-level sacrificial material layers. While the present disclosure is described for a case in which M is 2, embodiments are expressly contemplated herein in which M may be in integer greater than 2. The sacrificial etch mask layer can be subsequently removed, for example, by ashing or by performing an etch process that removes the material of the sacrificial etch mask layer selective to the materials of the alternating stack (32, 42).

Figure 9B:
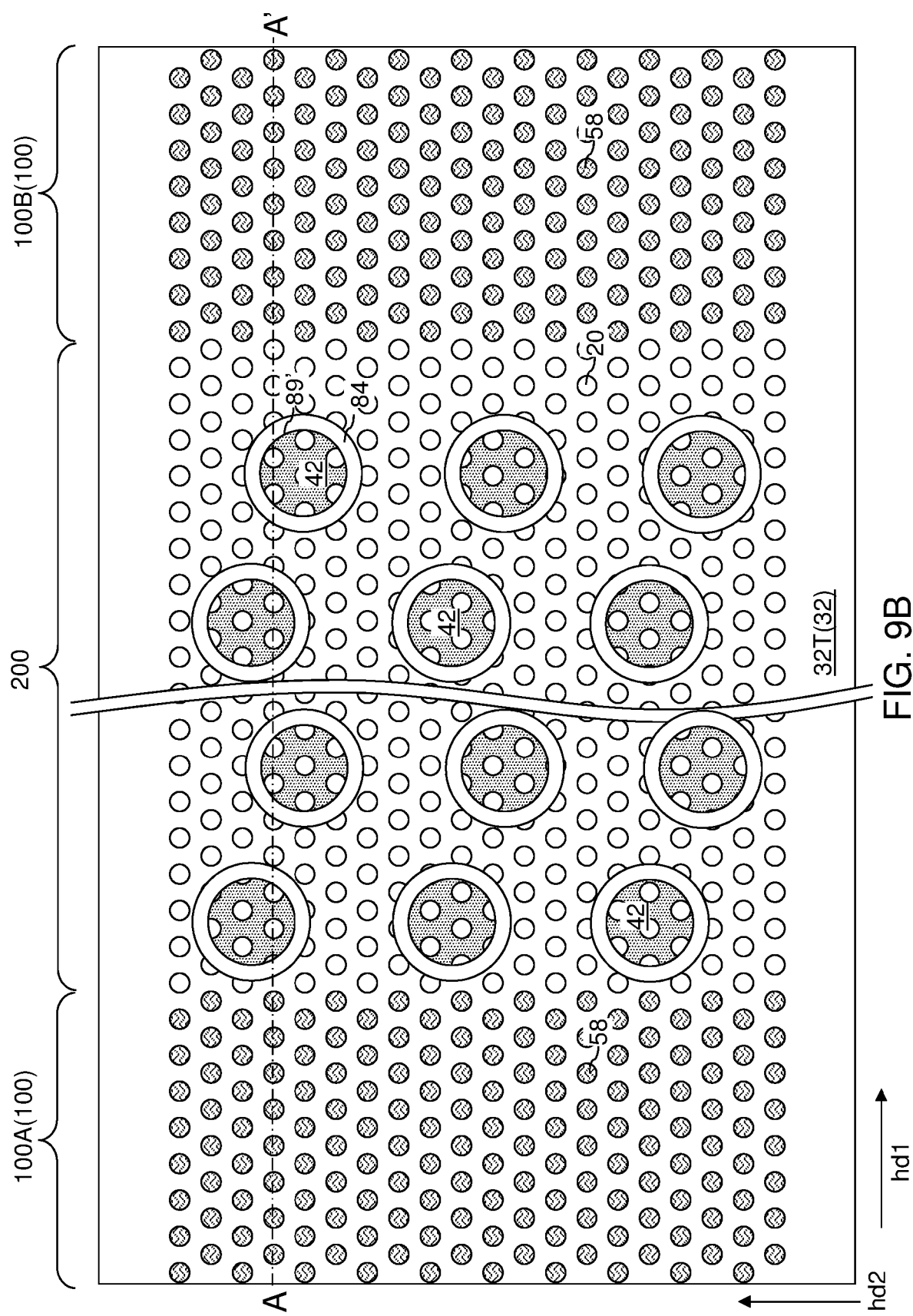
FIG. 9B is a top-down view of the exemplary structure of FIG. 9A. The vertical plane A-A' is the vertical cross-sectional plane of FIG. 9A.

Referring to FIGS. 9A and 9B, an insulating material layer may be conformally deposited over the physically exposed surfaces of the contact via cavities 89 and over the alternating stack (32, 42). The insulating material layer includes an insulating material such as undoped silicate glass (i.e., silicon oxide) or a doped silicate glass. The thickness of the insulating material layer may be in a range from 10 nm to 100 nm, although lesser and greater thicknesses may also be employed. An anisotropic etch process (i.e., a sidewall spacer etch process) can be performed to remove horizontally-extending portions of the insulating material layer at the bottom of each contact via cavity 89 and from above the alternating stack (32, 42). Each remaining portion of the insulating material layer comprises an insulating spacer having a tubular configuration, and is herein referred to as a tubular insulating spacer 84. A void 89' is present within each unfilled volume of the contact via cavities 89.

Figure 10B:
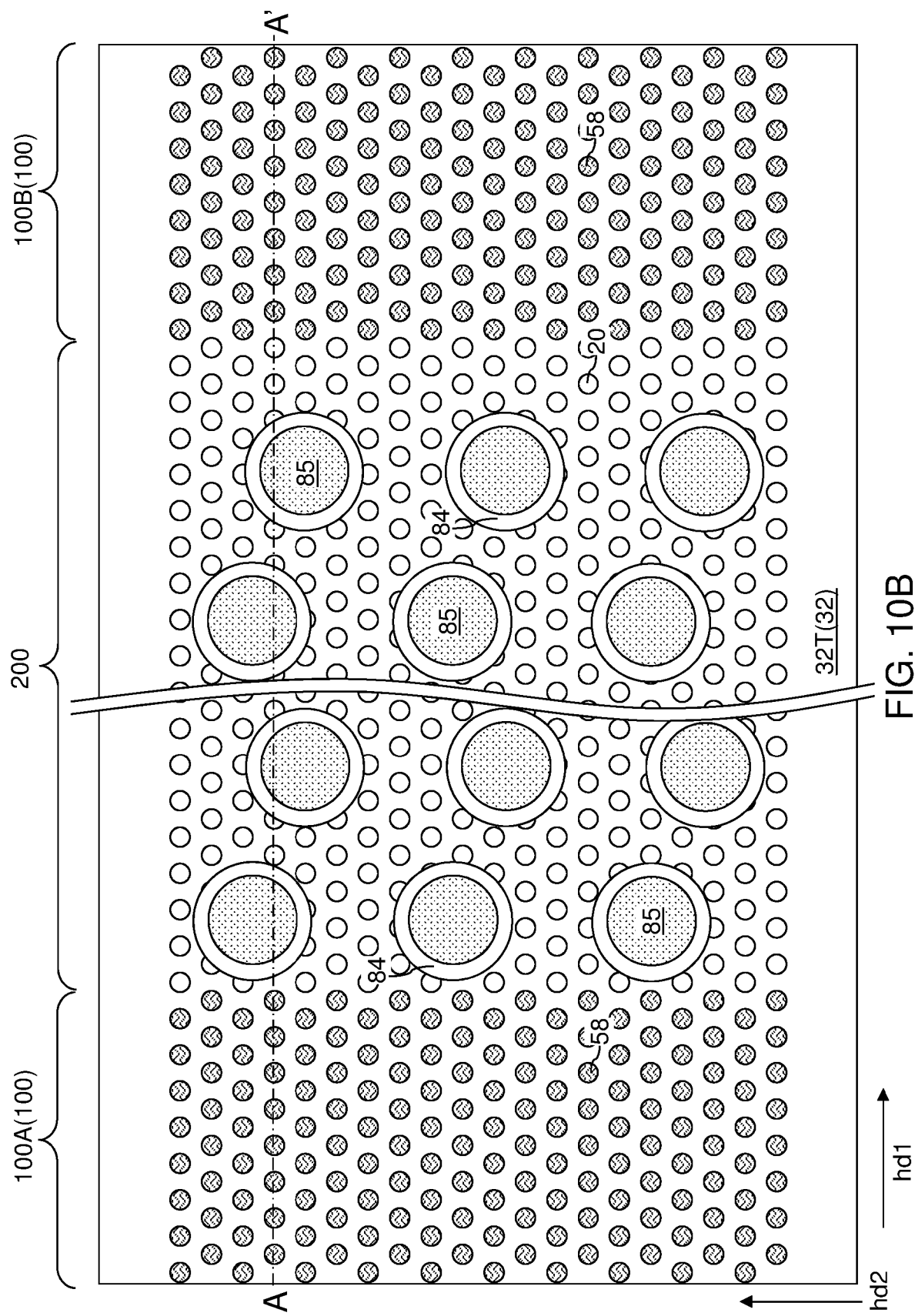
FIG. 10B is a top-down view of the exemplary structure of FIG. 10A. The vertical plane A-A' is the vertical cross-sectional plane of FIG. 10A.

Referring to FIGS. 10A and 10B, a sacrificial fill material can be deposited in the voids 89' within the contact via cavities 89. The sacrificial fill material comprises a material that can be subsequently removed selective to materials of the tubular insulating spacers 84, the insulating layers 32, and the support pillar structures 20. For example, the sacrificial fill material may comprise a carbon-based material such as amorphous carbon or diamond-like carbon, a semiconductor material such as amorphous silicon, polysilicon, or a silicon-germanium alloy, or a dielectric material such as borosilicate glass or organosilicate glass. Excess potions of the sacrificial fill material may be removed from above the horizontal plane including the top surface of the alternating stack employing a planarization process. The planarization process may comprise a recess etch process or a chemical mechanical polishing process. Each remaining portion of the sacrificial fill material constitutes a sacrificial via structure 85.

Each contiguous combination of a tubular insulating spacer 84 and a sacrificial via structure 85 is herein referred to as an in-process laterally-insulated contact via assembly (84, 85). The in-process laterally-insulated contact via assemblies (84, 85) are formed in the contact region 200 through a respective subset of layers within the alternating stack (32, 42) and directly on a top surface of a respective one of the sacrificial material layers 42 within the alternating stack (32, 42). Each of the in-process laterally-insulated contact via assemblies (84, 85) comprises a respective tubular insulating spacer 84 and a respective sacrificial via structure 85. Each of the in-process laterally-insulated contact via assemblies (84, 85) may be referred to as a first in-process laterally-insulated contact via assembly (84, 85), a second in-process laterally-insulated contact via assembly (84, 85), etc. The first in-process laterally-insulated contact via assembly (84, 85) comprises combination of a first tubular insulating spacer 84 and a first sacrificial via structure 85, the second in-process laterally-insulated contact via assembly (84, 85) comprises combination of a second tubular insulating spacer 84 and a second sacrificial via structure 85, etc.

Generally, the memory stack structures 55 are located within a memory array region 100, and the in-process laterally-insulated contact via assemblies (84, 85) are located in a contact region 200 that is laterally offset from the memory array region 100. In one embodiment, the contact region 200 may be free of any memory stack structures 55. Instead, support pillar structures 20 comprising, and/or consisting essentially of, a dielectric material can be located within the contact region 200. The support pillar structures 20 can contact a substrate including the semiconductor material layer 9, and can extend through at least a bottommost insulating layer 32 within the alternating stack (32, 42). In one embodiment, a subset of the support pillar structures 20 may have a topmost recessed surface that contacts a bottom surface of a respective one of the in-process laterally-insulated contact via assemblies (84, 85).

In one embodiment, the in-process laterally-insulated contact via assemblies (84, 85) may comprise a first in-process laterally-insulated contact via assembly (84, 85) that contacts a top surface of each support pillar structure 20 within a first subset of the support pillar structures 20. Each support pillar structure 20 within the first subset of the support pillar structures 20 vertically extends through at least one sacrificial material layer 42 including, for example, a first sacrificial material layer 42 that is in contact with the bottom surface of the first in-process laterally-insulated contact via assembly (84, 85). Further, each support pillar structure 20 within the first subset of the support pillar structures 20 may vertically extend through each layer within the alternating stack (32, 42) that underlies the first sacrificial material layer 42.

Figure 11A:
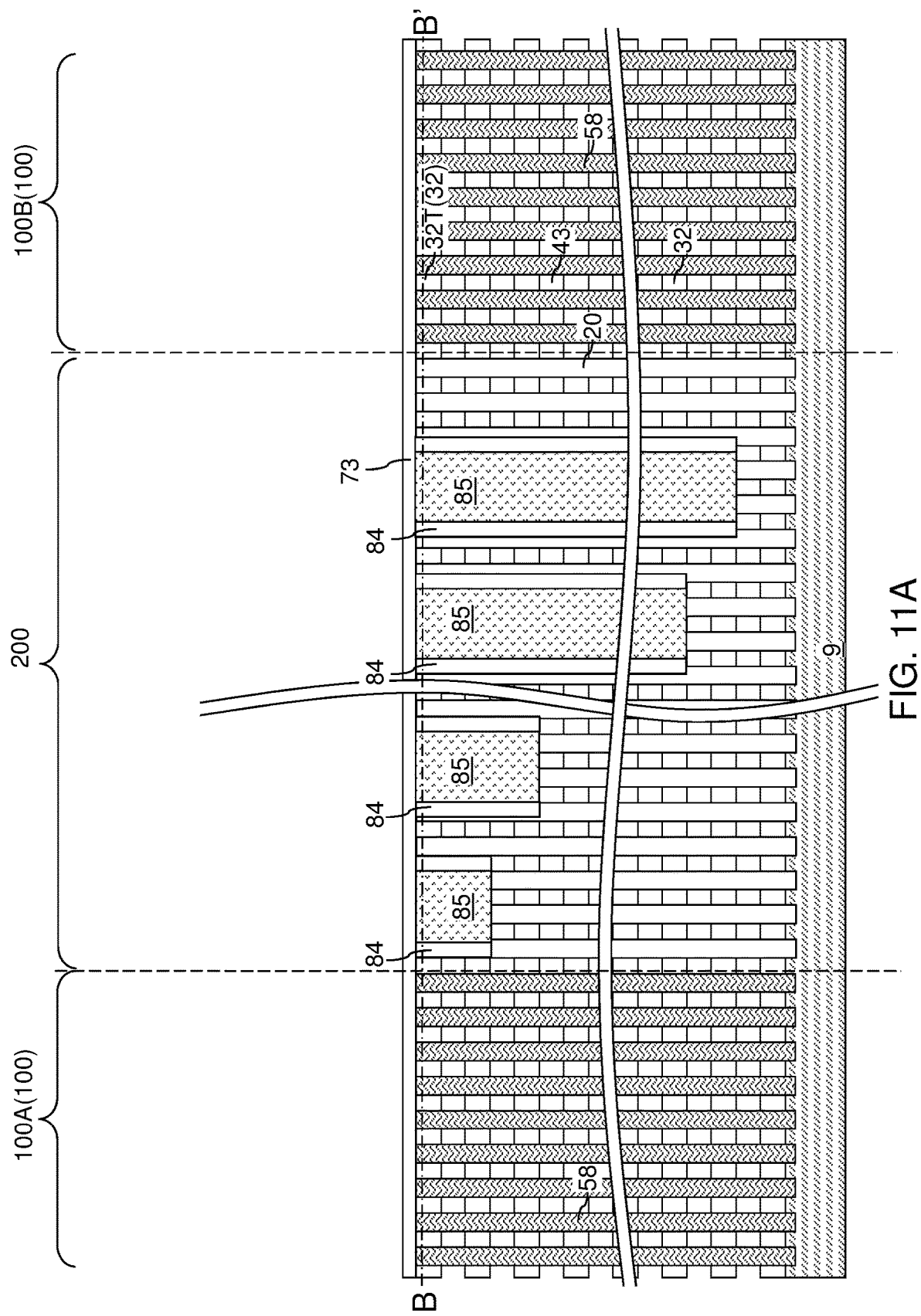
FIG. 11A is a vertical cross-sectional view of the exemplary structure after formation of backside trenches and backside recesses according to an embodiment of the present disclosure.
Figure 11B:
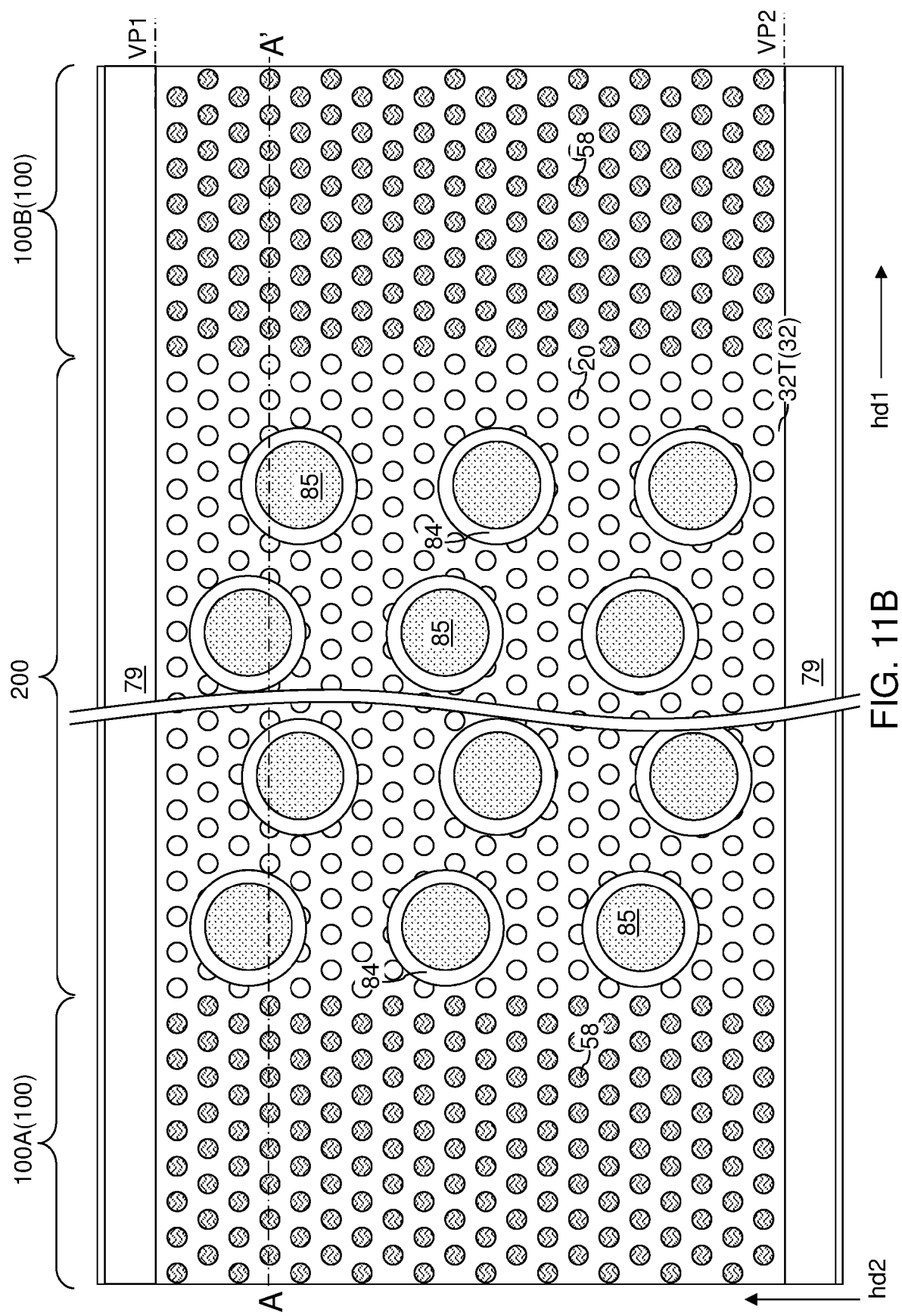
FIG. 11B is a horizontal cross-sectional of the exemplary structure of FIG. 11A along the horizontal plane B-B' of FIG. 11A. The vertical plane A-A' is the vertical cross-sectional plane of FIG. 11A.
Figure 12A:
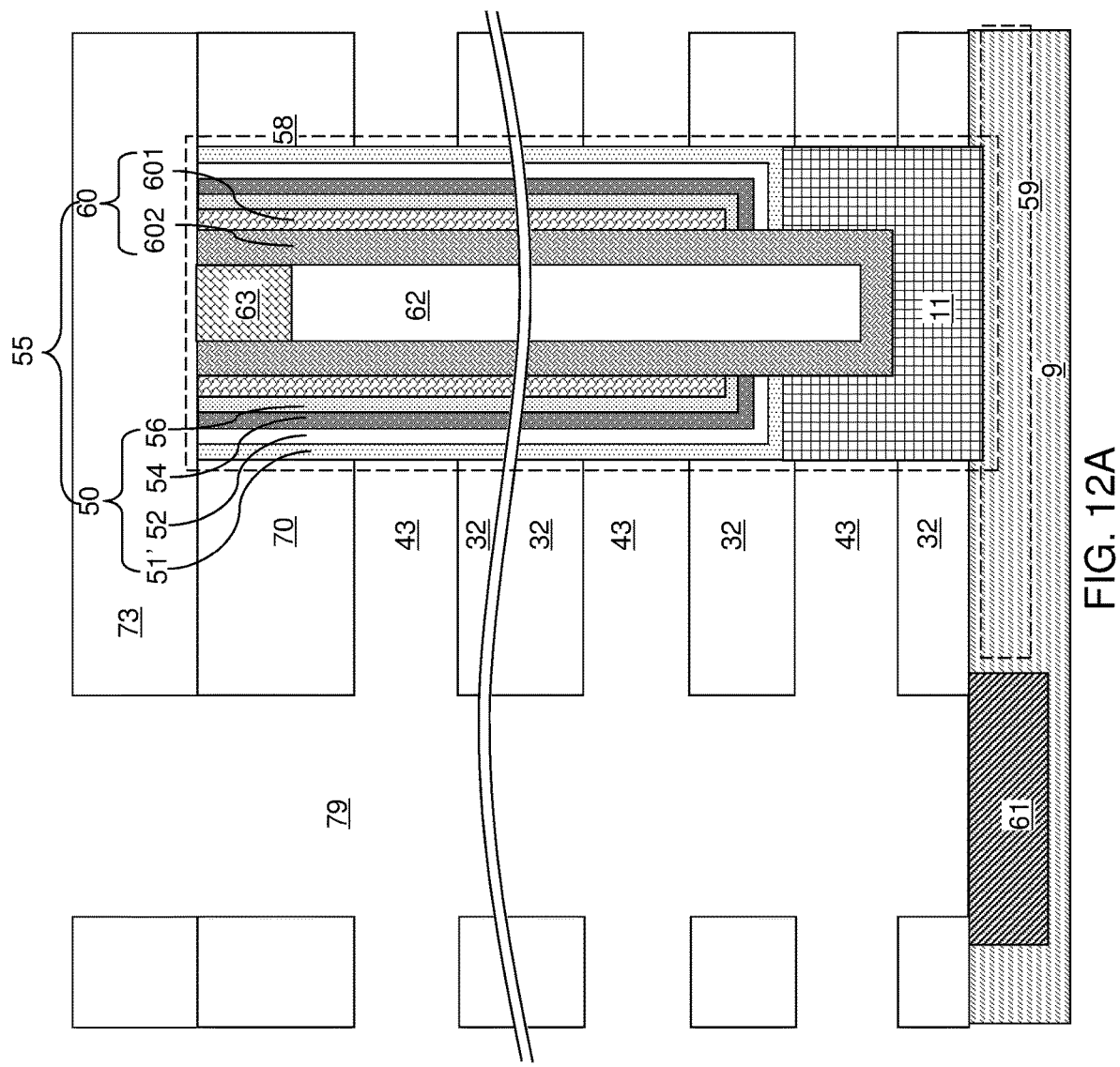
FIGS. 12A-12E are sequential vertical cross-sectional views of a region of the exemplary structure during formation of electrically conductive layers

Referring to FIGS. 11A, 11B, and 12A, a sacrificial capping material layer 73 may be formed over the alternating stack (32, 42). The sacrificial capping material layer 73 comprises a sacrificial material that protects the memory opening fill structures 58 during subsequent processing steps and then removed, for example, by performing a recess etch process. For example, the sacrificial capping material layer 73 may comprise a silicon oxide layer having a thickness in a range from 30 nm to 300 nm, although lesser and greater thicknesses may also be employed.

A photoresist layer (not shown) can be applied over the sacrificial capping material layer 73, and is lithographically patterned to form openings in areas between clusters of memory opening fill structures 58. In one embodiment, the opening may comprise elongated openings that laterally extend along the first horizontal direction hd1 and having a respective uniform width. The pattern in the photoresist layer can be transferred through the sacrificial capping material layer 73 and the alternating stack (32, 42) employing an anisotropic etch to form backside trenches 79, which vertically extend from the top surface of the sacrificial capping material layer 73 at least to the top surface of the substrate (9, 10), and laterally extend through the memory array regions 100 and the contact region 200 along the first horizontal direction hd1.

In one embodiment, the backside trenches 79 can laterally extend along the first horizontal direction hd1 and can be laterally spaced apart from each other along the second horizontal direction hd2 that is perpendicular to the first horizontal direction hd1. The memory stack structures 55 can be arranged in rows that extend along the first horizontal direction hd1. Each backside trench 79 can have a uniform width that is invariant along the lengthwise direction (i.e., along the first horizontal direction hd1). Multiple rows of memory stack structures 55 can be located between a neighboring pair of backside trenches 79. In one embodiment, the backside trenches 79 can include source contact openings in which a source contact via structure can be subsequently formed. First sidewalls of each layer within the alternating stack (32, 42) may be formed within a first vertical plane VP1, which may laterally extend along the first horizontal direction hd1. Second sidewalls of each layer within the alternating stack (32, 42) may be formed within a second vertical plane VP2, which may laterally extend along the first horizontal direction hd1.

A source region 61 can be formed at a surface portion of the semiconductor material layer 9 under each backside trench 79 by implantation of electrical dopants into physically exposed surface portions of the semiconductor material layer 9. An upper portion of the semiconductor material layer 9 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11.

An etchant that selectively etches the second material of the sacrificial material layers 42 with respect to the first material of the insulating layers 32 can be introduced into the backside trenches 79, for example, employing an isotropic etch process. Backside recesses 43 are formed in volumes from which the sacrificial material layers 42 are removed. The removal of the second material of the sacrificial material layers 42 can be selective to the first material of the insulating layers 32, the semiconductor material of the semiconductor material layer 9, and the material of the outermost layer of the memory films 50. In one embodiment, the sacrificial material layers 42 can include silicon nitride, and the materials of the insulating layers 32 be selected from silicon oxide or dielectric metal oxide.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of three-dimensional NAND strings having a plurality of device levels disposed above the substrate (e.g., layer 9). In this case, each backside recess 43 can define a space for receiving a respective word line or select gate electrode of the array of three-dimensional NAND strings.

Each of the plurality of backside recesses 43 can extend substantially parallel to the top surface of the semiconductor material layer 9. A backside recess 43 can be vertically bounded by a top surface of an underlying insulating layer 32 and a bottom surface of an overlying insulating layer 32. In one embodiment, each backside recess 43 can have a uniform height throughout. The photoresist layer can be removed, for example, by ashing.

Figure 12B:
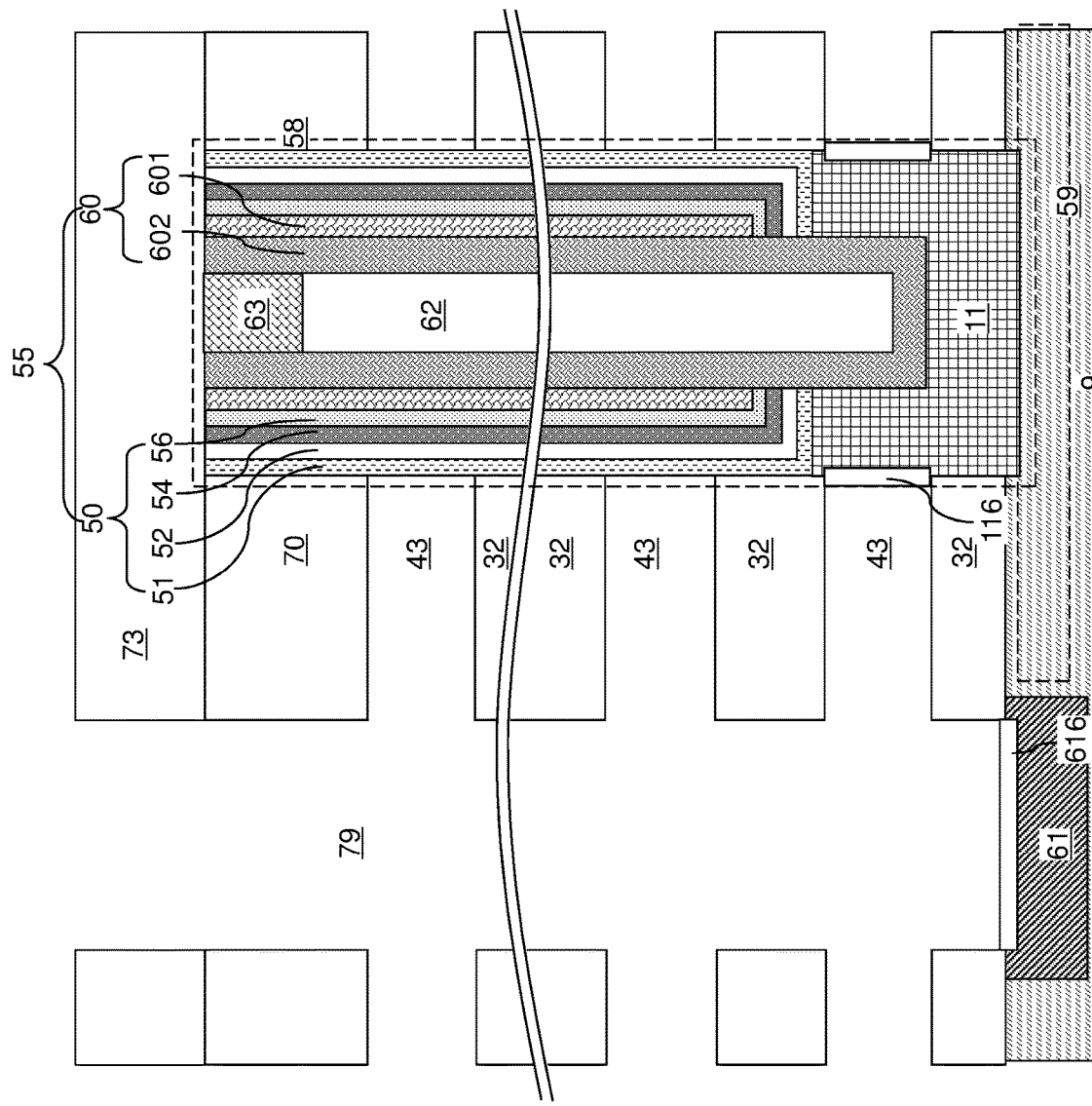

Referring to FIG. 12B, physically exposed surface portions of the optional pedestal channel portions 11 and the semiconductor material layer 9 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 9 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 9.

Figure 12C:
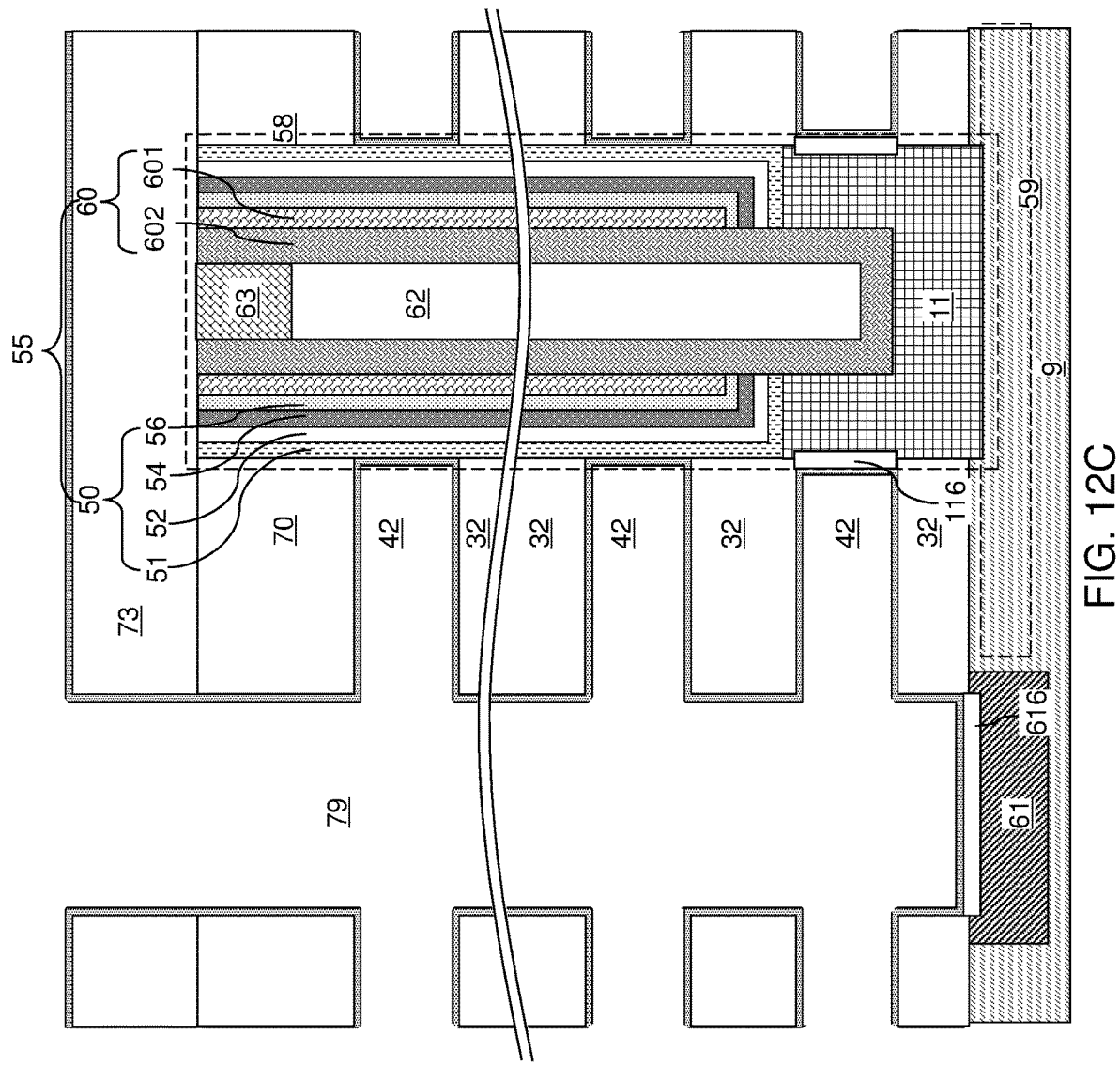

Referring to FIG. 12C, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity is present within the portion of each backside trench 79 that is not filled with the backside blocking dielectric layer 44.

Figure 12D:
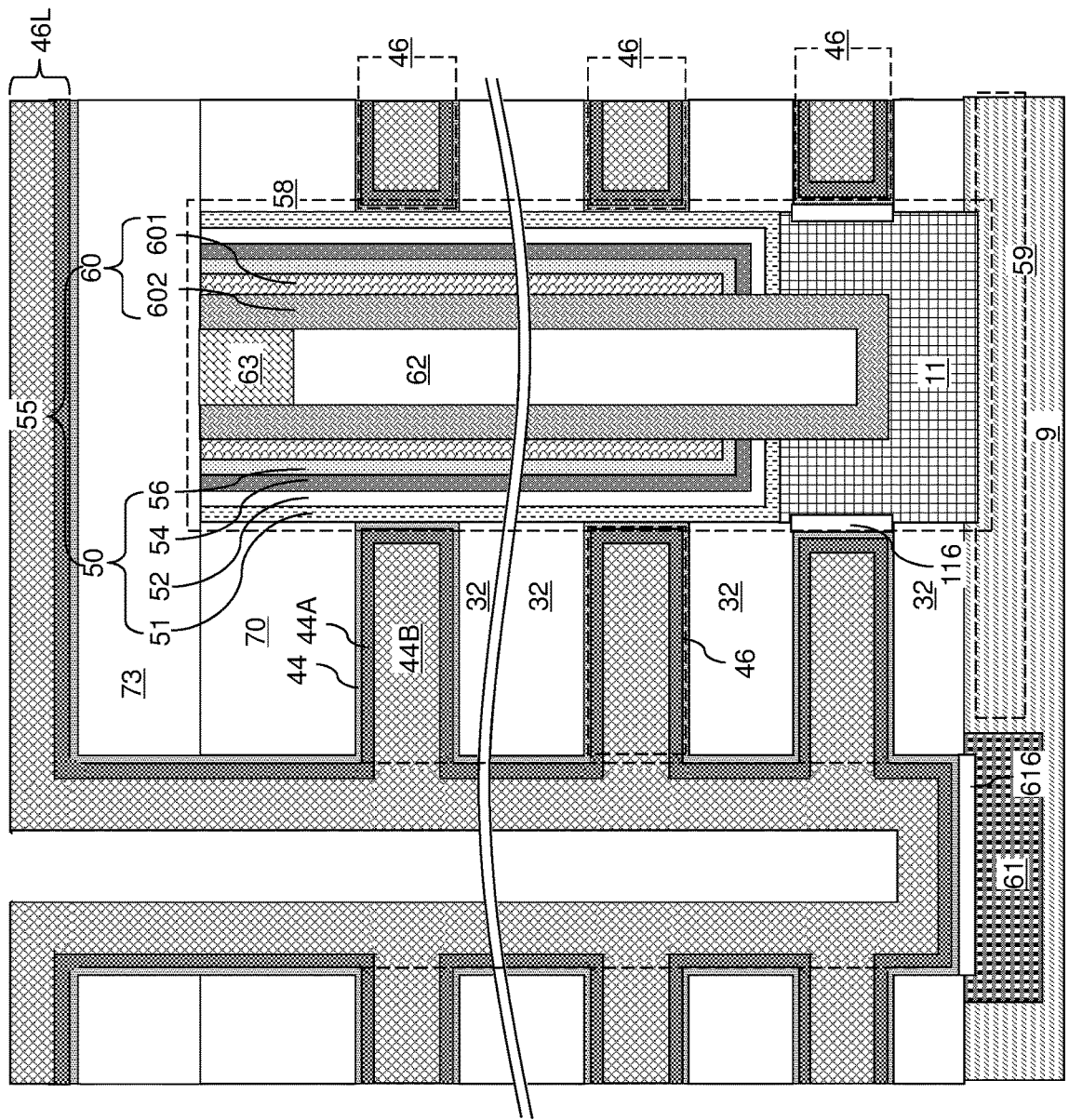

Referring to FIG. 12D, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the sacrificial capping material layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the sacrificial capping material layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the sacrificial capping material layer 73.

Each sacrificial material layer 42 can be replaced with an electrically conductive layer 46. A backside cavity is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 12E:
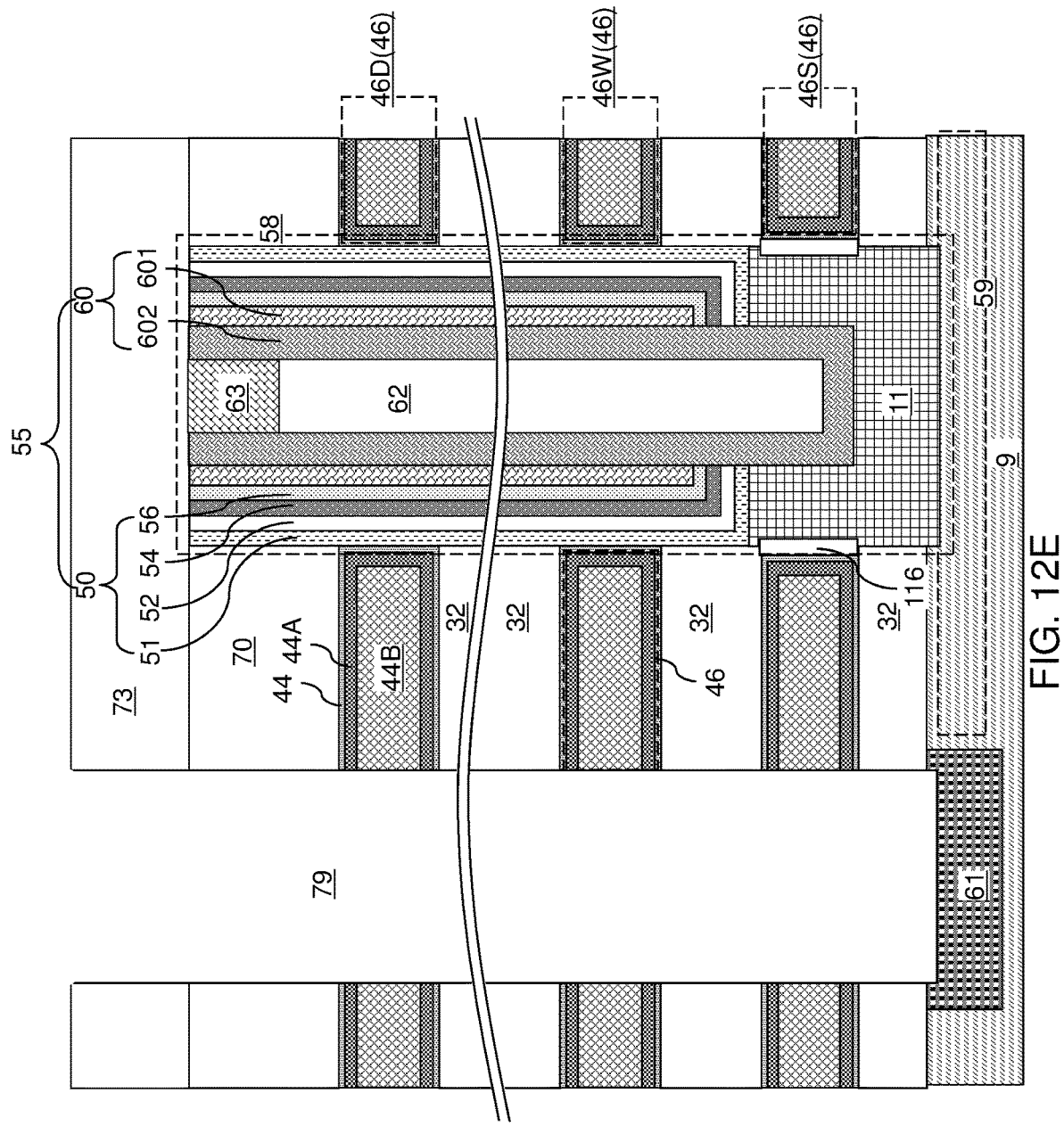
Figure 13B:
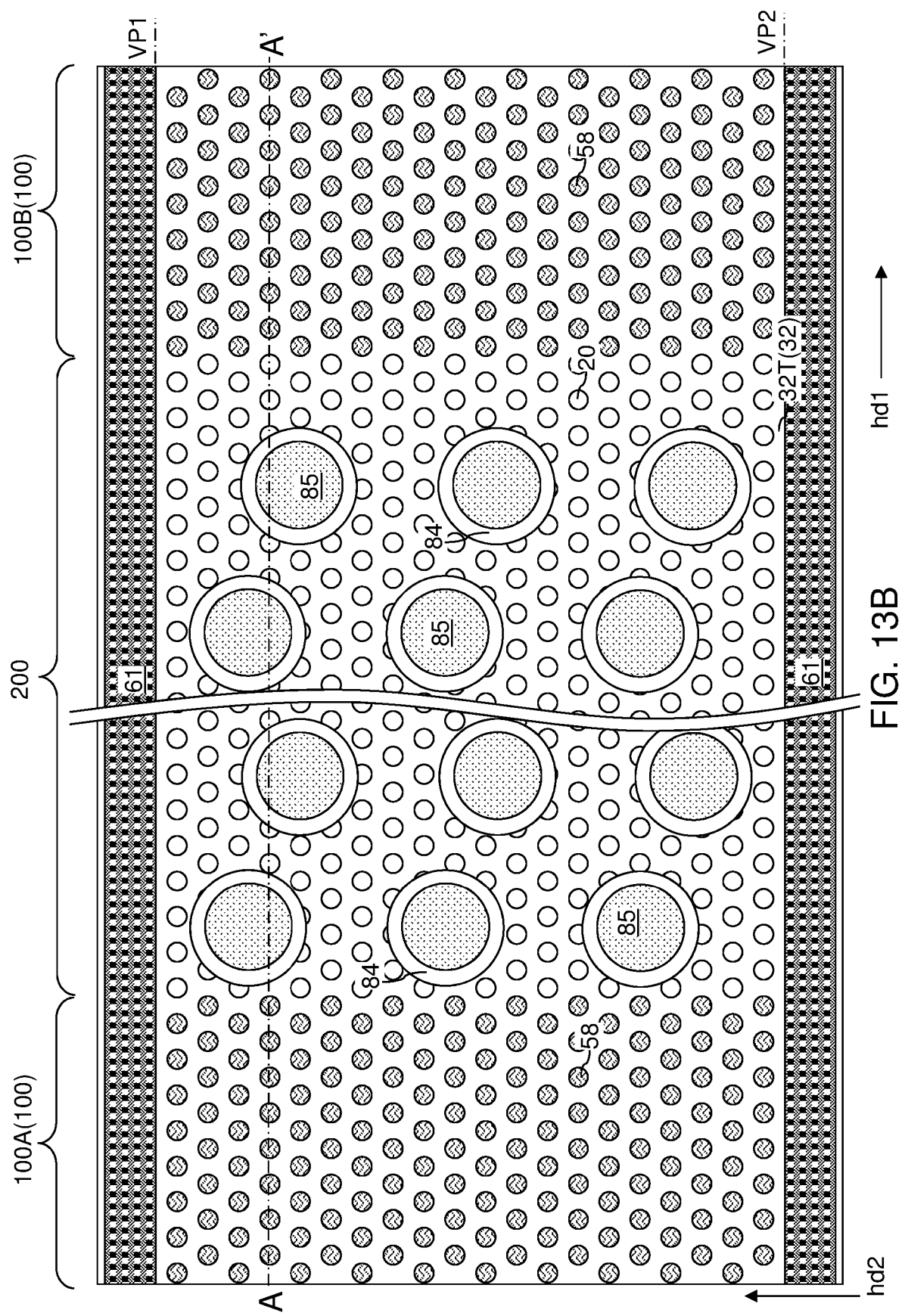
FIG. 13B is a top-down view of the exemplary structure of FIG. 13A. The vertical plane A-A' is the vertical cross-sectional plane of FIG. 13A.

Referring to FIGS. 12E, 13A, and 13B, the deposited metallic material of the continuous electrically conductive material layer 46L is etched back from the sidewalls of each backside trench 79 and from above the sacrificial capping material layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

The middle electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. At least one topmost electrically conductive layer 46 comprises a drain select gate electrode 46S. At least one bottommost electrically conductive layer 46 comprises a source select gate electrode 46D.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity is present within each backside trench 79. The sacrificial capping material layer 73 may optionally be removed during the above described steps.

Each source region 61 is formed in an upper portion of the semiconductor material layer 9. Semiconductor channels (59, 11, 60) extend between each source region 61 and a respective set of drain regions 63. The semiconductor channels (59, 11, 60) include the vertical semiconductor channels 60 of the memory stack structures 55.

According to an aspect of the present disclosure, at least one topmost electrically conductive layer 46 comprises the drain select gate electrode 46D, which is employed to activate or deactivate a respective group of memory stack structures 55 between a pair of backside trenches 79. All other electrically conductive layers 46 located between the source select gate electrode 46S and the at least one drain select gate electrode 46D comprise word lines 46W. While the figures illustrate an embodiment in which a single drain select gate electrode 46D is formed, embodiments are expressly contemplated herein in which a plurality of drain select gate electrodes 46D are formed. Generally, the sacrificial material layers 42 are replaced with electrically conductive layers 46 such that the electrically conductive layers 46 comprise word lines 46W and at least one drain select gate electrode 46D that overlies the word lines 46W.

Figure 14B:
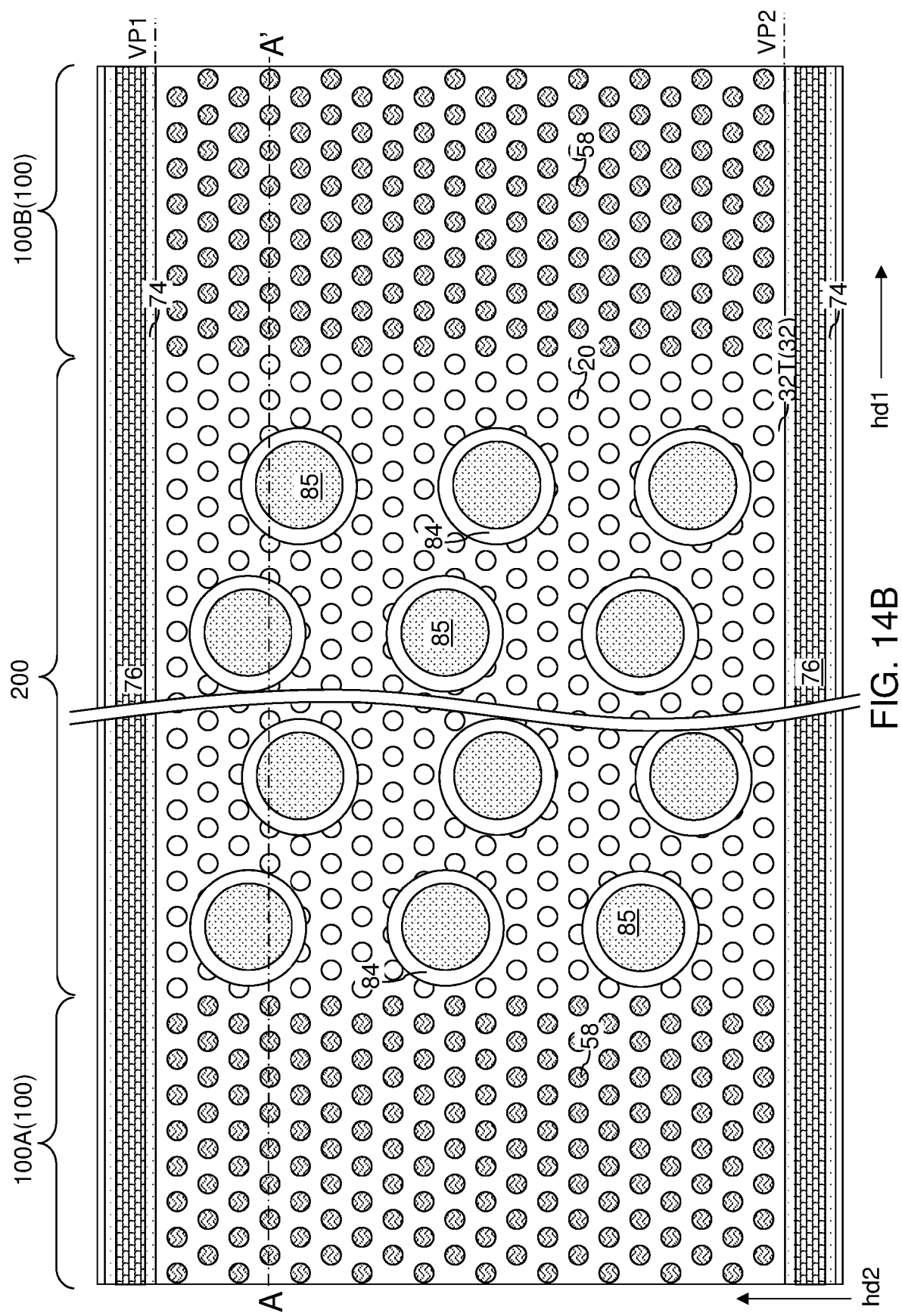
FIG. 14B is a top-down view of the exemplary structure of FIG. 14A. The vertical plane A-A' is the vertical cross-sectional plane of FIG. 14A.

Referring to FIGS. 14A and 14B, an insulating material layer can be formed in the backside trenches 79 and over the sacrificial capping material layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the sacrificial capping material layer 73 and at the bottom of each backside trench 79. Each remaining portion of the insulating material layer constitutes an insulating spacer 74. A backside cavity is present within a volume surrounded by each insulating spacer 74. A top surface of the source region 61 can be physically exposed at the bottom of each backside trench 79.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the topmost insulating layer 32T as a stopping layer. If chemical mechanical planarization (CMP) process is employed, the topmost insulating layer 32T can be employed as a CMP stopping layer. Each remaining continuous portion of the at least one conductive material in the backside trenches 79 constitutes a backside contact via structure 76. The backside contact via structures 76 extends through the alternating stack (32, 46), and contacts a top surface of a respective source region 61. Each contiguous combination of an insulating spacer 74 and a backside contact via structure 76 constitutes a backside trench fill structure (74, 76).

The exemplary structure includes an alternating stack of insulating layers 32 and electrically conductive layers 46 that is located over a substrate. The alternating stack (32, 46) is laterally bounded by a first backside trench fill structure (74, 76) and a second backside trench fill structure (74, 76) that are located within a first backside trench 79 and a second backside trench 79, respectively. The electrically conductive layers 46 comprise word lines 46W and one or more source and drain select gate electrodes (46S, 46D). Memory stack structures 55 vertically extend through the alternating stack (32, 46).

Alternatively, at least one dielectric material, such as silicon oxide, may be conformally deposited in the backside trenches 79 by a conformal deposition process. Each portion of the deposited dielectric material that fills a backside trench 79 constitutes a backside trench fill structure. In this case, each backside trench fill structure may fill the entire volume of a backside trench 79 and may consist essentially of at least one dielectric material. In this alternative embodiment, the source region 61 may be omitted, and a horizontal source line (e.g., direct strap contact) may contact an side of the lower portion of the semiconductor channel 60.

Figure 15B:
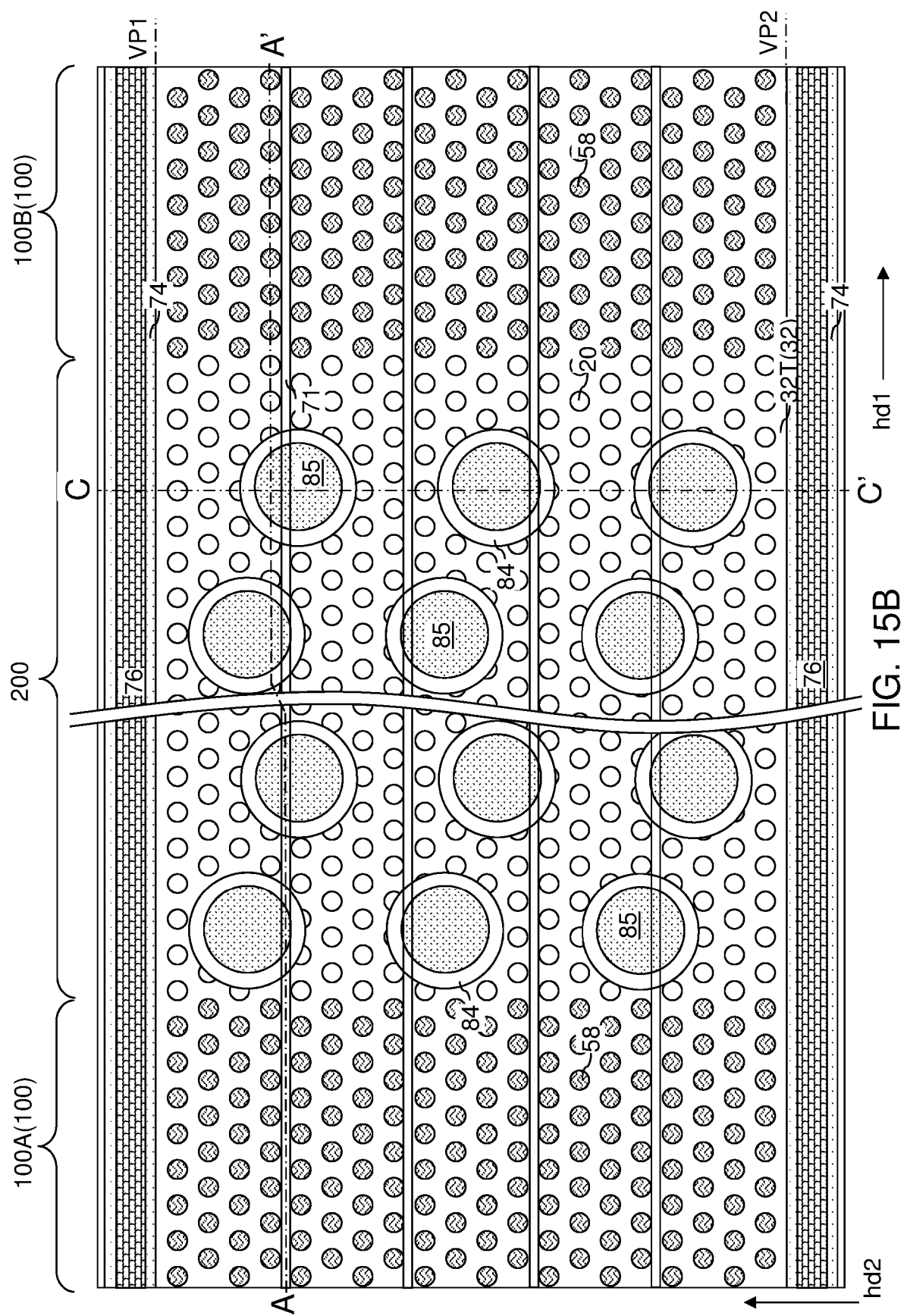
FIG. 15B is a top-down view of the exemplary structure of FIG. 15A. The vertical plane A-A' is the vertical cross-sectional plane of FIG. 15A.
Figure 15C:
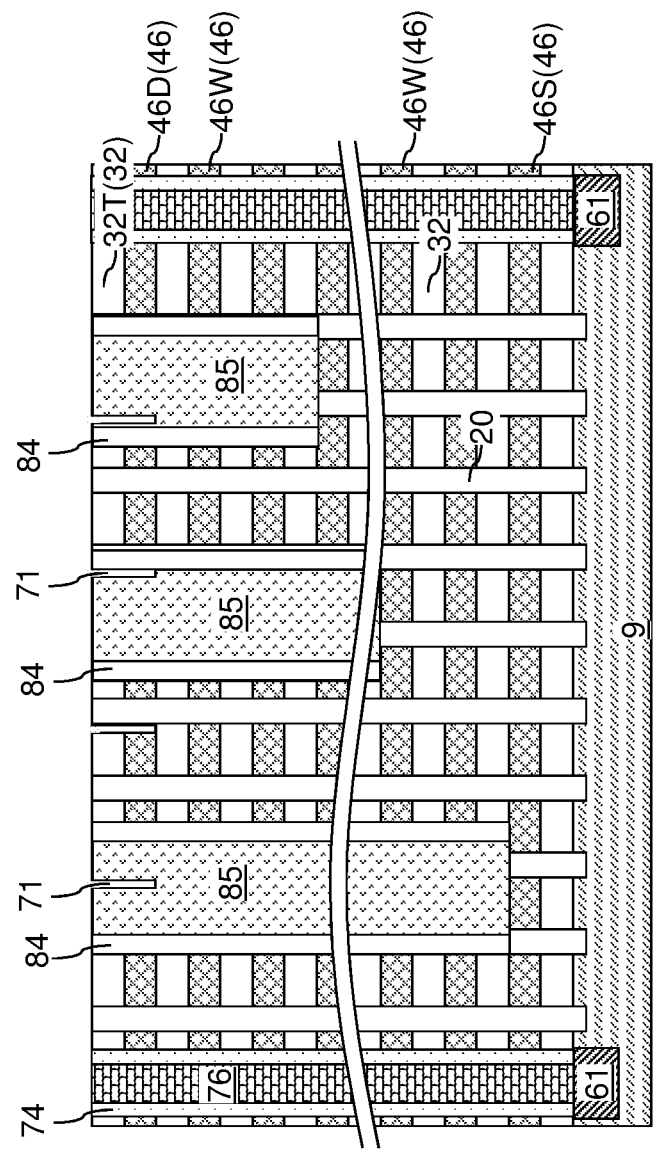
FIG. 15C is a vertical cross-sectional view of the exemplary structure along the vertical plane C-C' of FIG. 15B.

Referring to FIGS. 15A-15C, a photoresist layer (not shown) can be applied over the exemplary structure, and can be lithographically patterned to form slit-shaped openings that laterally extend along the first horizontal direction hd1 and overlies a respective strip region located between a respective neighboring pair of rows of memory stack structures 55 (which are located within a respective neighboring pair of rows of memory opening fill structures 58). An anisotropic etch process can be performed to etch through unmasked portions of the topmost insulating layer 32T and the drain select gate electrode(s) 46D. Drain-select-level isolation trenches 71 are formed in volumes from which the materials of the topmost insulating layer 32T and the drain select gate electrode(s) 46D are etched. The drain select gate electrode(s) 46D are divided into multiple electrically conductive strips that laterally extend along the first horizontal direction hd1. Each such electrically conductive strip is herein referred to as a drain-select-level electrically conductive strip.

In one embodiment, the memory stack structures 55 are arranged in rows of memory stack structures 55 that are arranged along the first horizontal direction hd1. Each row of memory stack structures 55 may be located between a respective neighboring pair of drain-select-level isolation trenches 71. A plurality of drain-select-level isolation trenches 71 may be formed between a neighboring pair of backside trench fill structures (74, 76), such as a first backside trench fill structure (74, 76) and a second backside trench fill structure (74, 76). The plurality of drain-select-level isolation trenches 71 may be numerically labeled with positive integers.

The drain-select-level isolation trenches 71 laterally extend along the first horizontal direction hd1, and are laterally spaced apart along the second horizontal direction hd2 through the topmost insulating layer 32T and through the drain select gate electrode(s) 46D (which is now divided into a plurality of drain-select-level electrically conductive strips). The drain-select-level isolation trenches 71 divide each drain select gate electrode 46D into the plurality of drain-select-level electrically conductive strips.

According to an aspect of the present disclosure, at least one drain-select-level isolation trench 71 (which may include, for example, a first drain-select-level isolation trench 71 of the drain-select-level isolation trenches 71) may cut into at least one tubular insulating spacer 84 and/or at least one sacrificial via structure 85. In an illustrative example, a first drain-select-level isolation trench 71 may cut into a first in-process laterally-insulated contact via assembly (84, 85). In this case, first in-process laterally-insulated contact via assembly (84, 85) may comprise: a first sidewall segment that is more proximal to a first vertical plane that contains an interface between the alternating stack (32, 46) and the first backside trench 79 than the first drain-select-level isolation trench 71 is to the first vertical plane; and a second sidewall segment that is more proximal to a second vertical plane that contains an interface between the alternating stack (32, 46) and the second backside trench 79 than the first drain-select-level isolation trench 79 is to the second vertical plane. In other words, the first in-process laterally-insulated contact via assembly (84, 85) may laterally extend along the second horizontal direction hd2 such that the first in-process laterally-insulated contact via assembly (84, 85) is located on both sides of the first drain-select-level isolation trench 71 along the second horizontal direction hd2. The first drain-select-level isolation trench 71 cuts through and straddles the first in-process laterally-insulated contact via assembly (84, 85) along the first horizontal direction hd1.

In one embodiment, the drain-select-level isolation trenches 71 may extend straight along the first horizontal direction hd1 with a uniform width throughout through the first memory array region 100A, the contact region 200, and the second memory array region 100B. In another embodiment, at least one of the drain-select-level isolation trenches 71 may extend through the first memory array region 100A, the contact region 200, and the second memory array region 100B with one or more lateral jogs (i.e., bends or curves) along the second horizontal direction hd2 within the contact region 200. Alternatively or additionally, at least one of the drain-select-level isolation trenches 71 may extend through one of the first memory array region 100A and the second memory array region 100B, and partly into the contact region 200, and does not extend through the other of the first memory array region 100A and the second memory array region 100B. Alternatively or additionally, one or more of the drain-select-level isolation trenches 71 may have a lateral extent that is limited within the contact region 200, and is laterally bounded by a respective pair of in-process laterally-insulated contact via assemblies (84, 85).

Figure 16B:
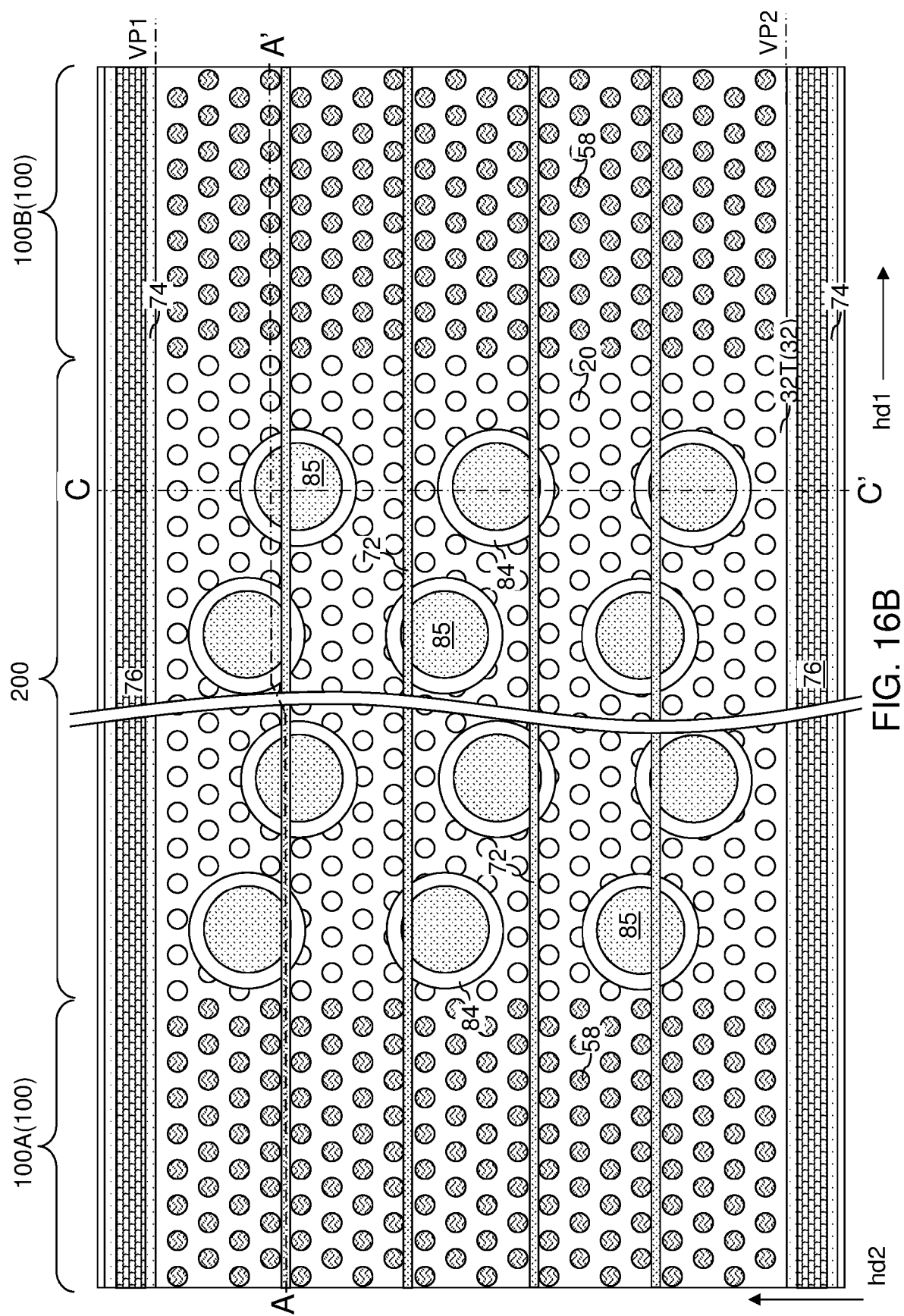
FIG. 16B is a top-down view of the exemplary structure of FIG. 16A. The vertical plane A-A' is the vertical cross-sectional plane of FIG. 16A.
Figure 16C:
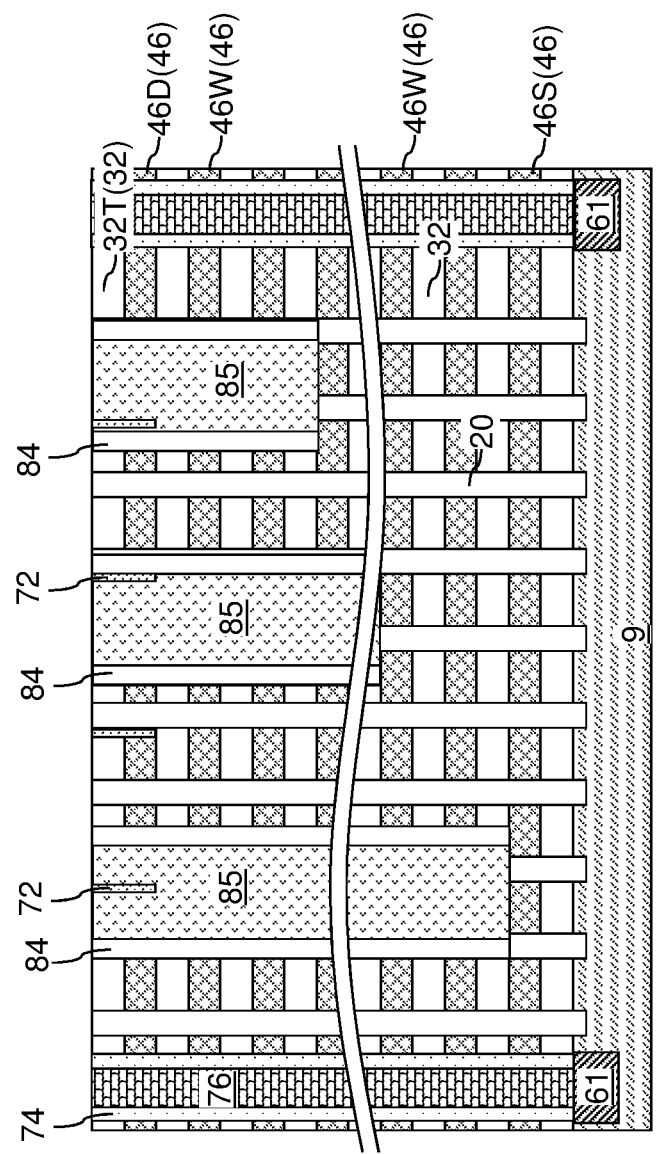
FIG. 16C is a vertical cross-sectional view of the exemplary structure along the vertical plane C-C' of FIG. 16B.

Referring to FIGS. 16A-16C, a dielectric fill material such as undoped silicate glass or a doped silicate glass can be conformally deposited in the drain-select-level isolation trenches 71. Portions of the dielectric fill material that fill the drain-select-level isolation trenches 71 constitute drain-select-level isolation structures 72. The drain-select-level isolation structures 72 laterally extend along the first horizontal direction hd1, and are laterally spaced apart along the second horizontal direction hd2 through the topmost insulating layer 32T and through the drain select gate electrode(s) 46D. Each drain select gate electrode 46D is divided into a plurality of drain-select-level electrically conductive strips by the drain-select-level isolation structures 72.

In one embodiment, at least one, a plurality or each of the drain-select-level isolation structures 72 may contact a respective tubular insulating spacer 84. For example, a first drain-select-level isolation structure 72 of the drain-select-level isolation structures 72 may contact a first tubular insulating spacer 84. In one embodiment, at least one, a plurality or each of the drain-select-level isolation structures 72 may contact a respective sacrificial via structure 85. For example, a first drain-select-level isolation structure 72 of the drain-select-level isolation structures 72 may contact a first sacrificial via structure 85.

In one embodiment, a first in-process laterally-insulated contact via assembly (84, 85) comprises: a first sidewall segment that is more proximal to a first vertical plane that contains an interface between the alternating stack (32, 46) and a first backside trench 79 (containing a first backside trench fill structure (74, 76)) than a first drain-select-level isolation structure 72 is to the first vertical plane; and a second sidewall segment that is more proximal to a second vertical plane that contains an interface between the alternating stack (32, 46) and a second backside trench 79 (containing a second backside trench fill structure (74, 76)) than the first drain-select-level isolation structure 72 is to the second vertical plane. In one embodiment, the first vertical plane and the second vertical plane are parallel to the first horizontal direction hd1.

In one embodiment, the first drain-select-level isolation structure 72 contacts and laterally extends through the first sacrificial via structure 85 in the first in-process laterally-insulated contact via assembly (84, 85) at the drain-select-level. In one embodiment, each row of memory stack structures 55 (located within the memory opening fill structures 58) may be located between a respective neighboring pair of drain-select-level isolation structures 72, between the first backside trench fill structure (74, 76) and one of the drain-select-level isolation structures 72, or between the second backside trench fill structure (74, 76) and another of the drain-select-level isolation structures 72.

In one embodiment, the drain-select-level isolation structures 72 may extend straight along the first horizontal direction hd1 with a uniform width throughout through the first memory array region 100A, the contact region 200, and the second memory array region 100B. In another embodiment, at least one of the drain-select-level isolation structures 72 may extend through the first memory array region 100A, the contact region 200, and the second memory array region 100B with one or more lateral jogs (e.g., bends or curves) along the second horizontal direction hd2 within the contact region. Alternatively or additionally, at least one of the drain-select-level isolation structures 72 may extend through one of the first memory array region 100A and the second memory array region 100B, and partly into the contact region 200, and does not extend through the other of the first memory array region 100A and the second memory array region 100B. Alternatively or additionally, one or more of the drain-select-level isolation structures 72 may have a lateral extent that is limited within the contact region 200, and is laterally bounded by a respective pair of in-process laterally-insulated contact via assemblies (84, 85).

Figure 17:
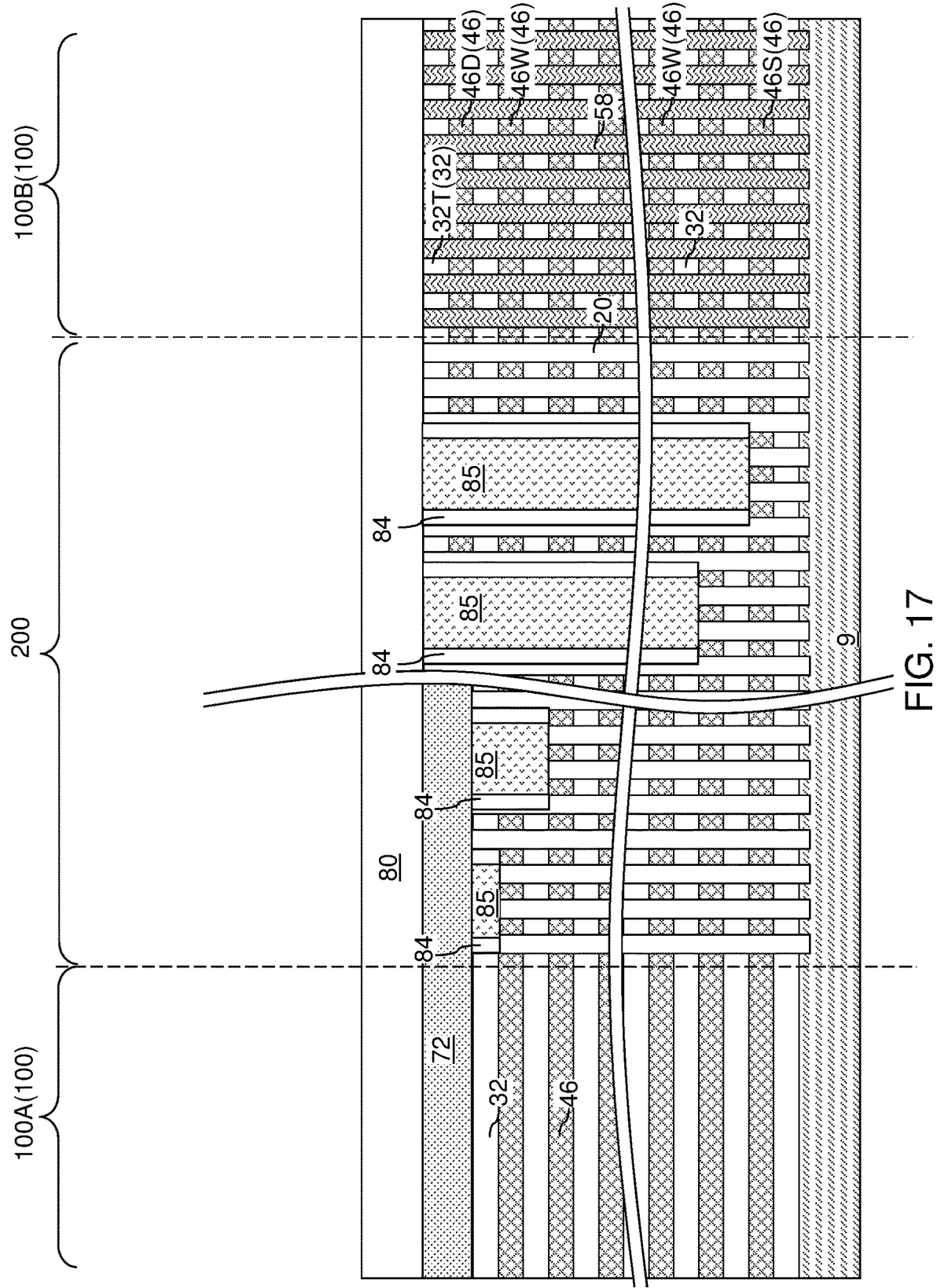
FIG. 17 is a vertical cross-sectional view of the exemplary structure after formation of a contact-level dielectric layer according to an embodiment of the present disclosure.

Referring to FIG. 17, a dielectric material can be deposited over the alternating stack (32, 46) and the drain-select-level isolation structures 72 for form a dielectric material layer, which is herein referred to as a contact-level dielectric layer 80. The contact-level dielectric layer 80 comprises a dielectric material such as silicon oxide, and may have a thickness in a range from 100 nm to 600 nm, although lesser and greater thicknesses may also be employed. The contact-level dielectric layer 80 overlies the alternating stack (32, 46). In one embodiment, the entirety of an annular top surface of each tubular insulating spacer 84 may be located within the horizontal plane including an interface between the alternating stack (32, 46) and the contact-level dielectric layer 80. In one embodiment, each of the drain-select-level isolation structures 72 may have a respective top surface that contacts a bottom surface of the contact-level dielectric layer 80.

Figure 18A:
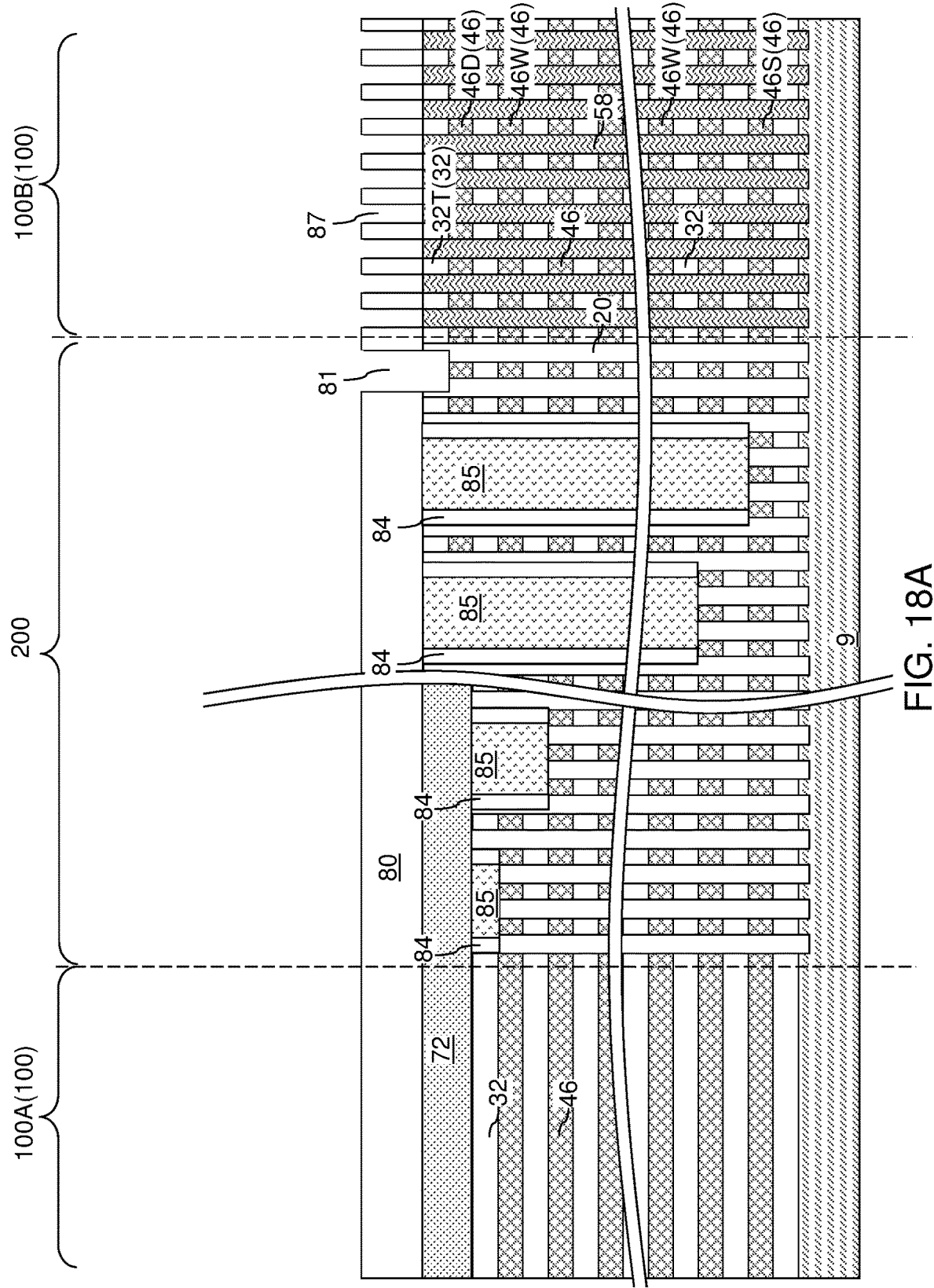
FIG. 18A is a vertical cross-sectional view of the exemplary structure after formation of drain contact via cavities and drain-select-level via cavities according to an embodiment of the present disclosure.
Figure 18B:
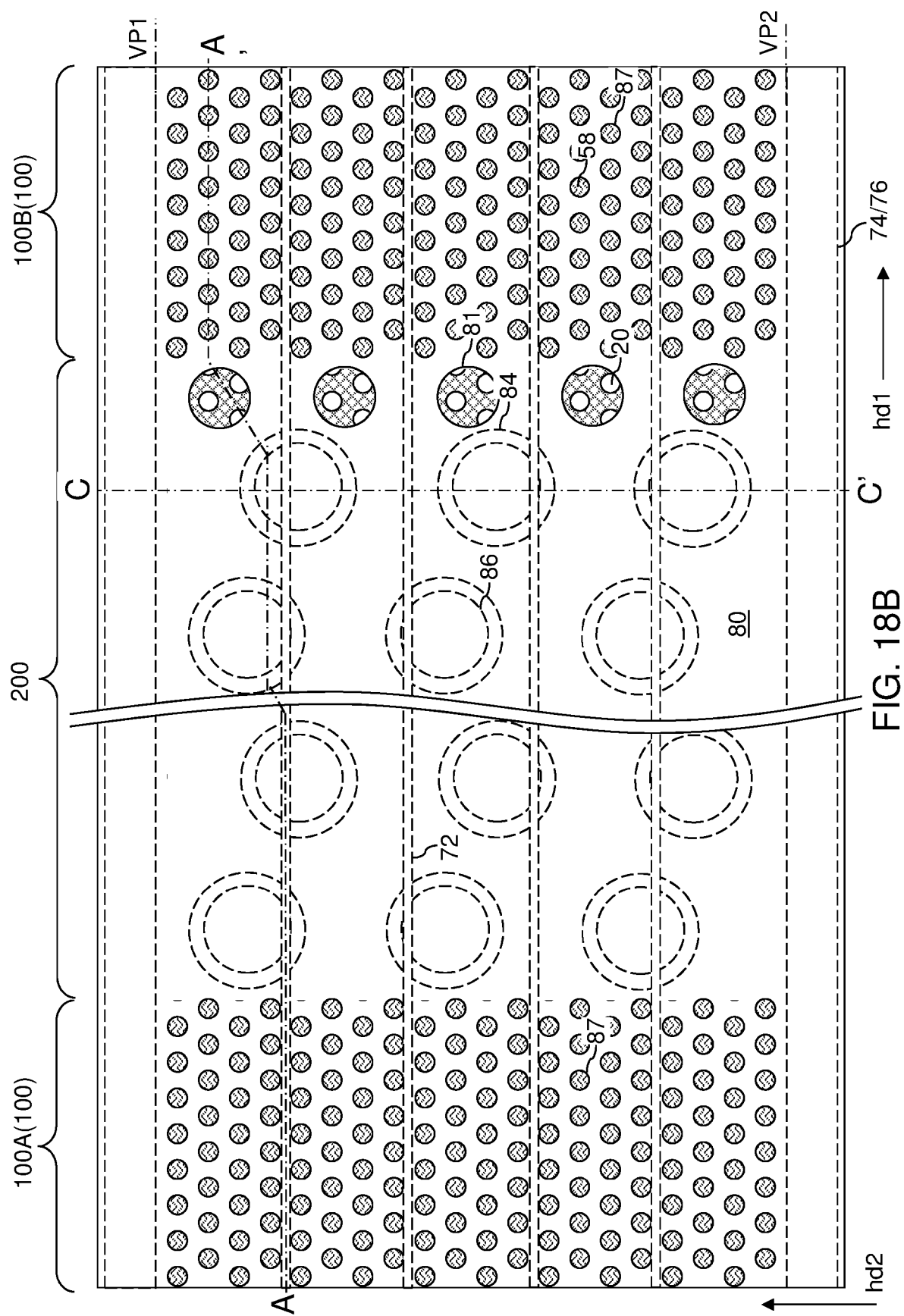
FIG. 18B is a top-down view of the exemplary structure of FIG. 18A. The vertical plane A-A' is the vertical cross-sectional plane of FIG. 18A.
Figure 18C:
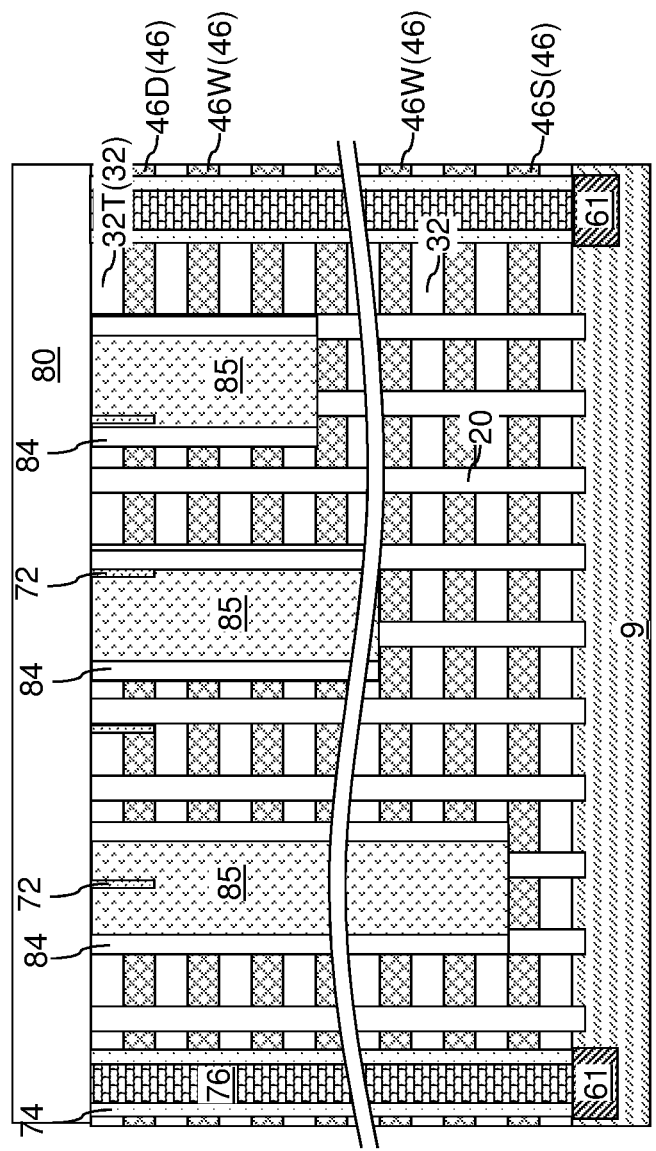
FIG. 18C is a vertical cross-sectional view of the exemplary structure along the vertical plane C-C' of FIG. 18B.

Referring to FIGS. 18A-18C, a photoresist layer (not shown) can be applied over the contact-level dielectric layer 80, and can be lithographically patterned to form openings in each area of the memory opening fill structures 58 in the memory array regions 100, and in areas that overlie a respective drain-select-level electrically conductive strip and do not overlap with the in-process process laterally-insulated contact via assemblies (84, 85) or with the drain-select-level isolation structures 72. An anisotropic etch process can be performed to form openings through the contact-level dielectric layer 80 within areas that are not masked by the photoresist layer. The memory opening fill structures 58 and the drain-select-level electrically conductive strips (which comprise discrete divided portions of the drain select gate electrode(s) 46D) may function as etch stop structures for the anisotropic etch process. The photoresist layer can be subsequently removed, for example, by ashing.

Cylindrical cavities are formed through the contact-level dielectric layer 80. The cylindrical cavities may comprise drain contact via cavities 87 vertically extending through the contact-level dielectric layer 80 down to a top surface of a respective drain region 63. The cylindrical cavities may further comprise drain-select-level contact via cavities 81 vertically extending through the contact-level dielectric layer 80 and the topmost insulating layer 32T down to a top surface of a respective drain-select-level electrically conductive strip, which is a respective discrete portion of the drain select gate electrode 46D.

Figure 19A:
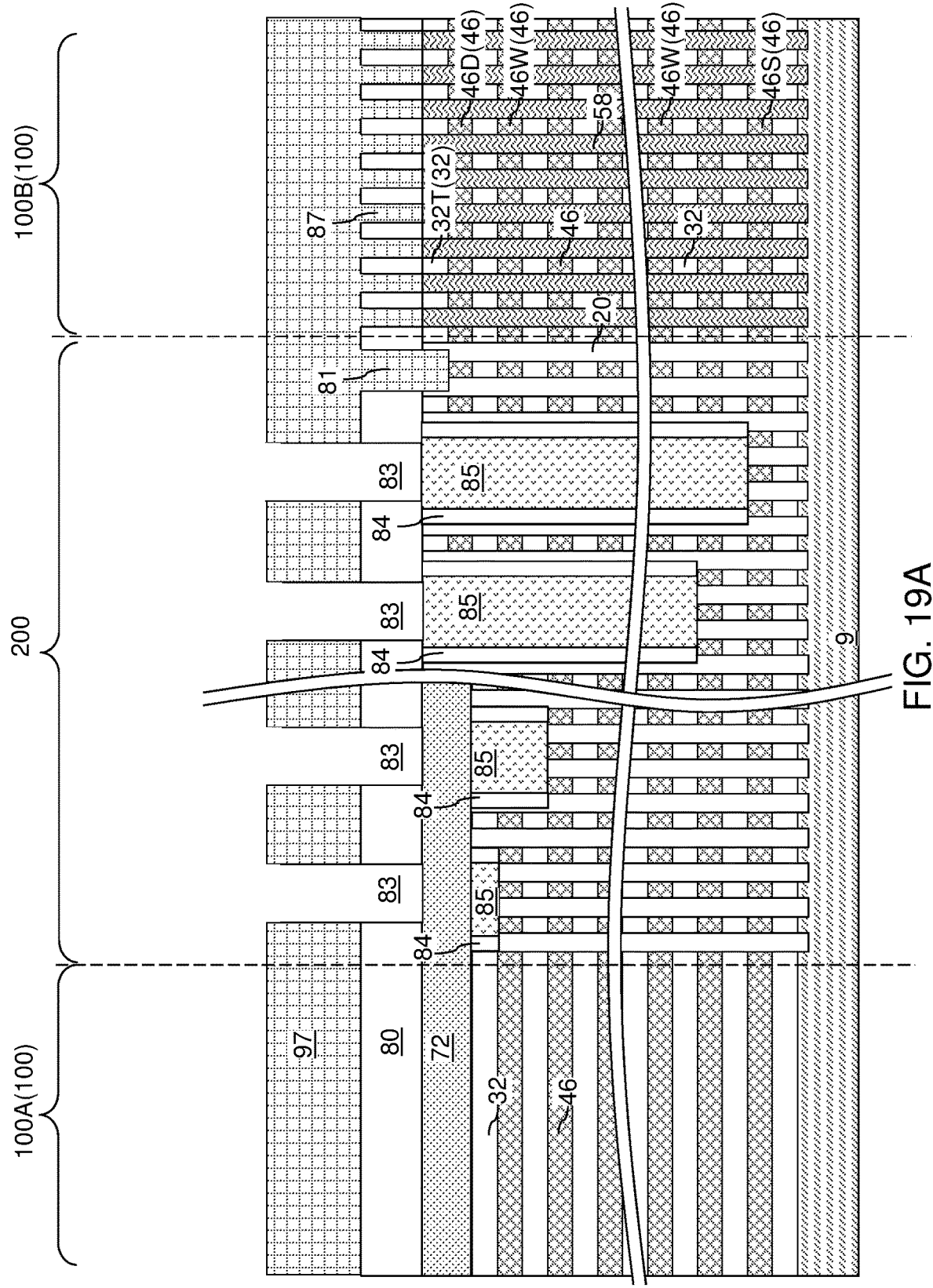
FIG. 19A is a vertical cross-sectional view of the exemplary structure after formation of connection via cavities according to an embodiment of the present disclosure.
Figure 19B:
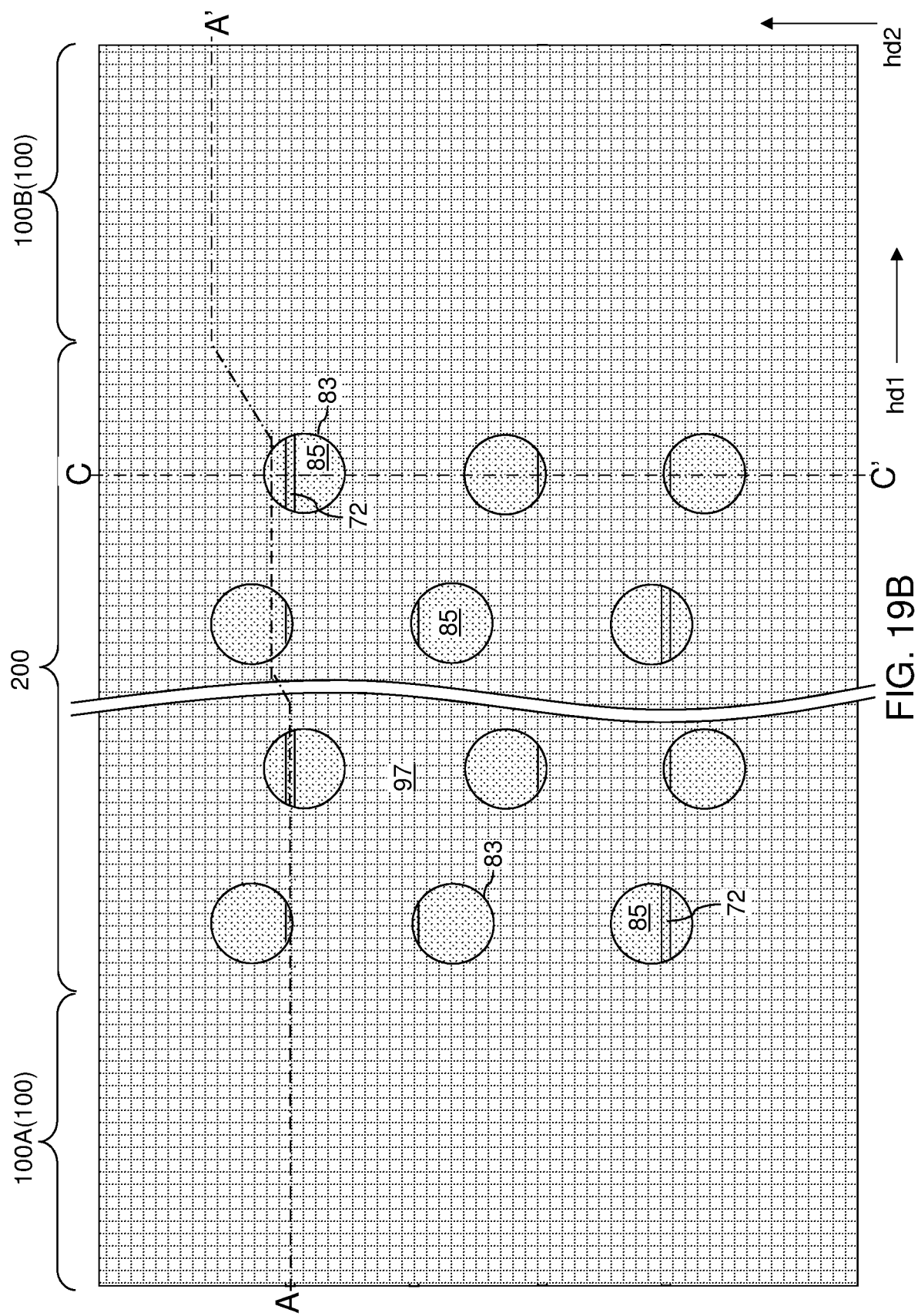
FIG. 19B is a top-down view of the exemplary structure of FIG. 19A. The vertical plane A-A' is the vertical cross-sectional plane of FIG. 19A.
Figure 19C:
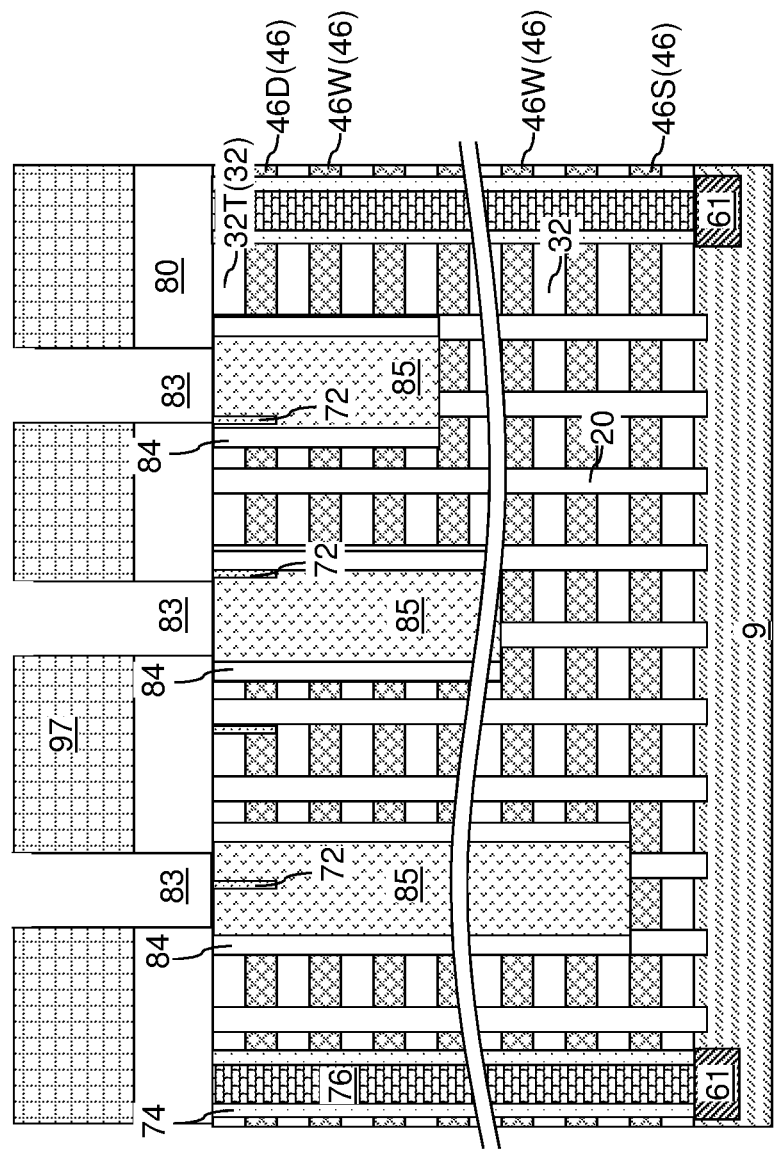
FIG. 19C is a vertical cross-sectional view of the exemplary structure along the vertical plane C-C' of FIG. 19B.

Referring to FIGS. 19A-19C, a photoresist layer 97 can be applied over the contact-level dielectric layer 80. The photoresist layer 97 may fill the drain contact via cavities 87 and the drain-select-level contact via cavities 81 to protect the memory opening fill structures 58 and the drain-select-level electrically conductive strips during a subsequent etch process. The photoresist layer 97 can be lithographically patterned to form openings over the in-process laterally-insulated contact via assembly (84, 85). An opening can be formed over each sacrificial via structure 85. In one embodiment, the area of the openings in the photoresist layer 97 may be smaller than the area of an underlying sacrificial via structure 85.

An anisotropic etch process can be performed to etch portions of the contact-level dielectric layer 80 that are not masked by the photoresist layer 97. A connection via cavity 83 can be formed through the contact-level dielectric layer 80 over each of the sacrificial via structures 85. In one embodiment, one, a plurality or each of the connection via cavities 83 may have a bottom periphery that is laterally offset inward from the periphery of a top surface of an respective underlying sacrificial via structure 85.

Figure 20C:
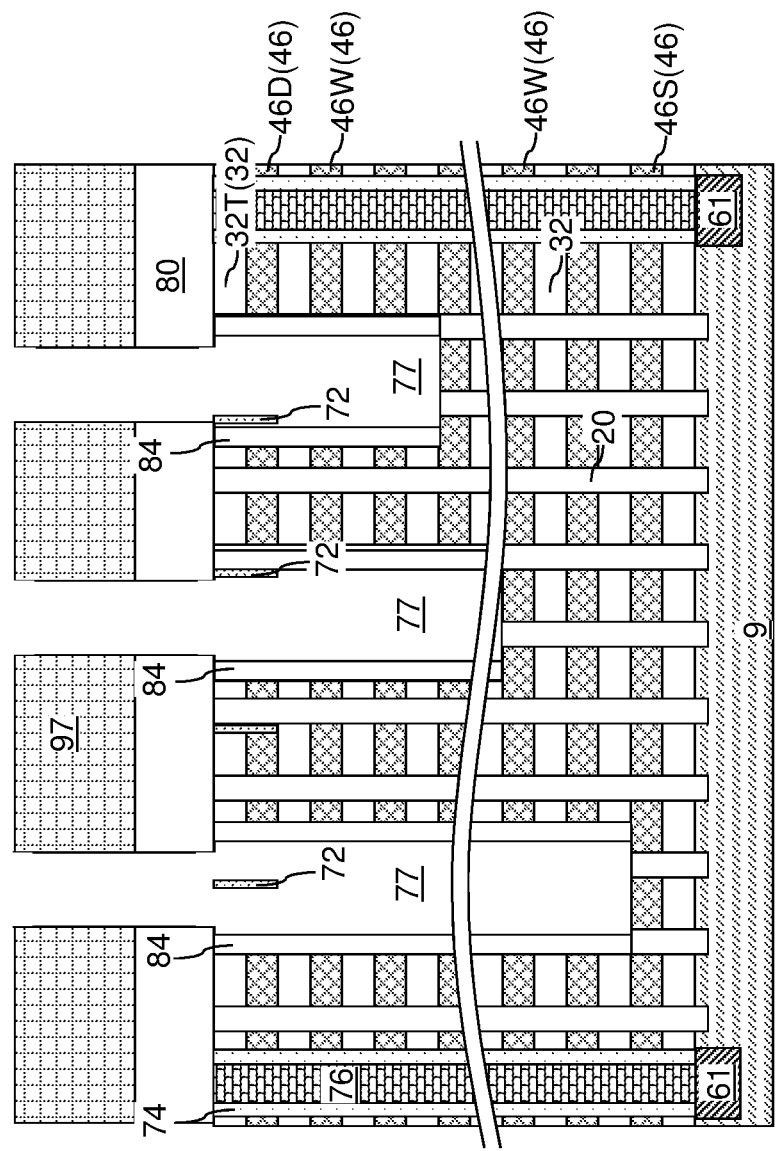
FIG. 20C is a vertical cross-sectional view of the exemplary structure along the vertical plane C-C' of FIG. 20B.

Referring to FIGS. 20A-20C, an etch process can be performed to remove the sacrificial via structures 85 selective to the materials of the contact-level dielectric layer 80, the tubular insulating spacers 84, the drain-select-level isolation structures 72, and the electrically conductive layers 46. For example, a wet etch process can be performed to remove the sacrificial via structures 85. In an illustrative example, if the sacrificial via structures 85 comprise a semiconductor material, such as silicon or a silicon-germanium alloy, a wet etch process employing hot trimethyl-2 hydroxyethyl ammonium hydroxide ("hot TMY") or tetramethyl ammonium hydroxide (TMAH) may be employed. If the sacrificial via structures 85 comprise borosilicate glass, a wet etch process employing dilute hydrofluoric acid may be employed. Alternatively, if the sacrificial via structures 85 comprise a carbon-based material such as amorphous carbon or diamond-like carbon, an ashing process may be employed to remove sacrificial via structures 85. In this case, the photoresist layer 97 may be simultaneously removed. In case backside blocking dielectric layers 44 are present around the electrically conductive layers 46, an isotropic etch process may be performed to remove physically exposed portions of the backside blocking dielectric layers 44 underneath each layer cavity formed by removal of the sacrificial via structures 85 to expose top surfaces of the electrically conductive layers 46 (e.g., the word lines 46W).

Generally, the photoresist layer 97 may be removed during or after removal of the sacrificial via structures 85, for example, by ashing. Layer contact via cavities 77 can be formed in each combination of a volume from which a sacrificial via structure 85 is removed and a volume of an overlying connection via cavity 83. A top surface of a word line 46W can be physically exposed underneath each layer contact via cavity 77.

Figure 21A:
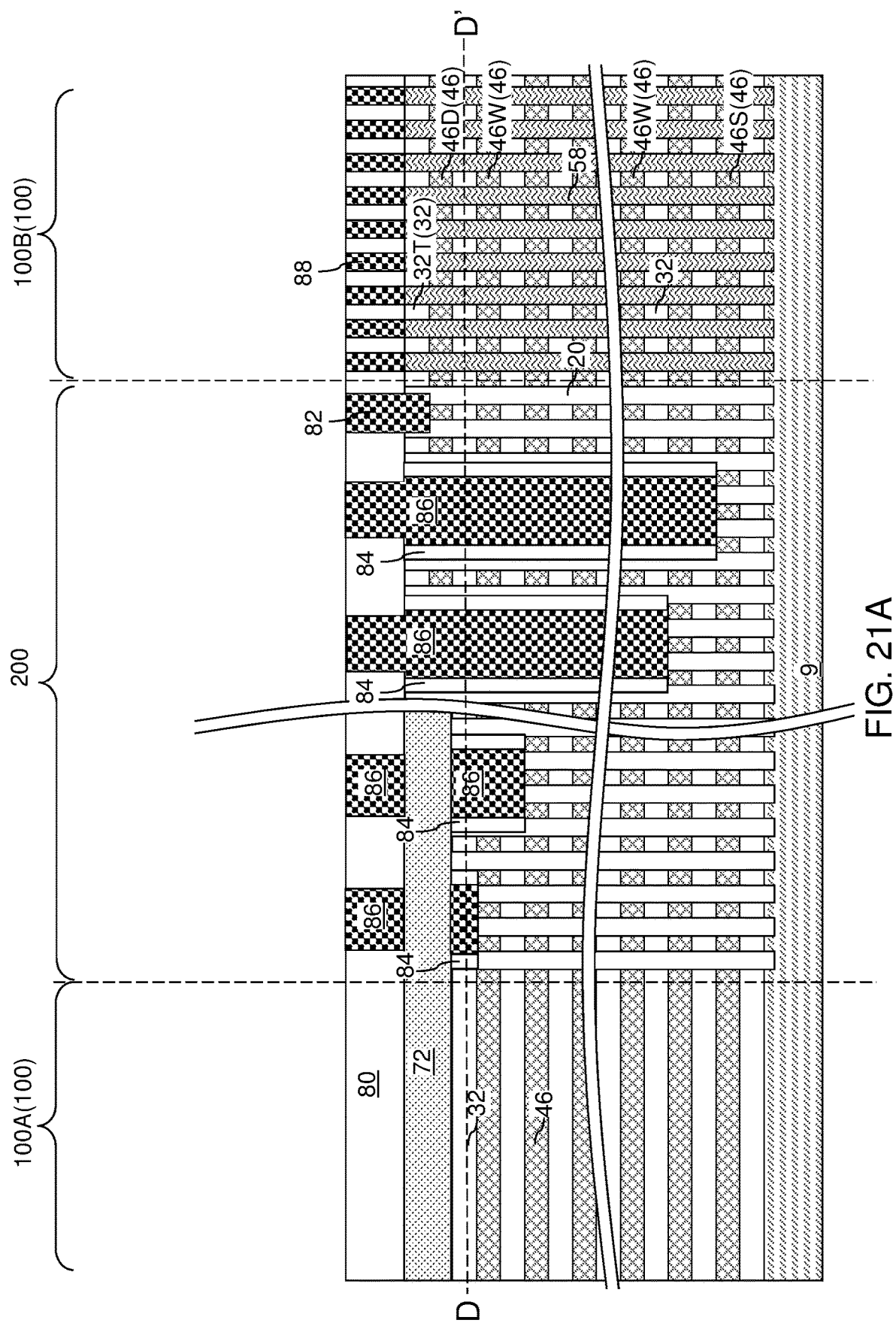
FIG. 21A is a vertical cross-sectional view of the exemplary structure after formation of various contact via structures according to an embodiment of the present disclosure.
Figure 21C:
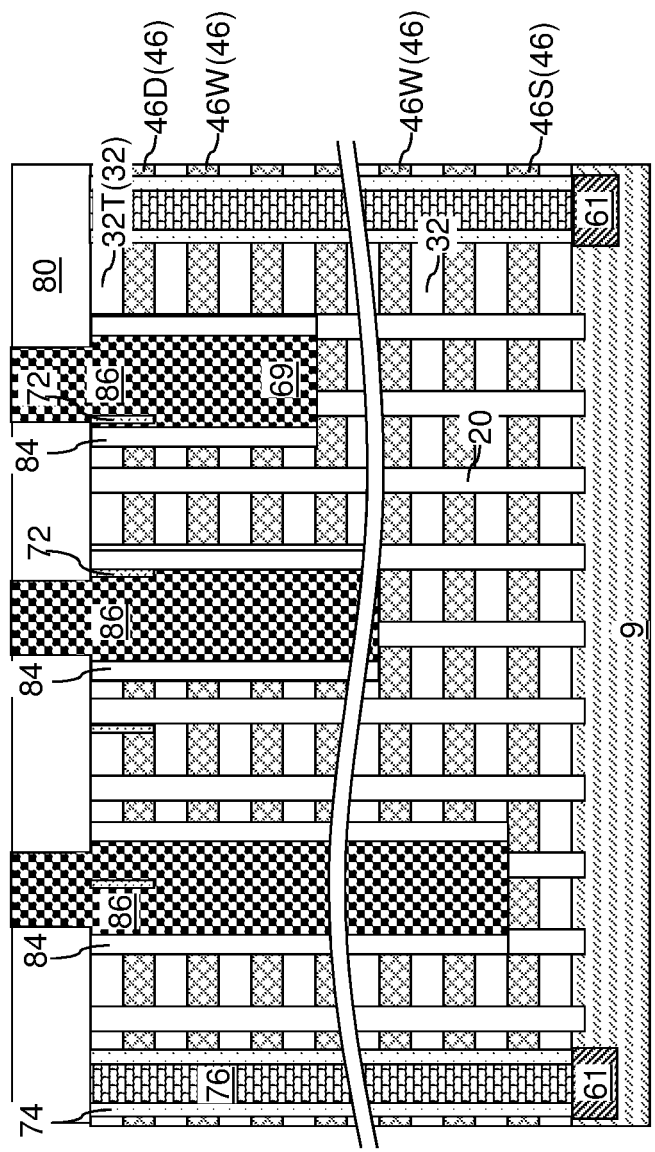
FIG. 21C is a vertical cross-sectional view of the exemplary structure along the vertical plane C-C' of FIG. 21B.
Figure 21D:
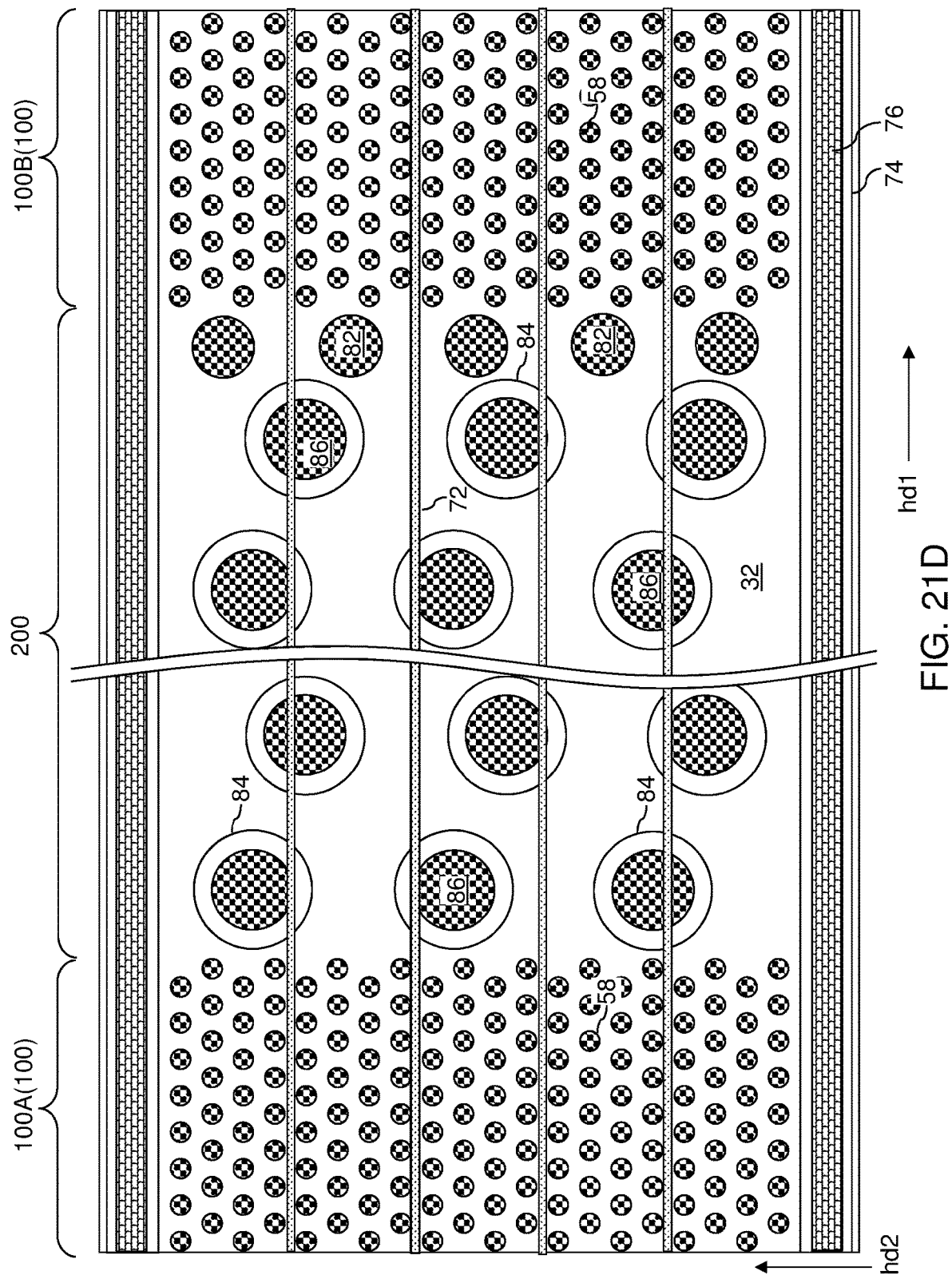
FIG. 21D is horizontal cross sectional view of the exemplary structure along horizontal plane D-D' of FIG. 21A.

Referring to FIGS. 21A-21C, at least one metallic material can be deposited in the layer contact via cavities 77, the drain contact via cavities 87, and the drain-select-level via cavities 81. In one embodiment, the at least one metallic material may comprise a metallic barrier liner material such as TiN, TaN, WN, or MoN, and a metallic fill material such as W, Ti, Ta, Mo, Co, or Ru. Each of the metallic barrier liner material and the metallic fill material may be deposited by physical vapor deposition, chemical vapor deposition, or a combination thereof. The thickness of the metallic barrier material as measured at an interface with a respective underlying conductive material portion may be in a range from 2 nm to 40 nm, although lesser and greater thicknesses may also be employed. A predominant portion of the metallic fill material in the contact via cavities may be deposited employing a conformal deposition process such as a chemical vapor deposition process. Excess portions of the at least one metallic material can be removed from above the horizontal plane including the top surface of the contact-level dielectric layer 80.

Remaining portions of the at least one metallic material comprise contact via structures (88, 82, 86). The contact via structures (88, 82, 86) may comprise drain contact via structures 88 that are formed in the drain contact via cavities 87, and are formed directly on a top surface of a respective drain region 63 in a respective memory opening fill structure 58. The contact via structures (88, 82, 86) also comprise drain-select-level contact via structures 82 contacting a top surface of a respective drain-select-level electrically conductive strip within the drain select gate electrode 46D. Further, the contact via structures (88, 82, 86) comprise layer contact via structures (e.g., word line contacts) 86 formed within a respective layer contact via cavity 77 and contacting a top surface of a respective one of the word lines 46W and the source select gate electrode(s) 46S.

Each contiguous combination of a tubular insulating spacer 84 and a layer contact via structure 86 constitutes a laterally-insulated contact via assembly (84, 86). Thus, the in-process laterally-insulated contact via assemblies (84, 85) are converted into laterally-insulated contact via assemblies (84, 86) by replacing the sacrificial via structures 85 with layer contact via structures 86. Each of the layer contact via structures 86 contacts a top surface of a respective word line 46W of the word lines 46W, or a top surface of the source select gate electrode 46S.

Each of the layer contact via structures 86 may comprise a metallic material that vertically extends through each layer of the alternating stack (32, 46) that overlies the respective word line 46W and through the contact-level dielectric layer 80. In one embodiment, one, a plurality and/or each of the layer contact via structures 86 may have a stepped vertical cross-sectional profile including a horizontal step at the horizontal plane including the interface between the alternating stack (32, 46) and the contact-level dielectric layer 80. In one embodiment, one, a plurality and/or each of the layer contact via structures 86 may contact a respective underlying electrically conductive layer 46 (e.g., word line 46W), and may comprise a respective first vertical sidewall vertically extending through each layer of the alternating stack that overlies the respective underlying electrically conductive layer 46, a respective second vertical sidewall vertically extending through the contact-level dielectric layer 80, and a respective horizontal surface connecting a top periphery of the first vertical sidewall and a bottom periphery of the second vertical sidewall and located within the horizontal plane including the interface between the alternating stack (32, 46) and the contact-level dielectric layer 80.

Generally, the sidewalls of the drain contact via structures 88 are straight and are in direct contact with the contact-level dielectric layer 80. The sidewalls of the drain-select-level contact via structures 82 are straight and are in direct contact with the contact-level dielectric layer 80. Each of the layer contact via structures 86 may comprise a first vertical sidewall in contact with a respective tubular insulating spacer 84, a second vertical sidewall in contact with the contact-level dielectric layer 80, and a horizontal surface (such as an annular surface) in contact with a segment of the top surface of the topmost insulating layer 32T or in contact with a segment of a bottom surface of the contact-level dielectric layer 80.

As discussed above, the drain-select-level isolation trenches 71 and the drain-select-level isolation structures 72 may be formed in various patterns.

Figure 22:
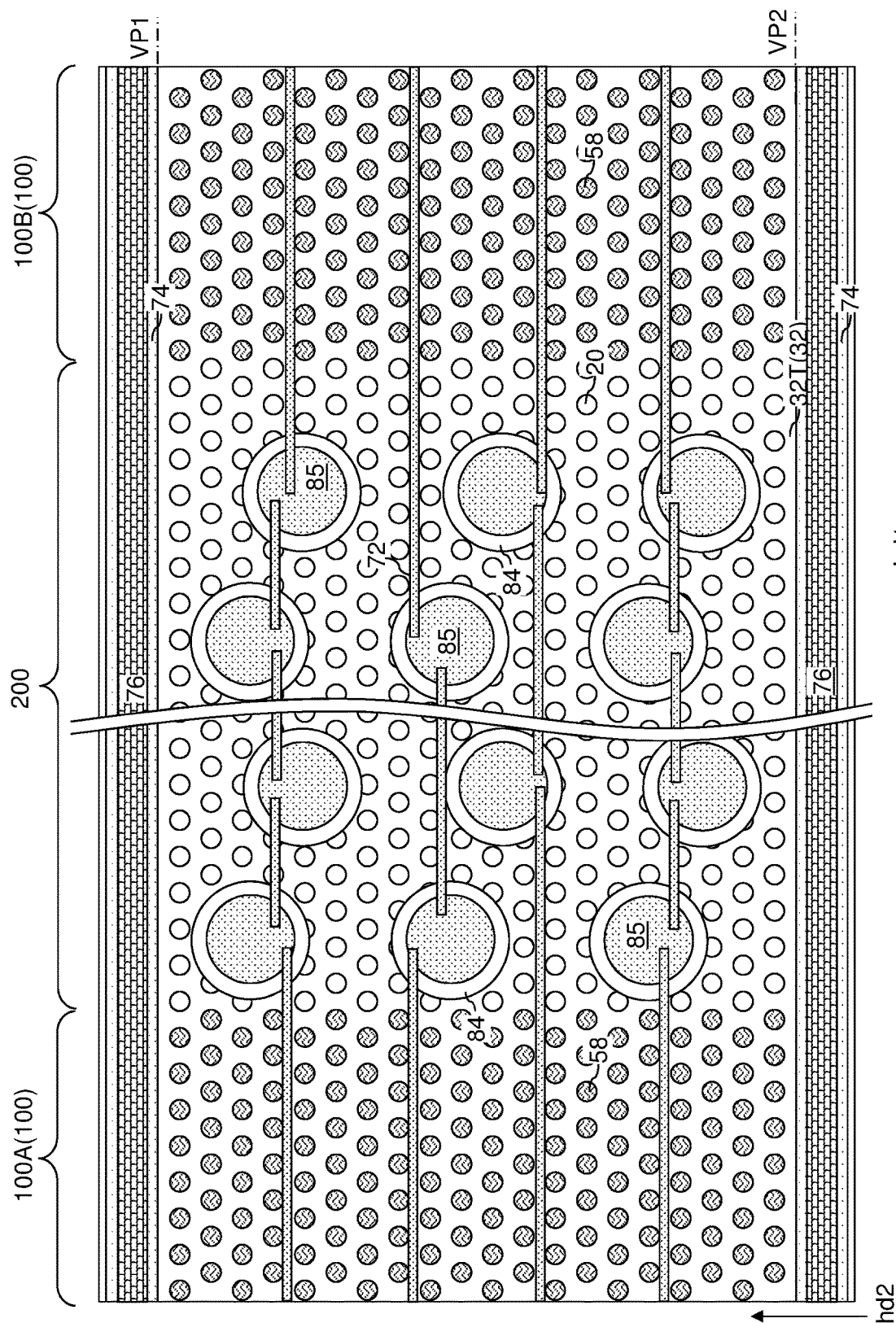
FIG. 22 is a top-down view of a first alternative embodiment of the exemplary structure after formation of drain-select-level isolation structures according to an embodiment of the present disclosure.

Referring to FIG. 22, a first alternative embodiment of the exemplary structure is illustrated after formation of drain-select-level isolation structures 72. The drain-select-level isolation structures 72 illustrated in FIG. 16B may be modified such that each of the drain-select-level isolation structures 72 illustrated in FIG. 16B is divided into multiple drain-select-level isolation structures 72. In other words, the drain-select-level isolation structures 72 are laterally discontinuous. Laterally adjacent portions of the drain-select-level isolation structures 72 are separated by a laterally-insulated contact via assembly (84, 86).

A first subset of the drain-select-level isolation structures 72 illustrated in FIG. 22 laterally extends through a memory array region 100 and a peripheral portion of the contact region 200. A second subset of the drain-select-level isolation structures 72 illustrated in FIG. 22 laterally extends through a portion of the contact region 200, and does not extend into the memory regions 100. In this case, some drain-select-level isolation structures 72 are formed between a respective neighboring pair of rows of memory opening fill structures 58. Additional drain-select-level isolation structures 72 may be formed concurrently with the drain-select-level isolation structures 72 that are formed between rows of memory opening fill structures 58. In one embodiment, the additional drain-select-level isolation structures 72 may be laterally spaced from the drain-select-level isolation structures 72 in the memory array regions 100, and may be formed directly on the tubular insulating spacer 84. In some embodiments, the additional drain-select-level isolation structures 72 may be laterally offset from the drain-select-level isolation structures 72 that laterally extend through a respective memory array region 100 along the second horizontal direction hd2. In one embodiment, the additional drain-select-level isolation structures 72 may be laterally spaced from the drain-select-level isolation structures 72 that laterally extend through the memory array regions 100 along the first horizontal direction hd1, and may contact a respective pair of tubular insulating spacers 84. In one embodiment, the first backside trench fill structure (74, 76) and the second backside trench fill structure (74, 76) may have greater lateral extents along the first horizontal direction hd1 than one, a plurality, or each, of the drain-select-level isolation structures 72. One, a plurality, or each of the drain-select-level isolation structures 72 may be in direct contact with a respective laterally-insulated contact via assemblies (84, 86).

Figure 23:
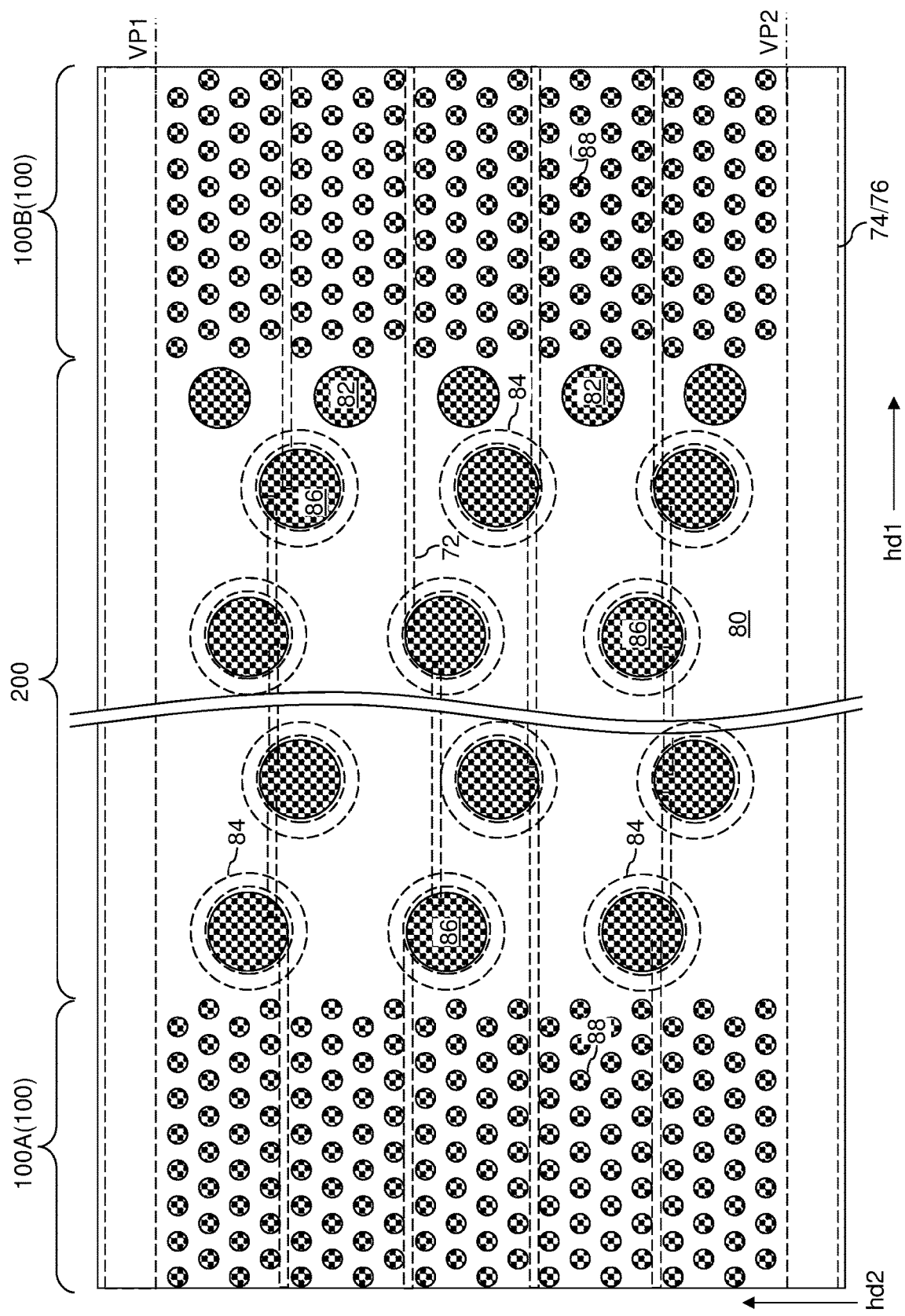
FIG. 23 is a top-down view of the first alternative embodiment of the exemplary structure after formation of various contact via structures according to an embodiment of the present disclosure.

Referring to FIG. 23, the processing steps of FIGS. 17, 18A-18C, 19A-19C, 20A-20C, and 21A-21C may be subsequently performed. One, a plurality or each of the drain-select-level isolation structures 72 may be in direct contact with a respective layer contact via structure 86. Thus, in this first alternative embodiment, laterally adjacent drain-select-level isolation structures 72 are laterally separated only by the respective layer contact via structure 86 but not by the tubular insulating spacer 84 which surrounds the respective layer contact via structure 86. Therefore the drain-select-level isolation structures 72 extend over the tubular insulating spacer 84 but not its respective layer contact via structure 86.

Figure 24:
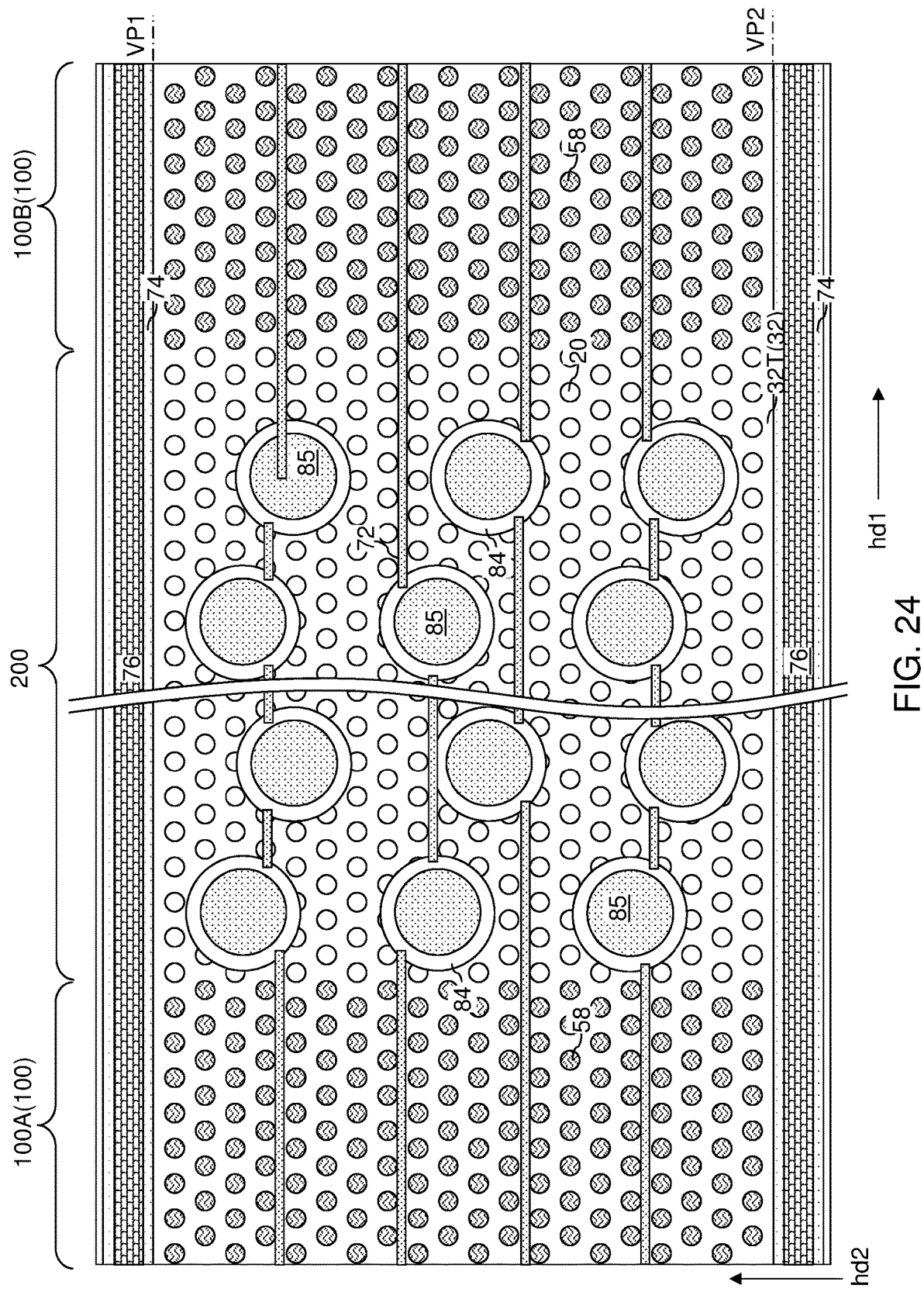
FIG. 24 is a top-down view of a second alternative embodiment of the exemplary structure after formation of drain-select-level isolation structures according to an embodiment of the present disclosure.

Referring to FIG. 24, a second alternative embodiment of the exemplary structure is illustrated after formation of drain-select-level isolation structures 72. The drain-select-level isolation structures 72 illustrated in FIG. 16B may be modified such that each of the drain-select-level isolation structures 72 illustrated in FIG. 16B is divided into multiple drain-select-level isolation structures 72. A first subset of the drain-select-level isolation structures 72 illustrated in FIG. 24 laterally extends through a memory array region 100 and a peripheral portion of the contact region 200. A second subset of the drain-select-level isolation structures 72 illustrated in FIG. 22 laterally extends through a portion of the contact region 200, and does not extend into the memory regions 100. In this case, some drain-select-level isolation structures 72 are formed between a respective neighboring pair of rows of memory opening fill structures 58. Additional drain-select-level isolation structures 72 may be formed concurrently with the drain-select-level isolation structures 72 that are formed between rows of memory opening fill structures 58. In one embodiment, the additional drain-select-level isolation structures 72 may be laterally spaced from the drain-select-level isolation structures 72 in the memory array regions 100, and may be formed directly on the tubular insulating spacer 84. In some embodiments, the additional drain-select-level isolation structures 72 may be laterally offset from the drain-select-level isolation structures 72 that laterally extend through a respective memory array region 100 along the second horizontal direction hd2. In one embodiment, the additional drain-select-level isolation structures 72 may be laterally spaced from the drain-select-level isolation structures 72 that laterally extend through the memory array regions 100 along the first horizontal direction hd1, and may contact a respective pair of tubular insulating spacers 84. In one embodiment, the first backside trench fill structure (74, 76) and the second backside trench fill structure (74, 76) may have greater lateral extents along the first horizontal direction hd1 than one, a plurality, or each, of the drain-select-level isolation structures 72. One, a plurality, or each of the drain-select-level isolation structures 72 may be in direct contact with a respective tubular insulating spacer 84, and is laterally spaced from a respective sacrificial via structure 85 that is laterally surrounded by the respective tubular insulating spacer 84.

Figure 25:
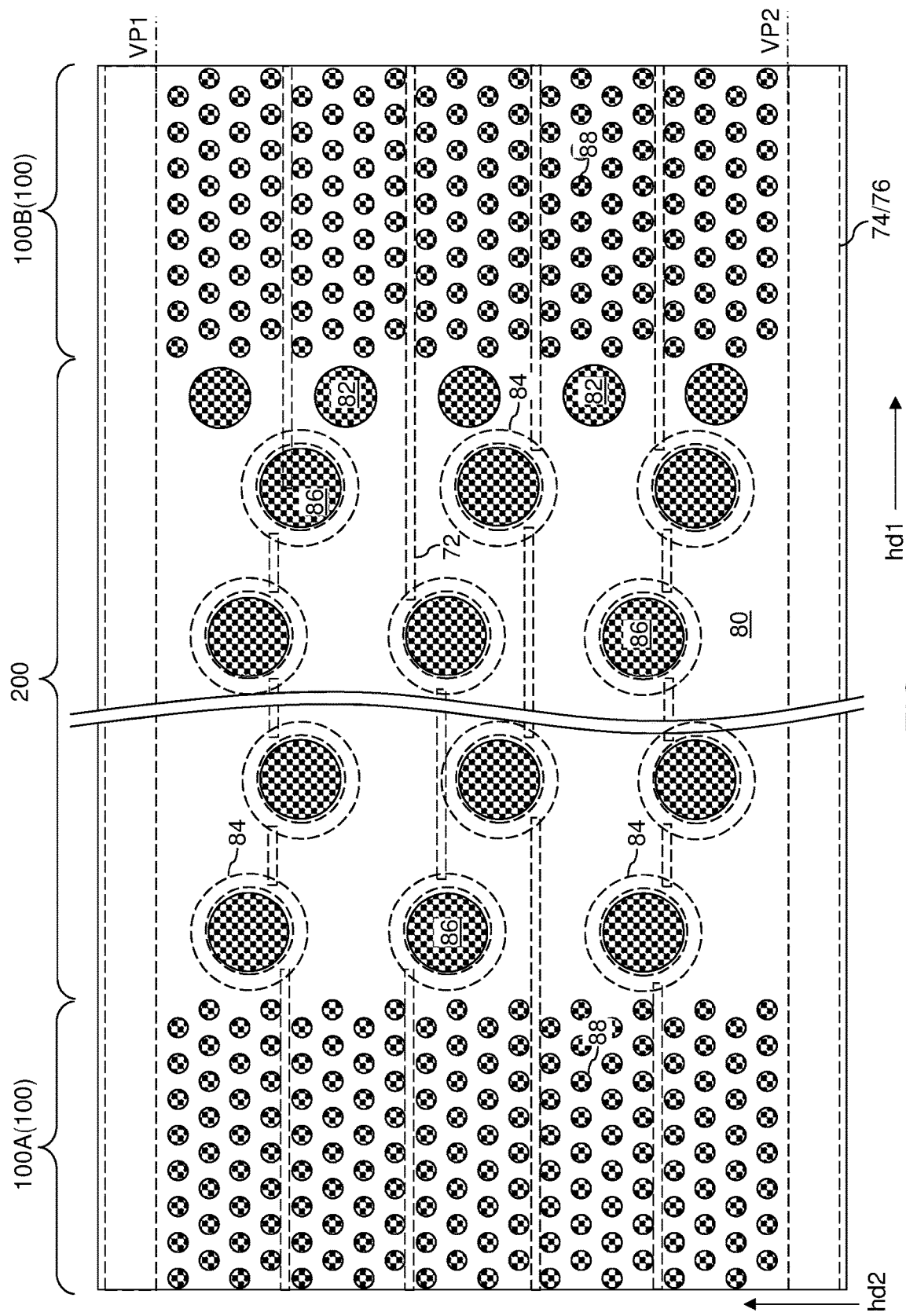
FIG. 25 is a top-down view of the second alternative embodiment of the exemplary structure after formation of various contact via structures according to an embodiment of the present disclosure.

Referring to FIG. 25, the processing steps of FIGS. 17, 18A-18C, 19A-19C, 20A-20C, and 21A-21C may be subsequently performed. One, a plurality, or each of the drain-select-level isolation structures 72 may be in direct contact with a respective tubular insulating spacer 84, and is laterally spaced from a respective layer contact via structure 86 that is laterally surrounded by the respective tubular insulating spacer 84. Thus, in this second alternative embodiment, laterally adjacent drain-select-level isolation structures 72 are laterally separated by both the respective layer contact via structure 86 and by the tubular insulating spacer 84 which surrounds the respective layer contact via structure 86. Therefore the drain-select-level isolation structures 72 extend only over the outer portion of the tubular insulating spacer 84 but not over its inner portion or its respective layer contact via structure 86.

Figure 26:
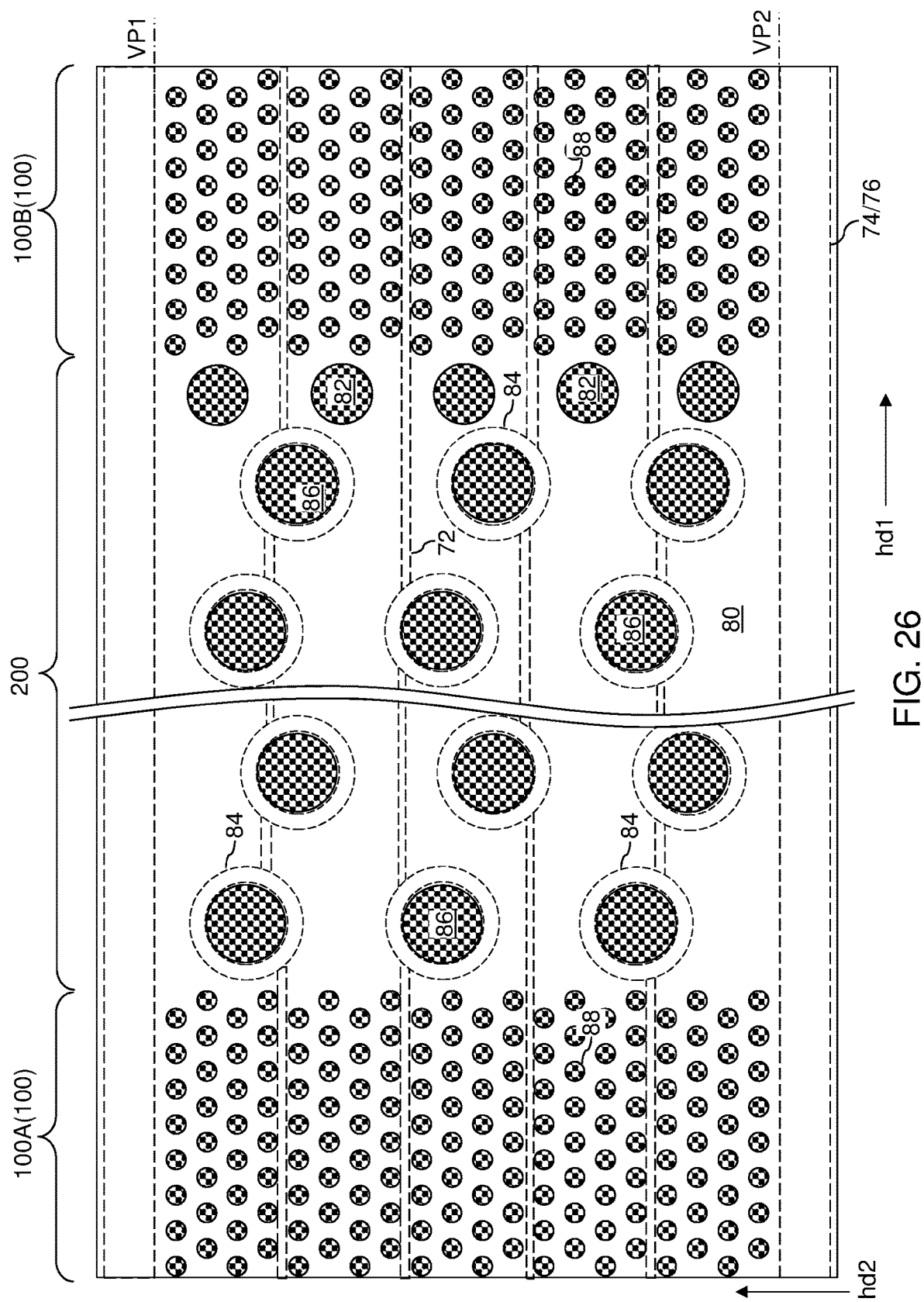
FIG. 26 is a top-down view of the second alternative embodiment of the exemplary structure after formation of various contact via structures according to an embodiment of the present disclosure.

Referring to FIG. 26, a third alternative embodiment of the exemplary structure is illustrated after the step shown in 21A-21C. One, a plurality, or each of the drain-select-level isolation structures 72 may be in direct contact with an outer sidewall of the respective tubular insulating spacer 84, and is laterally spaced from a respective layer contact via structure 86 that is laterally surrounded by the respective tubular insulating spacer 84. Thus, in this third alternative embodiment, laterally adjacent drain-select-level isolation structures 72 are laterally separated by the entirety of both the respective layer contact via structure 86 and by the tubular insulating spacer 84 which surrounds the respective layer contact via structure 86. Therefore the drain-select-level isolation structures 72 do not extend over any parts of the tubular insulating spacer 84 or its respective layer contact via structure 86.

If desired, the third alternative embodiment of the exemplary structure may be formed by a different method than the previous embodiments, by changing the order of steps. In this third alternative embodiment, the steps shown in FIGS. 8A-8B, 9A-9B and 10A-10B are skipped are performing the step shown in FIGS. 7A-7B. Thus, the steps described above with respect to FIGS. 11A to 20C are performed after the step shown in FIGS. 7A-7B. Then, the steps shown in FIGS. 8A-8B and 9A-9B are performed after the steps shown in FIGS. 20A-20C. The step shown in FIGS. 9A-9B is followed by the step shown in FIGS. 21A-21C.

Thus, in the third alternative embodiment, the step shown in FIGS. 10A-10B is omitted and the sacrificial via structures 85 are not formed. Therefore, the layer contact via cavities 77 are formed in one step rather than forming the contact via cavities 89 in one step followed separately forming the connection via cavities 83 in a different step. The tubular insulating spacers 84 are formed directly in the layer contact via cavities 77, followed by forming the respective layer contact via structure 86 directly on the respective tubular insulating spacers 84 directly in the layer contact via cavities 77. Therefore, in the third alternative embodiment, isolation structures 72 may be in direct contact with an outer sidewall of the respective tubular insulating spacer 84, and is laterally spaced from a respective layer contact via structure 86 that is laterally surrounded by the respective tubular insulating spacer 84. Thus, in this third alternative embodiment, laterally adjacent drain-select-level isolation structures 72 are laterally separated by the entirety of both the respective layer contact via structure 86 and by the tubular insulating spacer 84 which surrounds the respective layer contact via structure 86. Therefore, in this third alternative embodiment, the drain-select-level isolation structures 72 do not extend over any parts of the tubular insulating spacer 84 or its respective layer contact via structure 86 because the laterally-insulated contact via assemblies (84, 86) are formed after formation of the drain-select-level isolation structures 72. Thus, the drain-select-level isolation structures 72 only contact the outer sidewalls of the tubular insulating spacer 84 if the layer contact via cavities 77 cut through the drain-select-level isolation structures 72, followed by filling the layer contact via cavities 77 with the tubular insulating spacers 84 layer and the contact via structures 86.

Referring to all drawings and according to various embodiments of the present disclosure, a three-dimensional memory device includes an alternating stack of insulating layers 32 and electrically conductive layers 46, where the electrically conductive layers 46 include word lines 46W and drain select gate electrodes 46D that contain plurality of drain-select-level electrically conductive strips which are located above the word lines, memory stack structures 55 vertically extending through the alternating stack (32, 46), drain-select-level isolation structures 72 located between a respective neighboring pair of drain-select-level electrically conductive strips, and a first laterally-insulated contact via assembly (84, 86) including a first layer contact via structure 86 and a first tubular insulating spacer 84. The first laterally-insulated contact via assembly (84, 86) contacts a top surface of a first word line 46W of the word lines, and the first laterally-insulated contact via assembly (84, 86) laterally contacts a first drain-select-level isolation structure 72 of the drain-select-level isolation structures.

In one embodiment, the first laterally-insulated contact via assembly (84, 86) comprises a first sidewall segment that is more proximal to a first vertical plane VP1 that contains an interface between the alternating stack (32, 46) and the first backside trench fill structure (74, 76) than the first drain-select-level isolation structure 72 is to the first vertical plane VP1, and comprises a second sidewall segment that is more proximal to a second vertical plane VP2 that contains an interface between the alternating stack (32, 46) and the second backside trench fill structure (74, 76) than the first drain-select-level isolation structure 72 is to the second vertical plane VP2.

In one embodiment, the first drain-select-level isolation structure 72 is in direct contact with two planar vertical sidewall segments of the first tubular insulating spacer 84 that are parallel to the first horizontal direction hd1.

In one embodiment shown in FIGS. 21A-21D, the first drain-select-level isolation structure 72 laterally extends through the entirety of the first laterally-insulated contact via assembly (84, 86), and is in direct contact with two planar vertical sidewall segments of the first tubular insulating spacer 84 and with two planar vertical sidewall segments of the first layer contact via structure 86.

In another embodiment illustrated in FIG. 26, the first drain-select-level isolation structure 72 is in direct contact with an outer sidewall of the first tubular insulating spacer 84.

In some embodiments illustrated in FIGS. 22-26, a first cylindrical surface segment of an outer sidewall of the first tubular insulating spacer 84 is in direct contact with a first one of the plurality of drain-select-level electrically conductive strips 72 while a second cylindrical surface segment of the outer sidewall of the second tubular insulating spacer 84 is in direct contact with a second one of the plurality of drain-select-level electrically conductive strips 72.

In one embodiment, the outer sidewall of the first tubular insulating spacer 84 is in direct contact with each insulating layer 32 and each word line 46W that are located above the first word line 46W and below the drain select gate electrode 46D.

In one embodiment, the memory stack structures 55 are arranged in rows of memory stack structures 55 that are arranged along the first horizontal direction hd1, and each row of memory stack structures 55 is located between a respective neighboring pair of drain-select-level isolation structures 72, or between the first backside trench fill structure (74, 76) and one of the drain-select-level isolation structures 72.

In some embodiments illustrated in FIGS. 22-26, the first vertical plane VP1 and the second vertical plane VP2 are parallel to the first horizontal direction hd1; and the first backside trench fill structure (74, 76) and the second backside trench fill structure (74, 76) have greater lateral extents along the first horizontal direction hd1 than one of the drain-select-level isolation structures 72.

In one embodiment, the memory stack structures 55 are located within a memory array region 100; and the first laterally-insulated contact via assembly (84, 86) is located in a contact region 200 that is laterally offset from the memory array region 100. In one embodiment, the contact region 200 is free of any memory stack structures 55; and support pillar structures 20 comprising a dielectric material extending through at least a bottommost insulating layer 32 within the alternating stack (32, 46) are located within the contact region 200.

In one embodiment, the first laterally-insulated contact via assembly (84, 86) contacts a top surface of each support pillar structure 20 within a first subset of the support pillar structures 20; and each support pillar structure 20 within the first subset of the support pillar structures 20 vertically extends through the first word line 46W and through each layer within the alternating stack (32, 46) that underlies the first word line 46W.

In one embodiment, the word lines 46W in the contact region 200 do not form a stepped staircase. In other words, the word lines 46 do not have decreasing lengths along the first horizontal direction hd1 in the contact region 200 as a function of distance from the substrate. The word lines 46 may have the same lengths along the first horizontal direction hd1 in the contact region 200.

In one embodiment, the three-dimensional memory device further comprises drain-select-level contact via structures 82 vertically extending through a topmost insulating layer 32T 32 among the insulating layers of the alternating stack (32, 46) and contacting a top surface of a respective drain-select-level electrically conductive strip of the plurality of drain-select-level electrically conductive strips. In one embodiment, each of the drain-select-level contact via structures 82 is in direct contact with a respective cylindrical sidewall of the topmost insulating layer 32T.

In one embodiment, the three-dimensional memory device comprises a contact-level dielectric layer 80 overlying the alternating stack (32, 46), wherein an entirety of an annular top surface of the first tubular insulating spacer 84 is located within a horizontal plane including an interface between the alternating stack (32, 46) and the contact-level dielectric layer 80. In one embodiment, the first layer contact via structure 86 comprises an electrically conductive material that vertically extends through each layer of the alternating stack (32, 46) that overlies the first word line 46W and through the contact-level dielectric layer 80; and the first layer contact via structure 86 comprises a first vertical sidewall vertically extending through each layer of the alternating stack (32, 46) that overlies the first word line 46W, a second vertical sidewall vertically extending through the contact-level dielectric layer 80, and a horizontal surface connecting a top periphery of the first vertical sidewall and a bottom periphery of the second vertical sidewall and located within the horizontal plane.

In some embodiments, the first drain-select-level isolation structure 72 contacts, and laterally extends through, the first layer contact via structure 86. In some embodiments, the three-dimensional memory device comprises an additional drain-select-level isolation structure 72 that is laterally spaced from the first drain-select-level isolation structure 72 and contacts the first tubular insulating spacer 84. In some embodiments, the additional drain-select-level isolation structure 72 is laterally offset from the first drain-select-level isolation structure 72 along the second horizontal direction hd2.

The various embodiments of the present disclosure can be employed to provide a more effective layout for the laterally-insulated contact via assemblies (84, 86). For example, the locations of the laterally-insulated contact via assemblies (84, 86) are not limited to areas that are free of drain-select-level isolation structures 72. Thus, even if the lateral dimensions of the laterally-insulated contact via assemblies (84, 86) are greater than spacing between adjacent pairs of drain-select-level isolation structures 72, reconfiguration of the lateral spacing between neighboring pairs of drain-select-level isolation structures 72 within the contact region 200 is not necessary. Instead, the laterally-insulated contact via assemblies (84, 86) may contact and optionally vertically overlap with the drain-select-level isolation structures 72. Specifically, the drain-select-level isolation structures 72 may laterally contact or in addition be located at least partly through one, a plurality or each, of the laterally-insulated contact via assemblies (84, 86). Thus, drain-select-level isolation structures 72 in combination with intervening laterally-insulated contact via assemblies (84, 86) may be used to laterally separate adjacent drain-select-level electrically conductive strips. A high density layout for the laterally-insulated contact via assemblies (84, 86) can be provided in the contact region 200 through use of the methods and structures of embodiments of the present disclosure.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
    an alternating stack of insulating layers and electrically conductive layers, wherein the electrically conductive layers comprise word lines and drain select gate electrodes that comprise plurality of drain-select-level electrically conductive strips which are located above the word lines memory stack structures vertically extending through the alternating stack;
    drain-select-level isolation structures located between a respective neighboring pair of drain-select-level electrically conductive strips; and
    a first laterally-insulated contact via assembly comprising a first layer contact via structure and a first tubular insulating spacer,
    wherein:
    the first laterally-insulated contact via assembly contacts a top surface of a first word line of the word lines;
    the first laterally-insulated contact via assembly laterally contacts a first drain-select-level isolation structure of the drain-select-level isolation structures; and
    the first drain-select-level isolation structure laterally extends through the entirety of the first laterally-insulated contact via assembly, and is in direct contact with two planar vertical sidewall segments of the first tubular insulating spacer and with two planar vertical sidewall segments of the first layer contact via structure.

2. The three-dimensional memory device of claim 1, wherein:
the memory stack structures are arranged in rows of memory stack structures that extend along a first horizontal direction; and
each row of memory stack structures is located between a respective neighboring pair of drain-select-level isolation structures, or between a backside trench fill structure and one of the drain-select-level isolation structures.

3. The three-dimensional memory device of claim 1, wherein:
the memory stack structures are located within a memory array region; and
the first laterally-insulated contact via assembly is located in a contact region that is laterally offset from the memory array region.

4. The three-dimensional memory device of claim 3, wherein:
the drain-select-level electrically conductive strips laterally extend along a first horizontal direction and are laterally spaced from each other along a second horizontal direction in the memory array region;
the drain-select-level isolation structures laterally extend along the first horizontal direction in the memory array region; and
the alternating stack is laterally bounded by a first backside trench fill structure and a second backside trench fill structure which extend along the first horizontal direction in the memory array region and the contact region.

5. The three-dimensional memory device of claim 4, wherein:
the first laterally-insulated contact via assembly comprises a first sidewall segment that is more proximal to a first vertical plane that contains an interface between the alternating stack and the first backside trench fill structure than the first drain-select-level isolation structure is to the first vertical plane, and a second sidewall segment that is more proximal to a second vertical plane that contains an interface between the alternating stack and the second backside trench fill structure than the first drain-select-level isolation structure is to the second vertical plane;
the first vertical plane and the second vertical plane are parallel to the first horizontal direction; and
the first backside trench fill structure and the second backside trench fill structure have greater lateral extents along the first horizontal direction than the first drain-select-level isolation structure.

6. The three-dimensional memory device of claim 3, wherein:
the contact region is free of any memory stack structures;
support pillar structures comprising a dielectric material and extending through at least a bottommost insulating layer within the alternating stack are located within the contact region;
the first laterally-insulated contact via assembly contacts a top surface of each support pillar structure within a first subset of the support pillar structures; and
each support pillar structure within the first subset of the support pillar structures vertically extends through the first word line and through each layer within the alternating stack that underlies the first word line.

7. The three-dimensional memory device of claim 3, further comprising drain-select-level contact via structures vertically extending through a topmost insulating layer of the insulating layers of the alternating stack and contacting a top surface of a respective drain-select-level electrically conductive strip of the plurality of drain-select-level electrically conductive strips.

8. The three-dimensional memory device of claim 4, further comprising an additional drain-select-level isolation structure that is laterally spaced from the first drain-select-level isolation structure and contacts the first tubular insulating spacer, wherein the additional drain-select-level isolation structure is laterally offset from the first drain-select-level isolation structure along the second horizontal direction.

9. The three-dimensional memory device of claim 3, wherein the word lines in the contact region do not form a stepped staircase.

10. The three-dimensional memory device of claim 1, further comprising a contact-level dielectric layer overlying the alternating stack, wherein:
an entirety of an annular top surface of the first tubular insulating spacer is located within a horizontal plane including an interface between the alternating stack and the contact-level dielectric layer;
the first layer contact via structure comprises an electrically conductive material that vertically extends through each layer of the alternating stack that overlies the first word line and through the contact-level dielectric layer; and
the first layer contact via structure comprises a first vertical sidewall vertically extending through each layer of the alternating stack that overlies the first word line, a second vertical sidewall vertically extending through the contact-level dielectric layer, and a horizontal surface connecting a top periphery of the first vertical sidewall and a bottom periphery of the second vertical sidewall and located within the horizontal plane.

* * * * *